(12) United States Patent
Takeuchi et al.

(10) Patent No.: US 8,541,935 B2
(45) Date of Patent: Sep. 24, 2013

(54) COLOR FILTER AND LIGHT-EMITTING DISPLAY ELEMENT

(75) Inventors: Yosuke Takeuchi, Kanagawa (JP); Mitsuyoshi Ichihashi, Kanagawa (JP); Shinichi Morishima, Kanagawa (JP); Tomoki Tasaka, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 0 days.

(21) Appl. No.: 13/378,824

(22) PCT Filed: Sep. 6, 2010

(86) PCT No.: PCT/JP2010/065682
§ 371 (c)(1),
(2), (4) Date: Dec. 16, 2011

(87) PCT Pub. No.: WO2011/030883
PCT Pub. Date: Mar. 17, 2011

(65) Prior Publication Data
US 2012/0099054 A1  Apr. 26, 2012

(30) Foreign Application Priority Data

Sep. 14, 2009 (JP) ................. 2009-212277
Dec. 14, 2009 (JP) ................. 2009-283236

(51) Int. Cl.
*H01L 51/50* (2006.01)
*G02F 1/13* (2006.01)
*G02F 1/13357* (2006.01)

(52) U.S. Cl.
USPC ........... 313/112; 313/501; 313/110; 349/193; 349/194

(58) Field of Classification Search
USPC .................. 313/501, 503, 110–112; 349/80, 349/194, 193
See application file for complete search history.

(56) References Cited

U.S. PATENT DOCUMENTS

2005/0035353 A1  2/2005  Adachi et al.
2007/0090751 A1  4/2007  Cok et al.
2009/0051283 A1  2/2009  Cok et al.

FOREIGN PATENT DOCUMENTS

| EP | 1 309 016 A2 | 5/2003 |
| JP | 2001-76865 A | 3/2001 |
| JP | 2003-178875 A | 6/2003 |

*Primary Examiner* — Mariceli Santiago
(74) *Attorney, Agent, or Firm* — Morgan, Lewis & Bockius, LLP

(57) ABSTRACT

A color filter for use in a light-emitting display element which emits at least white light, the color filter including a circularly polarizing layer which includes a polarizing layer, the polarizing layer having an orientation layer and a liquid crystal compound layer, wherein the circularly polarizing layer is formed only in an optical path of the white light.

9 Claims, 12 Drawing Sheets

COLOR FILTER AND LIGHT-EMITTING DISPLAY ELEMENT

TECHNICAL FIELD

The present invention relates to a color filter and a light-emitting display element, specifically to a color filter for use in a light-emitting display element which emits white light and a light-emitting display element containing the color filter.

BACKGROUND ART

Light-emitting display elements such as organic EL elements display full-color images employing, for example, a so-called RGB method. In this RGB method, white light for white color display is synthesized after color lights emitted from light-emitting layers corresponding to R pixels, G pixels and B pixels are divided once through color filters. Thus, some of light emitted from the light-emitting layers is dampened by the color filters, which requires more electricity for maintaining the brightness of white light. In order to solve this problem, PTL 1 discloses a method in which full-color images are displayed using four pixels of R, G, B and W (white). In this method, unlike the above RGB method, white light is obtained with no use of a color filter; i.e., white light is directly emitted from light-emitting layers that emit white light. Therefore, white light can be emitted without being dampened by the color filter.

However, in the light-emitting display element emitting white light, external light enters the element through the optical path of white light, is reflected inside the element, and then is emitted again to the outside through the optical path of white light. As a result, display performances are adversely affected to cause problematic phenomena such as glare of outside views, and a decrease in contrast.

In order to solve this problem, PTL 2 discloses an organic EL element including a film substrate having an organic EL film laminated on one surface of the film substrate and a linearly polarizing plate provided on the other surface of the film substrate, wherein the film substrate serves also as a ¼ wavelength plate. This patent literature describes that, with this structure, the number of layers through which light passes to be emitted outside of the element becomes smaller than in conventional structures. Thus, light scattering at the interfaces between the layers is reduced to shield reflected light more reliably.

However, in the structure disclosed in the above patent literature, the linearly polarizing plate and the ¼ wavelength plate are provided not only in the optical path of white light but also in the optical paths of red, blue and green lights. In this structure, since the linearly polarizing plate is provided in the optical paths of red, blue and green lights, light transmittance is decreased to about 50% due to the presence of the linearly polarizing plate, problematically decreasing light use efficiency of the light-emitting element.

CITATION LIST

Patent Literature

PTL1: Japanese Patent Application Laid-Open (JP-A) No. 2003-178875
PTL2: JP-A No. 2001-076865

SUMMARY OF INVENTION

Technical Problem

The present invention aims to provide a color filter which prevents a decrease in light use efficiency and a decrease in contrast caused as a result of reflection of external light, and a light-emitting display element containing the color filter.

Solution to Problem

Means for solving the above problems are as follows.
<1> A color filter for use in a light-emitting display element which emits at least white light, the color filter including:
 a circularly polarizing layer which includes a polarizing layer, the polarizing layer having an orientation layer and a liquid crystal compound layer,
 wherein the circularly polarizing layer is formed only in an optical path of the white light.
<2> The color filter according to <1> above, wherein the circularly polarizing layer comprises the polarizing layer and a ¼ wavelength layer.
<3> A color filter for use in a light-emitting display element which emits at least white light, the color filter including:
 a selective reflection layer, and
 a circularly polarizing layer which includes a polarizing layer, and
 the polarizing layer having an orientation layer and a liquid crystal compound layer,
 wherein the circularly polarizing layer and the selective reflection layer are formed only in an optical path of the white light.
<4> The color filter according to <3> above, wherein the selective reflection layer contains a cholesteric liquid crystal compound.
<5> The color filter according to any one of <1> to <4> above, wherein the color filter includes a support, and the support is a transparent support.
<6> The color filter according to <5> above, wherein the support is the ¼ wavelength layer.
<7> A light-emitting display element including:
 the color filter according to any one of <1> to <6> above, and
 a light-emitting layer which emits at least white light.
<8> The light-emitting display element according to <7> above, wherein the light-emitting display element has an optical resonator structure.
<9> The light-emitting display element according to one of <7> and <8> above, wherein the light-emitting layer comprises at least one phosphorescent light-emitting material.

Advantageous Effects of Invention

The present invention can provide a color filter which prevents a decrease in light use efficiency and a decrease in contrast caused as a result of reflection of external light, and a light-emitting display element containing the color filter. These can solve the problems pertinent in the art and achieve the above objects.

DESCRIPTION OF EMBODIMENTS (Color Filter)

In a first embodiment, a color filter of the present invention includes a circularly polarizing layer formed only in the optical path of white light emitted from a light-emitting display element; and, if necessary, further includes other members.

In a second embodiment, a color filter of the present invention includes a circularly polarizing layer and a selective reflection layer which are formed only in the optical path of white light emitted from a light-emitting display element; and, if necessary, further includes other members.

The shape of the color filter in accordance with a first or second embodiment may be appropriately determined depending on the structure of a light-emitting display element. For example, the color filter may be a film or layer.

The structure of the color filter in accordance with a first or second embodiment is not particularly limited, so long as a circularly polarizing layer or both a circularly polarizing layer and a selective reflection layer are formed, as described above, only in the optical path of white light emitted from a light-emitting display element, and may be appropriately determined depending on the intended purpose.

Here, exemplary structures of the color filter will be described with reference to the drawings.

Figure 1:
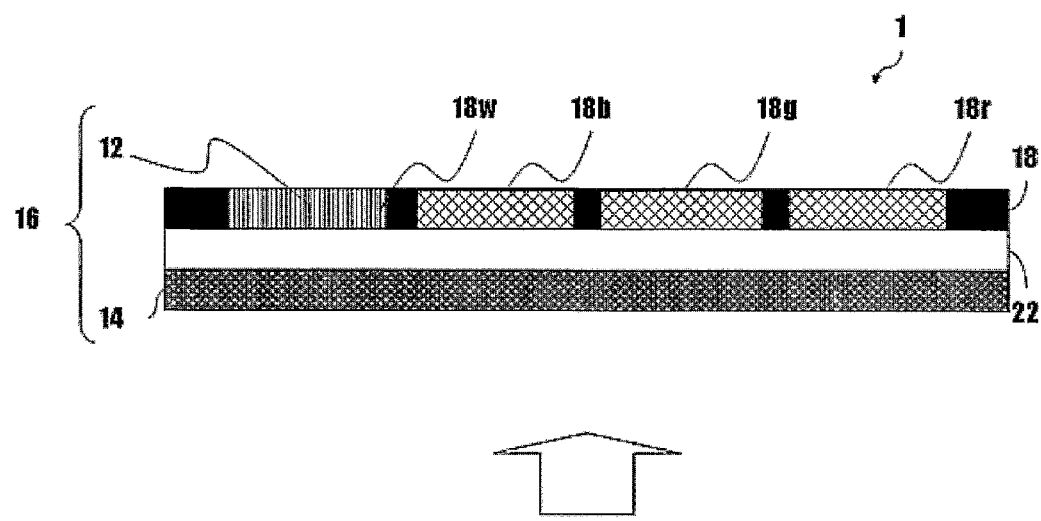
FIG. 1 is a cross-sectional view of an example of a color filter according to a first embodiment of the present invention.
Figure 2:
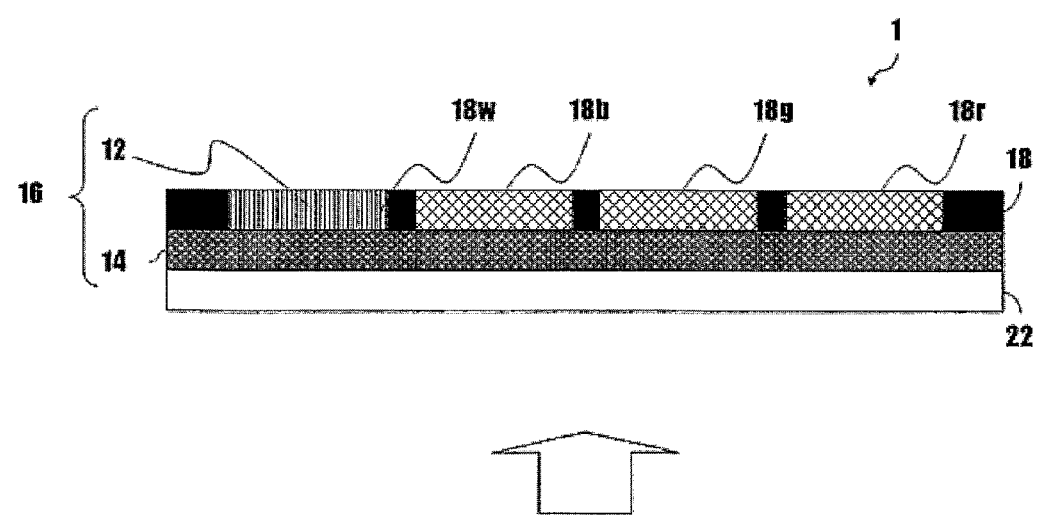
FIG. 2 is a cross-sectional view of another example of a color filter according to a first embodiment of the present invention.
Figure 3:
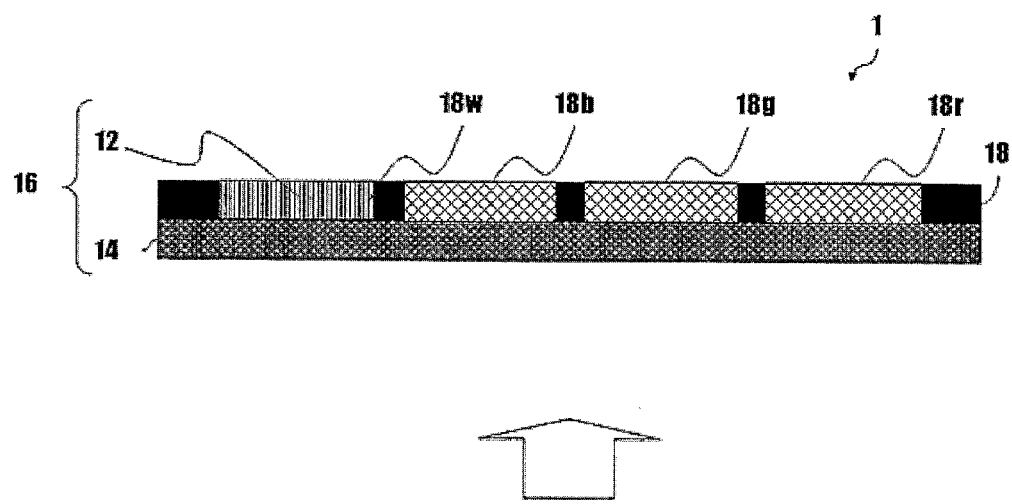
FIG. 3 is a cross-sectional view of still another example of a color filter according to a first embodiment of the present invention.
Figure 4:
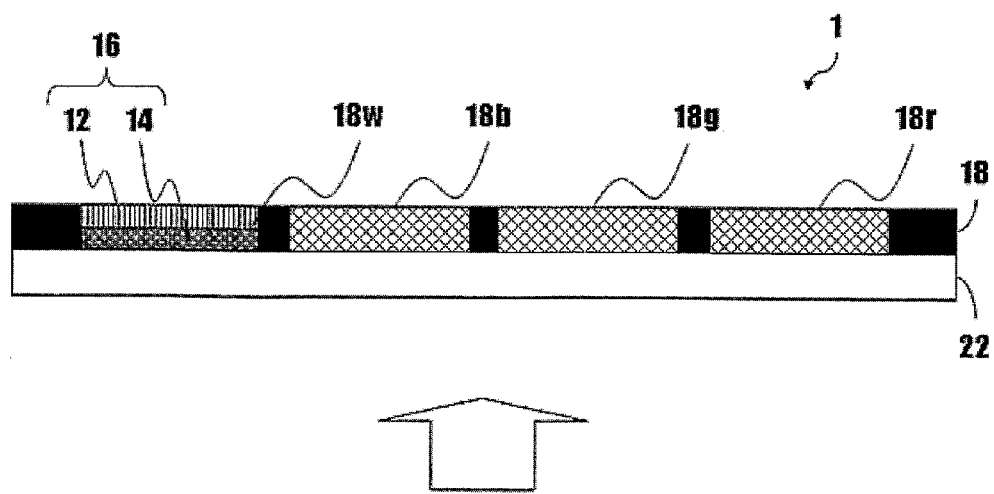
FIG. 4 is a cross-sectional view of yet another example of a color filter according to a first embodiment of the present invention.

Each of FIG. 1 to 4 is a cross-sectional view of one example of the color filter in accordance with a first embodiment of the present invention. A color filter 1 includes a circularly polarizing layer 16 composed, for example, of a ¼ wavelength layer 14 and a polarizing layer 12. The color filter 1 also includes a filter layer 18 which transmits light having a desired wavelength among lights emitted from the light-emitting display element. In the color filter in accordance with a first embodiment of the present invention, the filter layer 18 may contain the polarizing layer 12 disposed in a white filter portion 18w. The structure of the circularly polarizing layer 16 is not particularly limited, so long as the circularly polarizing layer is formed in the optical path through which white light travels, and may be appropriately selected depending on the intended purpose. For example, as illustrated in FIG. 1, the ¼ wavelength layer 14, a support 22 and the polarizing layer 12 may be formed in this order in a light-emitting direction (a direction in which light is emitted). Alternatively, as illustrated in FIG. 2, the support 22, the ¼ wavelength layer 14 and the polarizing layer 12 may be formed in this order in a light-emitted direction. The ¼ wavelength layer 14 may serve also as a support. In this case, the support 22 may not be formed as illustrated in FIG. 3. Further, as illustrated in FIG. 4, the filter layer 18 may contain the polarizing layer 12 and the ¼ wavelength layer 14 in the white filter portion 18w. In this structure, the surface of the filter layer 18 becomes flat. Notably, in FIG. 1 to 4 and FIG. 5 to 15 referred to below, each arrow indicates a direction in which light is emitted from the light-emitting display element.

Figure 5:
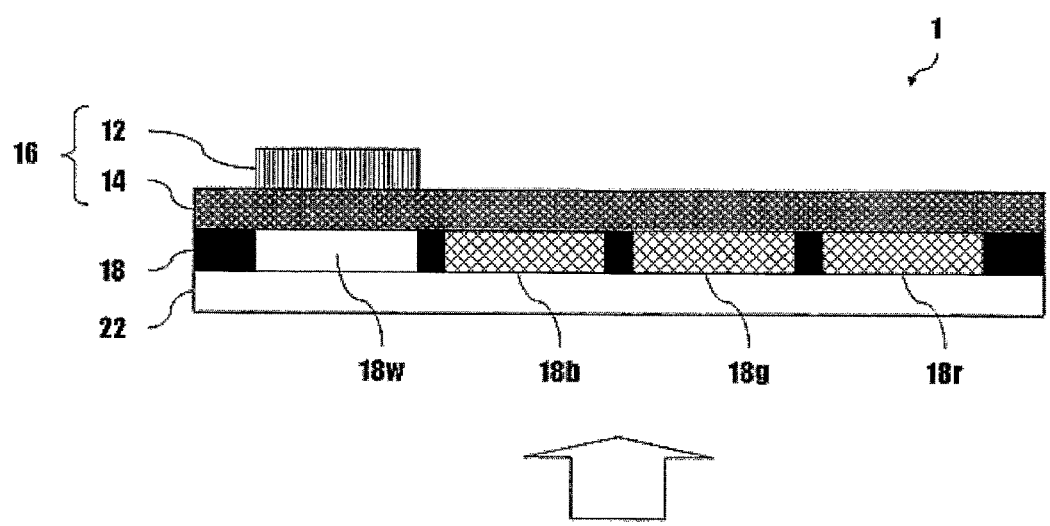
FIG. 5 is a cross-sectional view of another embodiment of a color filter.
Figure 6:
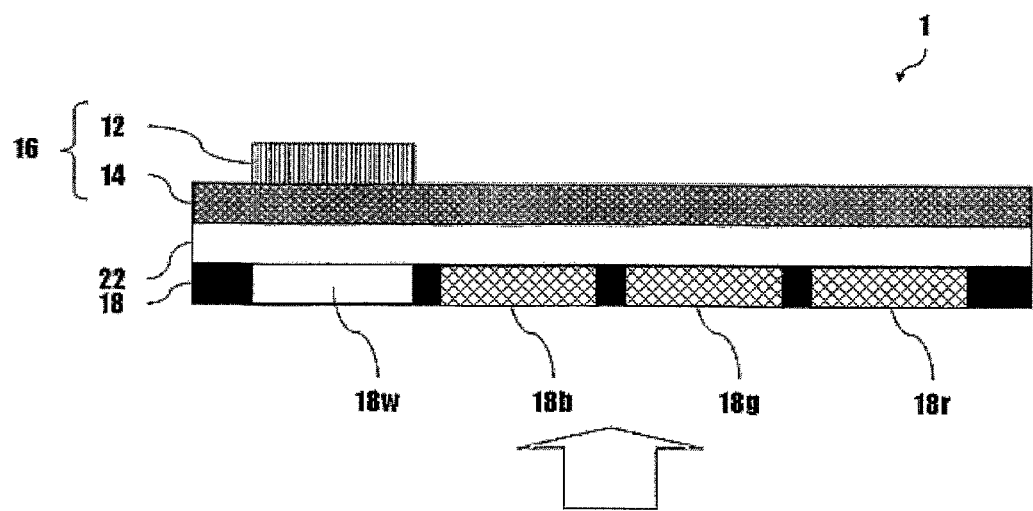
FIG. 6 is a cross-sectional view of another embodiment of a color filter.
Figure 7:
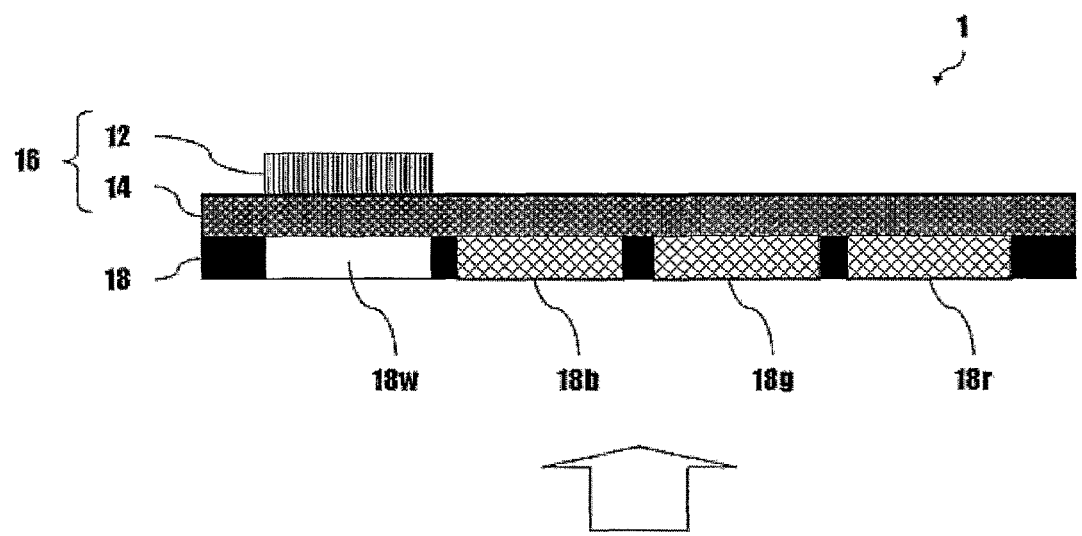
FIG. 7 is a cross-sectional view of another embodiment of a color filter.

Also, in other examples of the color filter as illustrated in FIG. 5 to 10, the circularly polarizing layer 16 may have any structure so long as it is formed in the optical path through which white light travels in the color filter. For example, as illustrated in FIGS. 5 and 7, the ¼ wavelength layer 14 may be formed on the entire surface of the filter layer 18, and the polarizing layer 12 may be formed on a part of the filter layer 18, the part being present above the light-emitted surface of a white filter portion 18w through which white light passes. Also, as in the circularly polarizing layer 16 illustrated in FIG. 6, the ¼ wavelength layer 14 may be formed on the support 22 (described below), and the polarizing layer 12 may be formed on a part of the ¼ wavelength layer 14, the part being present above the light-emitted surface of the white filter portion 18w (through which white light passes) in the filter layer 18. Furthermore, as in the circularly polarizing layer 16 illustrated in FIG. 10, the ¼ wavelength layer 14 may be formed at the light-emitting display element side of the color filter, and the polarizing layer 12 may be formed at the side opposite to the light-emitting display element side (i.e., the upper surface of the filter layer 18 in FIG. 10).

Figure 8:
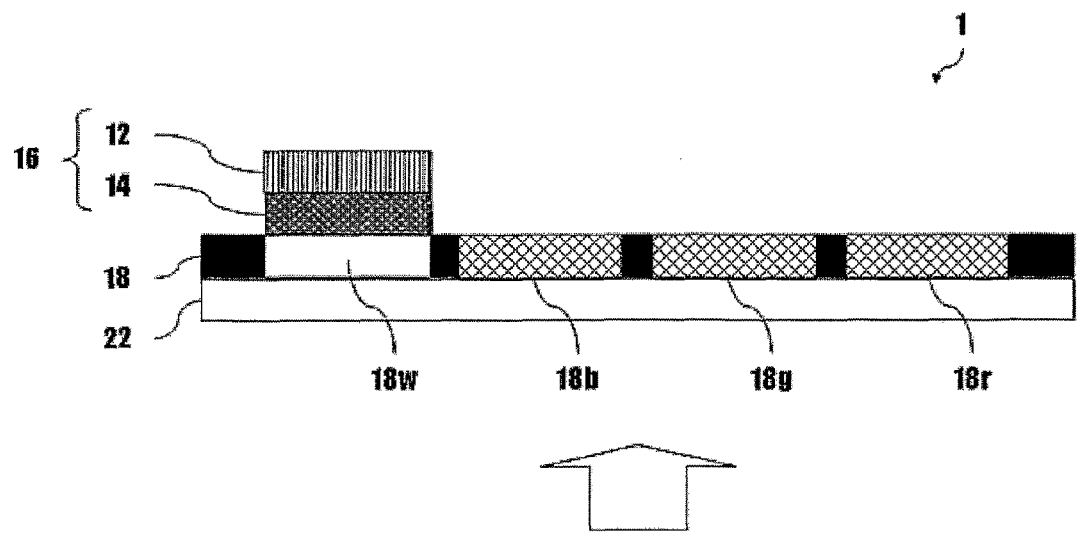
FIG. 8 is a cross-sectional view of another embodiment of a color filter.
Figure 9:
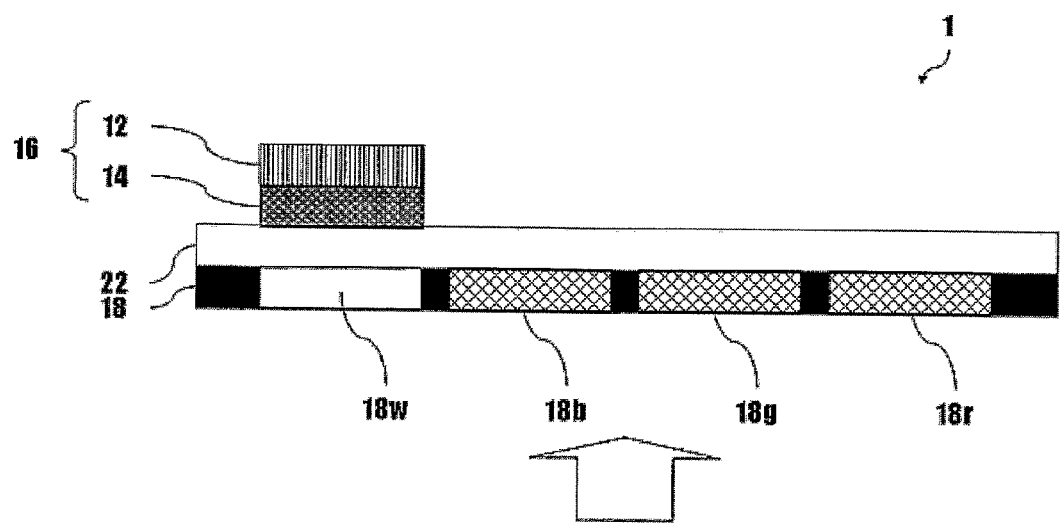
FIG. 9 is a cross-sectional view of another embodiment of a color filter.
Figure 10:
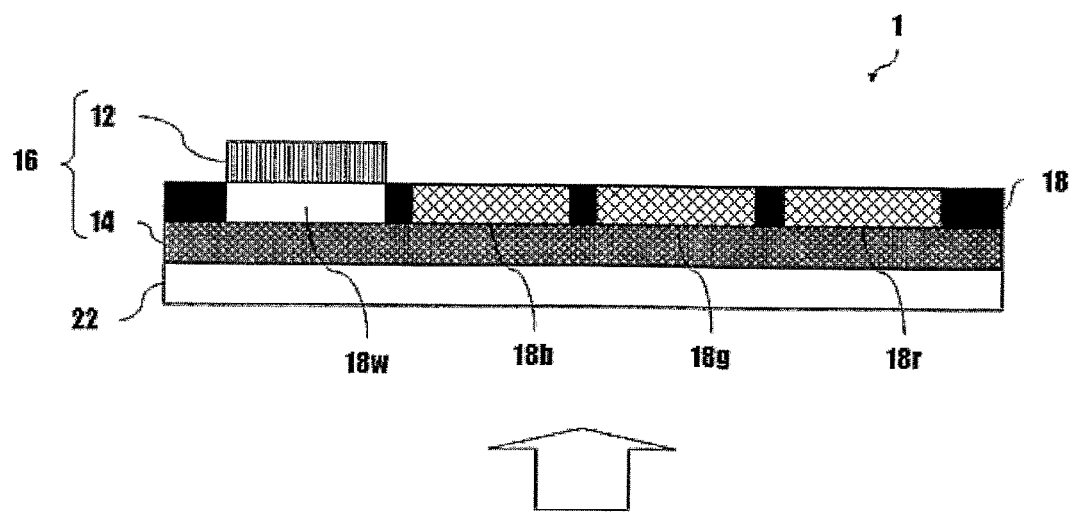
FIG. 10 is a cross-sectional view of another embodiment of a color filter.
Figure 11:
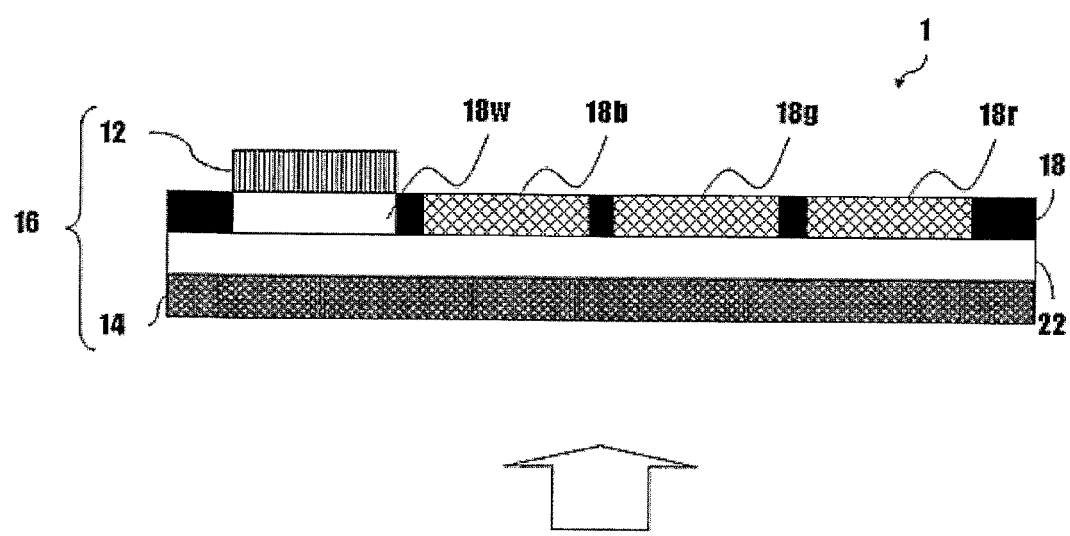
FIG. 11 is a cross-sectional view of one embodiment of a color filter.
Figure 12:
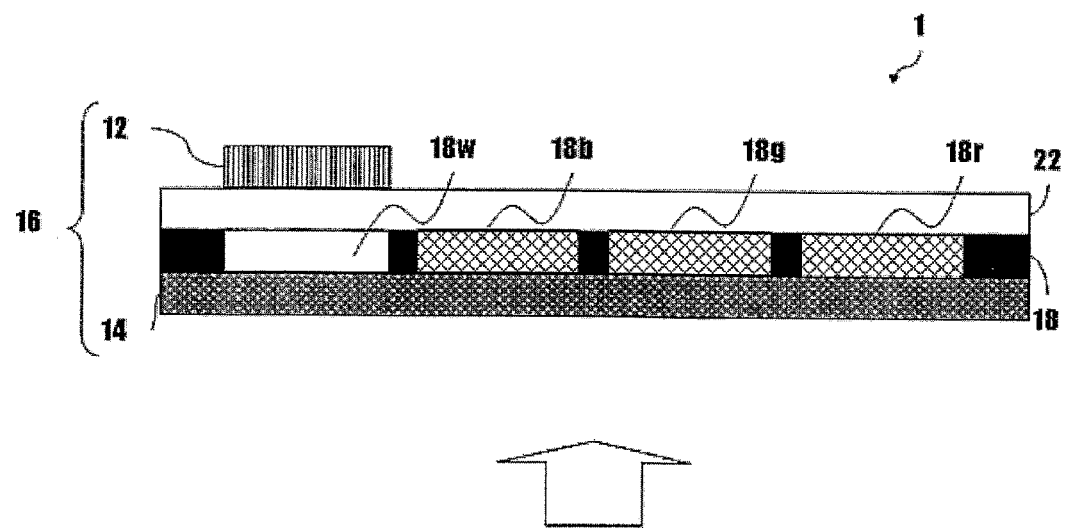
FIG. 12 is a cross-sectional view of another embodiment of a color filter.
Figure 13:
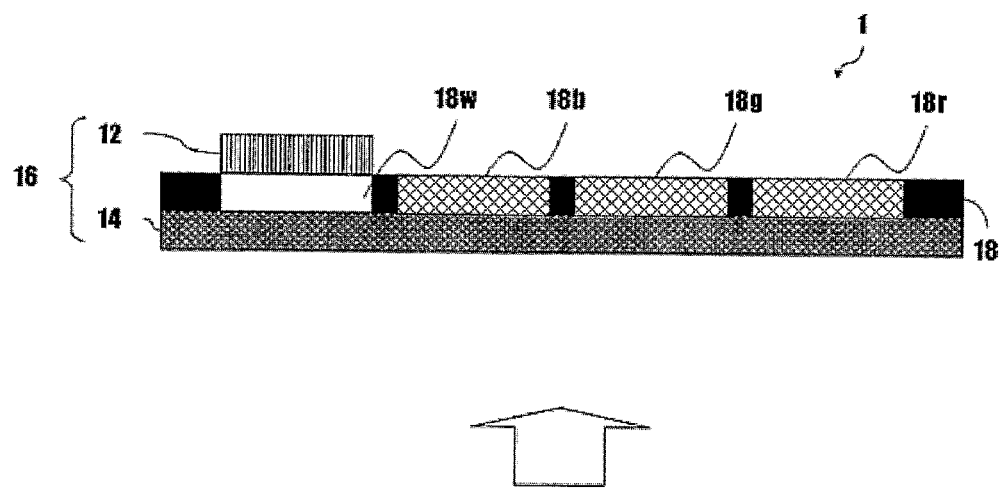
FIG. 13 is a cross-sectional view of another embodiment of a color filter.
Figure 14:
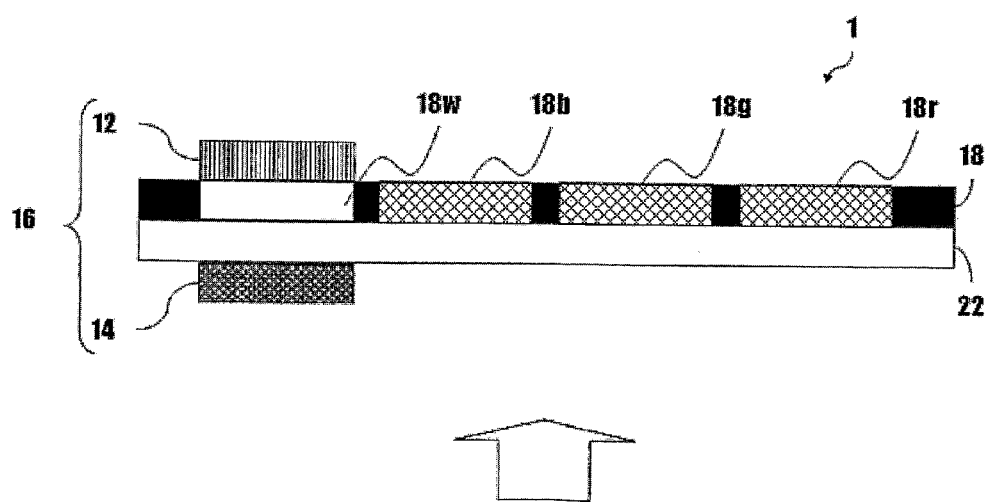
FIG. 14 is a cross-sectional view of another embodiment of a color filter.
Figure 15:
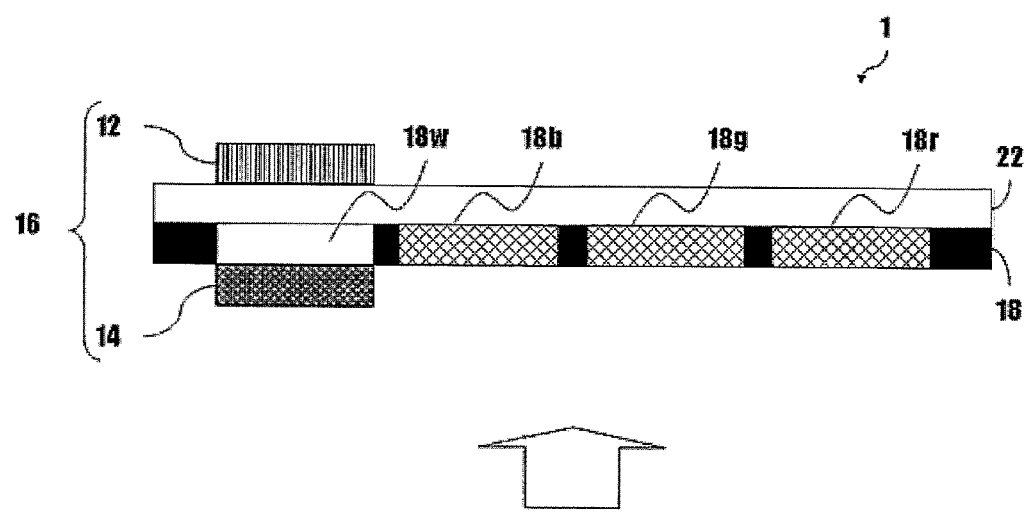
FIG. 15 is a cross-sectional view of another embodiment of a color filter.

In addition, as in the circularly polarizing layer 16 illustrated in FIGS. 8 and 9, the ¼ wavelength layer 14 may be formed only on the light-emitted surface of the white filter portion 18w (through which white light passes) in the filter layer 18, and the polarizing layer 12 may be formed on the ¼ wavelength layer 14. Further, as illustrated in FIG. 9, the circularly polarizing layer 16 may be formed on a support 22 on the light-emitted surface of the white filter portion 18w (through which white light passes) in the filter layer 18. Also, as in the circularly polarizing layer 16 illustrated in FIGS. 10 and 11 to 15, the polarizing layer 12 and the ¼ wavelength layer 14 may be placed so as to sandwich the filter layer 18.

Figure 16:
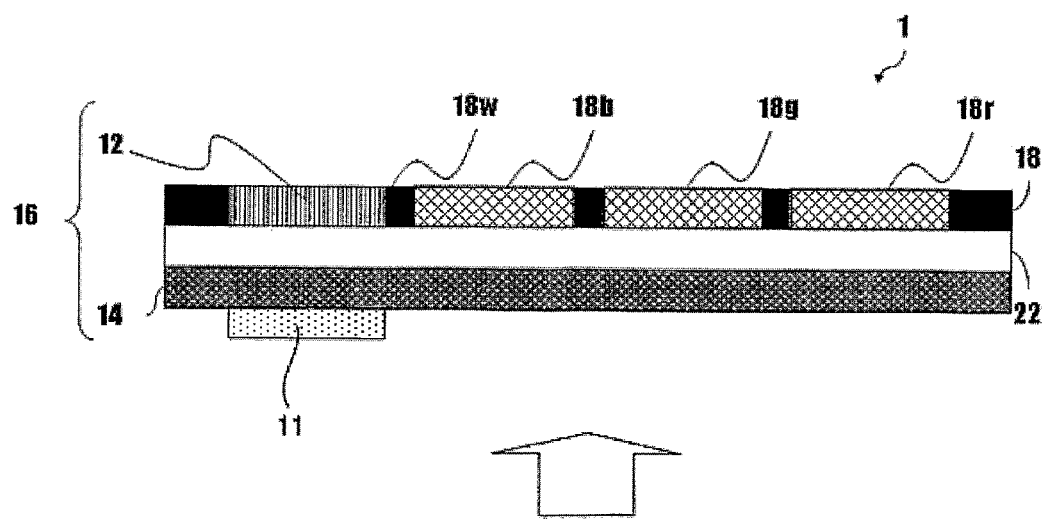
FIG. 16 is a cross-sectional view of an example of a color filter according to a second embodiment of the present invention.
Figure 17:
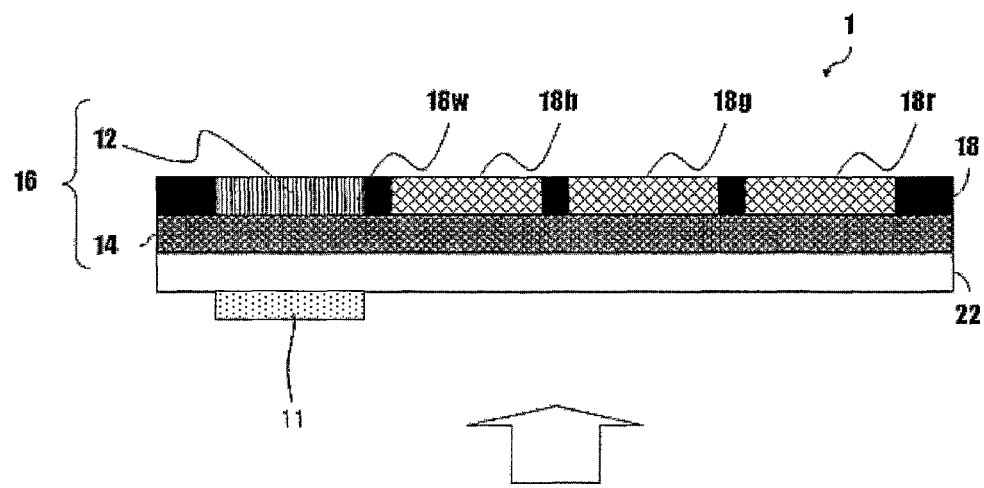
FIG. 17 is a cross-sectional view of another example of a color filter according to a second embodiment of the present invention.
Figure 18:
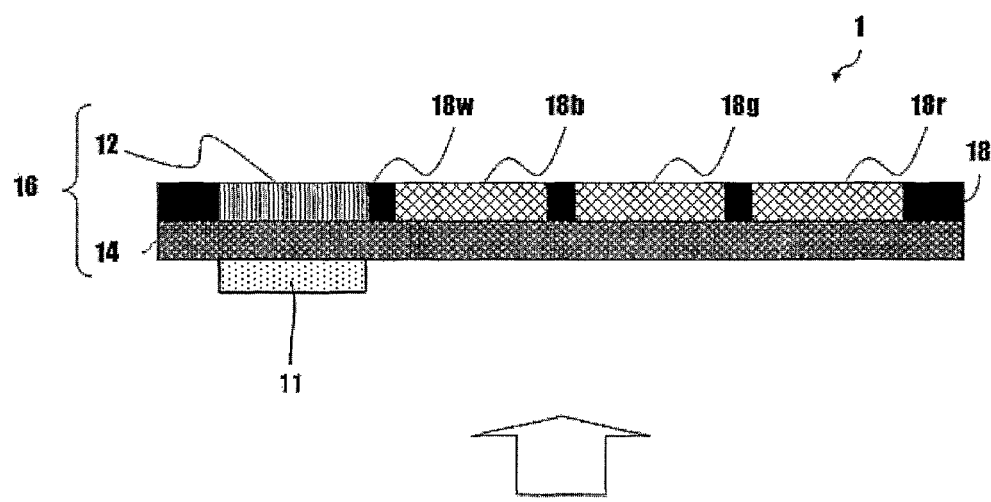
FIG. 18 is a cross-sectional view of still another example of a color filter according to a second embodiment of the present invention.
Figure 19:
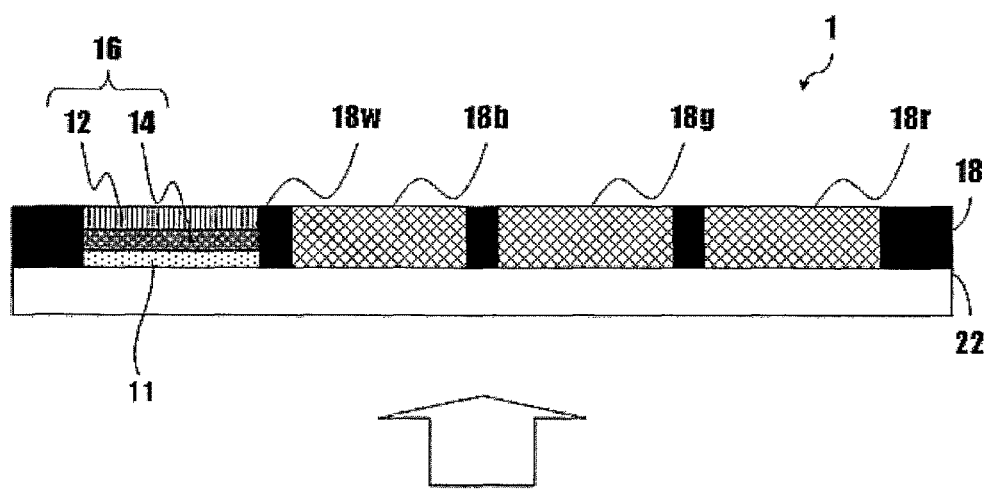
FIG. 19 is a cross-sectional view of yet another example of a color filter according to a second embodiment of the present invention.

Each of FIG. 16 to 19 is a cross-sectional view of one example of the color filter in accordance with a second embodiment of the present invention. A color filter 1 includes a selective reflection layer 11 and a circularly polarizing layer 16 composed, for example, of a ¼ wavelength layer 14 and a polarizing layer 12. The color filter 1 also includes a filter layer 18 which transmits light having a desired wavelength among lights emitted from the light-emitting display element. In the color filter in accordance with a second embodiment of the present invention, the filter layer 18 may contain the ¼ wavelength layer 14 disposed in the white filter portion 18w. The structure of the circularly polarizing layer 16 or the selective reflection layer 11 is not particularly limited, so long as the circularly polarizing layer or the selective reflection layer is formed in the optical path through which white light travels, and may be appropriately selected depending on the intended purpose. For example, as illustrated in FIG. 16, the selective reflection layer 11, the ¼ wavelength layer 14, the support 22 and the polarizing layer 12 may be formed in this order in a light-emitting direction. Alternatively, as illustrated in FIG. 17, the selective reflection layer 11, the support 22, the ¼ wavelength layer 14 and the polarizing layer 12 may be formed in this order in a light-emitted direction. The ¼ wavelength layer 14 may serve also as a support. In this case, the support 22 may not be formed as illustrated in FIG. 18. As illustrated in FIG. 19, in the white filter portion 18w of the filter layer 18, the selective reflection layer 11, the ¼ wavelength layer 14 and the polarizing layer 12 may be formed in this order in a light-emitting direction. Notably, in FIG. 16 to 19, each arrow indicates a direction in which light is emitted from the light-emitting display element.

<Circularly Polarizing Layer>

The circularly polarizing layer is not particularly limited and may be appropriately selected depending on the intended purpose, so long as it transmits light having entered the color filter from outside (hereinafter the light may be referred to as "external light") and, after the transmitted light is reflected on a reflective plate and enters again the color filter, prevents the thus-reflected light from being emitted outside of the color filter.

The shape of the circularly polarizing layer is not particularly limited and may be appropriately determined depending on the intended purpose. In terms of optical characteristics, the circularly polarizing layer may have such a shape that makes flat the surface of the color filter of the present invention. For example, the circularly polarizing layer may have a ¼ wavelength layer and a polarizing layer which transmits a linearly polarized light only. With this structure, among external lights entering the color filter, some linearly polarized light vibrating in a predetermined direction (i.e., in such a vibration direction that be allowed to transmit the polarizing layer) transmits the polarizing layer. After that, the linearly polarized light passes through the ¼ wavelength layer to become a circularly polarized light after the slow axis of the linearly polarized light shifts by ¼ of the wavelength (i.e., by 90°) with respect to the fast axis thereof. The circularly polarized light is reflected on a reflective member in the light-emitting display element (e.g., an electrode disposed on the light-emitting layer in the element) and then, becomes a circularly polarized light whose rotating direction has been reversed and which travels in the opposite direction to the direction in which the linearly polarized light enters the ¼ wavelength layer. The circularly polarized light whose rotating direction has been reversed enters again the ¼ wavelength layer to become a linearly polarized light whose polarization direction is different by 90° from the initial linearly polarized light. The linearly polarized light whose polarization direction has shifted by 90° cannot transmit the above polarizing layer. As a result, the external light having entered the color filter is not emitted from the color filter, preventing reflection of the external light.

—Polarizing Layer—

The polarizing layer is not particularly limited, so long as it may be a layer which changes light vibrating in any direction (e.g., natural light) to a linearly polarized light, and may be appropriately selected depending on the intended purpose.

The polarizing layer preferably has a monolayer transmittance of 30% or higher, more preferably 35% or higher, particularly preferably 40% or higher. When the monolayer transmittance of the polarizing layer is less than 30%, the use efficiency of light emitted from the light-emitting display element is considerably decreased. Also, the order parameter of the polarizing layer is preferably 0.7 or higher, more preferably 0.8 or higher, particularly preferably 0.9 or higher. When the order parameter of the polarizing layer is lower than 0.7, the use efficiency of light emitted from the light-emitting display element is considerably decreased. The optical density of the absorption axis of the polarizing layer is preferably 1 or higher, more preferably 1.5 or higher, particularly preferably 2 or higher. When the optical density of the absorption axis of the polarizing layer is lower than 1, the shielding effect to reflected light is considerably reduced. The wavelength band of the polarizing layer preferably covers the range of 400 nm to 800 nm from the viewpoint of preventing visible light from being reflected. The thickness of the polarizing layer is not particularly limited and may be appropriately selected depending on the intended purpose. The thickness thereof is preferably 0.01 μm to 2 μm, more preferably 0.05 μm to 2 μm, from the viewpoints of obtaining desired optical characteristics, not causing parallax, and allowing easy production.

The polarizing layer is not particularly limited and may be appropriately selected depending on the intended purpose. Examples of the polarizing layer include iodine-based polarizing plates, dye-based polarizing plates containing a dichroic material, and polyene-based polarizing plates. Among these polarizing plates, iodine-based polarizing plates and dye-based polarizing plates can be generally produced by stretching a polyvinyl alcohol film and adsorbing iodine or the dichroic material on the film. In this case, the transmission axis of the polarizing layer is perpendicular to the stretching direction of the film.

In addition to such stretched polarizing plates, the following polarizing plates are suitably used in the present invention, since they have a relatively high polarization degree; i.e., linearly or circularly polarizing plates containing polymerizable cholesteric liquid crystals described in JP-A No. 2000-352611, guest-host type linearly polarizing plates containing a dichroic dye and uniaxially-oriented liquid crystals described in JP-A Nos. 11-101964, 2006-161051, 2007-199237, 2002-527786, 2006-525382, 2007-536415 and 2008-547062 and Japanese Patent (JP-B) No. 3335173, wire-grid polarizing plates using a grid of metal such as aluminum described in JP-A No. 55-95981, inorganic visible light-reflecting polarizing plates described in JP-A No. 2002-510062, polarizing plates made of a polymer compound or a liquid crystal compound containing carbon nanotubes dispersed/oriented therein described in JP-A No. 2002-365427, polarizing plates made of a polymer compound containing metal microparticles dispersed/oriented therein described in JP-A No. 2006-184624, polyvinylene-type linearly polarizing plates described in JP-A Nos. 11-248937, 10-508123, 2005-522726, 2005-522727 and 2006-522365, polarizing plates made of a lyotropic liquid crystal dye represented by ($SO_3M$)$_n$ (chromogen) described in JP-A Nos. 07-261024, 08-286029, 2002-180052, 2002-90526, 2002-357720, 2005-154746, 2006-47966, 2006-48078, 2006-98927, 2006-193722, 2006-206878, 2006-215396, 2006-225671, 2006-328157, 2007-126628, 2007-133184, 2007-145995, 2007-186428, 2007-199333, 2007-291246, 2007-302807, 2008-9417, 2002-515075, 2006-518871, 2006-508034, 2006-531636, 2006-526013 and 2007-512236, and polarizing plates made of a dichroic dye described in JP-A Nos. 08-278409 and 11-305036. In general, the cholesteric liquid crystals have the function of separating circularly polarized light. But, when used in combination with a ¼ wavelength layer, the cholesteric liquid crystals are used to form a linearly polarizing plate. In this case, the ¼ wavelength layer is preferably made from a composition containing at least one liquid crystal compound. Also, the ¼ wavelength layer is preferably a layer formed as follows: a composition containing at least one liquid crystal having a polymerizable group is allowed to have a liquid crystal phase, followed by curing through application of heat and/or UV rays. In terms of heat resistance and polarization degree, particularly preferred are guest-host type linearly polarizing plates, wire-grid polarizing plates, polarizing plates containing carbon nanotubes dispersed/oriented therein, polarizing plates made of a lyotropic liquid crystal dye, and polarizing plates made of a dichroic dye. Particularly preferred are guest-host type linearly polarizing plates, polarizing plates containing carbon nanotubes dispersed/oriented therein, polarizing plates made of a lyotropic liquid crystal dye, and polarizing plates made of a dichroic dye, since these can be produced through coating.

Among others, the polarizing layer used in the present invention preferably has the below-described orientation layer and a liquid crystal compound layer containing a liquid crystal compound, since the polarizing layer can be produced through coating and thus can be patterned, as well as can be made thin.

—Orientation Layer—

The orientation layer is not particularly limited, so long as it can give orientation as desired to the liquid crystal compound layer containing the liquid crystal compound, and may be appropriately selected depending on the intended purpose.

The thickness of the orientation layer is preferably 0.01 μm to 2.0 μm.

The material for the orientation layer is not particularly limited and may be appropriately selected depending on the intended purpose. Examples thereof include low-molecular-weight compounds and high-molecular-weight compounds (hereinafter may be referred to as "polymer"). The polymer used for forming the orientation layer is described in various documents, and there exist many commercially available products. Preferably, polyvinylalcohols, polyimides or derivatives thereof are used for the orientation layer. Regarding the orientation layer, reference can be made to p. 43, 1.24 to p. 49, 1.8 of International Publication No. WO01/88574 A1.

Alternatively, the material for the orientation layer may be those which can be oriented through light irradiation described below. The photo-orientable materials used for the orientation layer formed through light irradiation are described in various documents. Preferred examples thereof include azo compounds described in JP-A Nos. 2006-285197, 2007-76839, 2007-138138, 2007-94071, 2007-121721, 2007-140465, 2007-156439, 2007-133184 and 2009-109831 and JP-B Nos. 3883848 and 4151746, aromatic ester compounds described in JP-A No. 2002-229039, maleimide and/or alkenyl-substituted nadimide compounds having photo-orientable units described in JP-A Nos. 2002-265541 and 2002-317013, photo-crosslinkable silane derivatives described in JP-B Nos. 4205195 and 4205198, and photo-crosslinkable polyimides, polyamides and esters described in JP-A Nos. 2003-520878 and 2004-529220 and JP-B No. 4162850. Among them, azo compounds and photo-crosslinkable polyimides, polyamides and esters are particularly preferred.

—Liquid Crystal Compound Layer—

The liquid crystal compound layer is not particularly limited, so long as it can change light vibrating in any direction to a linearly polarized light when used in combination with the orientation layer, and may be appropriately selected depending on the intended purpose. The liquid crystal compound layer may be made of, for example, a compound having liquid crystallinity (hereinafter referred to as a liquid crystal compound). The materials for the liquid crystal compound layer are not particularly limited, so long as the liquid crystal compound layer contains the below-described liquid crystal compound, and may be appropriately selected depending on the intended purpose. Examples of the materials other than the liquid crystal compound include various resins, an agent for preventing a coated liquid from being uneven by air blow (air blow-related uneven coating-preventing agent), a cissing inhibitor, an additive for controlling a tilt angle at an orientation layer (a tilt angle of liquid crystal dyes at the interface of a light-absorbable anisotropic film and an orientation layer), an additive for controlling a tilt angle at an air interface (a tilt angle of dyes at the interface of a polarizing plate film and air), a sugar, a drug having at least one of an antifungal function, an antibacterial function and a disinfectant function, a non-liquid-crystalline binder polymer, and a non-liquid-crystalline polyfunctional monomer. Notably, the liquid crystal compound layer is produced as described below using a composition containing the liquid crystal compound and these materials.

—Liquid Crystal Compound—

The liquid crystal compound is not particularly limited, so long as it has both flowability as liquid and regularity as crystal, and may be appropriately selected depending on the intended purpose. Examples thereof include azo dyes and phthalocyanine dyes. In particular, from the viewpoint of obtaining high dichroic property, preferred are azo dyes represented by the following General Formula (I) and having nematic liquid crystallinity. More preferably, the liquid crystal compound layer is formed of a composition containing at least two azo dyes represented by General Formula (I).

<General Formula (I)>

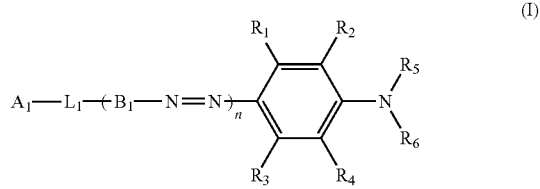

In General Formula (I), $R_1$ to $R_4$ each independently represent a hydrogen atom or a substituent, $R_5$ and $R_6$ each independently represent a hydrogen atom or an alkyl group which may have a substituent, $L_1$ represents a —N=N— group, a —CH=N— group or a —C(=O)O— group, $A_1$ represents a phenyl group which may have a substituent, a naphthyl group which may have a substituent, or an aromatic heterocyclic group which may have a substituent, $B_1$ represents a divalent aromatic hydrocarbon group which may have a substituent or a divalent aromatic heterocyclic group which may have a substituent, and n is an integer of 1 to 4.

In General Formula (I), the substituents represented by $R_1$ to $R_4$ are each independently the following groups, for example.

That is, alkyl groups (preferably having 1 to 20 carbon atoms, more preferably having 1 to 12 carbon atoms, particularly preferably having 1 to 8 carbon atoms, such as methyl, ethyl, isopropy, tert-butyl, n-octyl, n-decyl, n-hexadecyl, cyclopropyl, cyclopentyl and cyclohexyl); alkenyl groups (preferably having 2 to 20 carbon atoms, more preferably having 2 to 12 carbon atoms, particularly preferably having 2 to 8 carbon atoms, such as vinyl, aryl, 2-butenyl and 3-pentenyl); alkynyl groups (preferably having 2 to 20 carbon atoms, more preferably having 2 to 12 carbon atoms, particularly preferably having 2 to 8 carbon atoms, such as propargyl and 3-pentynyl); aryl groups (preferably having 6 to 30 carbon atoms, more preferably having 6 to 20 carbon atoms, particularly preferably having 6 to 12 carbon atoms, such as phenyl, 2,6-diethylphenyl, 3,5-ditrifluoromethylphenyl, naphthyl and biphenyl); substituted or unsubstituted amino groups (preferably having 0 to 20 carbon atoms, more preferably having 0 to 10 carbon atoms, particularly preferably having 0 to 6 carbon atoms, such as unsubstituted amino, methylamino, dimethylamino, diethylamino and anilino); alkoxy groups (preferably having 1 to 20 carbon atoms, more preferably having 1 to 10 carbon atoms, particularly preferably having 1 to 6 carbon atoms, such as methoxy, ethoxy and butoxy); oxycarbonyl groups (preferably having 2 to 20 carbon atoms, more preferably having 2 to 15 carbon atoms, particularly preferably having 2 to 10 carbon atoms, such as methoxycarbony, ethoxycarbony and phenoxycarbonyl); acyloxy groups (preferably having 2 to 20 carbon atoms, more preferably having 2 to 10 carbon atoms, particularly preferably having 2 to 6 carbon atoms, such as acetoxy and benzoyloxy); acylamino groups (preferably having 2 to 20 carbon atoms, more preferably having 2 to 10 carbon atoms, particularly preferably having 2 to 6 carbon atoms, such as acetylamino and benzolylamino); alkoxycarbonylamino groups (preferably having 2 to 20 carbon atoms, more preferably having 2 to 10 carbon atoms, particularly preferably having 2 to 6 carbon atoms, such as methoxycarbonylamino); aryloxycarbonylamino groups (preferably having 7 to 20 carbon atoms, more preferably having 7 to 16 carbon atoms, particularly preferably having 7 to 12 carbon atoms, such as phenoxycarbonylamino); sulfonylamino groups (preferably 1 to 20 carbon atoms, more preferably having 1 to 10 carbon atoms, particularly preferably having 1 to 6 carbon atoms, such as methanesulfonylamino and benzenesulfonylamino); sulfamoyl groups (preferably having 0 to 20 carbon atoms, more preferably having 0 to 10 carbon atoms, particularly preferably having 0 to 6 carbon atoms, such as sulfamoyl, methylsulfamoyl, dimethylsulfamoyl and phenylsulfamoyl); carbamoyl groups (preferably having 1 to 20 carbon atoms, more preferably having 1 to 10 carbon atoms, particularly preferably having 1 to 6 carbon atoms, such as unsubstituted carbamoyl, methylcarbamoyl, diethylcarbamoyl and phenylcarbamoyl); alkylthio groups (preferably having 1 to 20 carbon atoms, more preferably having 1 to 10 carbon atoms, particularly preferably having 1 to 6 carbon atoms, such as methylthio and ethylthio); arylthio groups (preferably having 6 to 20 carbon atoms, more preferably having 6 to 16 carbon atoms, particularly preferably having 6 to 12 carbon atoms, such as phenylthio); sulfonyl groups (preferably having 1 to 20 carbon atoms, more preferably having 1 to 10 carbon atoms, particularly preferably having 1 to 6 carbon atoms, such as mesyl and tosyl); sulfinyl groups (preferably having 1 to 20 carbon atoms, more preferably having 1 to 10 carbon atoms, particularly preferably having 1 to 6 carbon atoms, such as methanesulfinyl and benzenesulfinyl); ureide groups (preferably having 1 to 20 carbon atoms, more preferably having 1 to 10 carbon atoms, particularly preferably having 1 to 6 carbon atoms, such as unsubstituted ureide, methylureide and phenylureide); phosphoric acid amide groups (preferably having 1 to 20 carbon atoms, more preferably having 1 to 10 carbon atoms, particularly preferably having 1 to 6 carbon atoms, such as diethylphosphoric acid amide and phenylphosphoric acid amide); a hydroxyl group; a mercapto group; halogen atoms (such as a fluorine atom, a chlorine atom, a bromine atom and an iodine atom); a cyano group; a nitro group; a hydroxamic group; a sulfino group; a hydrazine group; an imino group; an azo group; heterocyclic groups (preferably having 1 to 30 carbon atoms, more preferably having 1 to 12 carbon atoms, such as heterocyclic groups containing, for example, a nitrogen atom, an oxygen atom and/or a sulfur atom (e.g., imidazolyl, pyridyl, quinolyl, furyl, piperidyl, morpholino, benzoxazolyl, benzimidazoly and benzothiazolyl); and sily groups (preferably having 3 to 40 carbon atoms, more preferably having 3 to 30 carbon atoms, particularly preferably having 3 to 24 carbon atoms, such as trimethylsilyl and triphenylsilyl).

Each substituent may further contain a substituent(s) listed above. When two or more substituents are contained, these may be identical or different. Also, in this case, the substituents may be linked together to form a ring, if possible.

The group represented by $R_1$ to $R_4$ is preferably a hydrogen atom, an alkyl group, an alkoxy group or a halogen atom, more preferably a hydrogen atom, an alkyl group or an alkoxy group, particularly preferably a hydrogen atom or a methyl group.

The alkyl group (which may have a substituent) represented by $R_5$ and $R_6$ is preferably has 1 to 20 carbon atoms, more preferably 1 to 12 carbon atoms, particularly preferably 1 to 8 carbon atoms. Examples thereof include methyl, ethyl and n-octyl. The substituent the alkyl group represented by $R_5$ and $R_6$ has is the same as those represented by $R_1$ to $R_4$. When $R_5$ or $R_6$ represents an alkyl group, $R_5$ may be linked to $R_2$ to form a ring or $R_6$ may be linked to $R_4$ to form a ring. Each of $R_5$ and $R_6$ particularly preferably represents a hydrogen atom or an alkyl group, most preferably a hydrogen atom, a methyl group or an ethyl group.

$A_1$ represents a phenyl group which may have a substituent, a naphthyl group which may have a substituent, or an aromatic heterocyclic group which may have a substituent. The substituent the phenyl group or the naphthyl group may has is preferably a group which is introduced for increasing dissolvability of the azo compound and nematic liquid crystallinity, a group having an electron-donating property or electron-attracting property which is introduced for adjusting color tone of the dye, or a group having a polymerizable group which is introduced for fixing orientation. Specifically, the substituent is the same as those represented by $R_1$ to $R_4$. Preferred examples of the substituent include alkyl groups which may have a substituent, alkenyl groups which may have a substituent, alkynyl groups which may have a substituent, aryl groups which may have a substituent, alkoxy groups which may have a substituent, oxycarbonyl groups which may have a substituent, acyloxy groups which may have a substituent, acylamino groups which may have a substituent, amino groups which may have a substituent, alkoxycarbonylamino groups which may have a substituent, sulfonylamino groups which may have a substituent, sulfamoyl groups which may have a substituent, carbamoyl groups which may have a substituent, alkylthio groups which may have a substituent, sulfonyl groups which may have a substituent, ureide groups which may have a substituent, a nitro group, a hydroxyl group, a cyano group, an imino group, an azo group and halogen atoms. More preferred examples include alkyl groups which may have a substituent, alkenyl groups which may have a substituent, aryl groups which may have a substituent, alkoxy groups which may have a substituent, oxycarbonyl groups which may have a substituent, acyloxy groups which may have a substituent, a nitro group, an imino group and an azo group.

The phenyl group or the naphthyl group may have 1 to 5 substituents listed above, preferably has one substituent.

The aromatic heterocyclic group is preferably a group derived from a heteromonocyclic group or a heterodicyclic group. Examples of the atoms (other than carbon atoms) forming the aromatic heterocyclic group include nitrogen, sulfur and oxygen. When the aromatic heterocyclic group contains a plurality of ring-forming atoms other than carbon atoms, these may be identical or different. Specific examples of the aromatic heterocyclic group include pyridyl, quinolyl, thiophenyl, thiazolyl, benzothiazolyl, thiadiazolyl, quinolonyl, naphthalimidyl and thienothiazolyl. Among them, pyridyl, quinolyl, thiazolyl, benzothiazolyl, thiadiazolyl and thienothiazolyl are preferred, pyridyl, benzothiazolyl, thiadiazolyl and thienothiazolyl are more preferred, and pyridyl, benzothiazolyl and thienothiazolyl are particularly preferred.

The group represented by $A_1$ is particularly preferably a phenyl group which may have a substituent, a pyridyl group, a benzothiazolyl group or a thienothiazolyl group.

$B_1$ represents a divalent aromatic hydrocarbon group which may have a substituent or a divalent aromatic heterocyclic group which may have a substituent.

The aromatic hydrocarbon group is preferably a phenyl group or a naphthyl group. The substituent the aromatic hydrocarbon group may have is, for example, an alkyl group which may have a substituent, an alkoxy group which may have a substituent, a hydroxyl group, a nitro group, a halogen atom, an amino group which may have a substituent, an acylamino group which may have a substituent or a cyano group. The substituent the aromatic hydrocarbon group may have is preferably an alkyl group which may have a substituent, an alkoxy group which may have a substituent, a hydroxyl group or a halogen atom, particularly preferably an alkyl group which may have a substituent, an alkoxy group which may have a substituent, or a halogen atom, most preferably a methyl group or a halogen atom.

The aromatic heterocyclic group is preferably a group derived from a heteromonocyclic group or a heterodicyclic group. Examples of the atoms (other than carbon atoms) forming the aromatic heterocyclic group include nitrogen, sulfur and oxygen. When the aromatic heterocyclic group contains a plurality of ring-forming atoms other than carbon atoms, these may be identical or different. Specific examples of the aromatic heterocyclic group include pyridyl, quinolyl, isoquinolyl, benzothiadiazole, phthalimide and thienothiazole, with thienothiazole being particularly preferred.

Examples of the substituent the aromatic heterocyclic group may have include alkyl groups (e.g., a methyl group and an ethyl group), alkoxy groups (e.g., a methoxy group and an ethoxy group), amino groups (e.g., an unsubstituted amino group and a methylamino group), an acetylamino group, an acylamino group, a nitro group, a hydroxyl group, a cyano group and halogen atoms.

Specific examples of the azo dyes represented by General Formula (I) will be given below. However, the azo dyes usable in the present invention should not be construed as being limited these specific examples.

| No. | $X_1$ | $X_2$ | $R_{21}$ | $R_{22}$ | $R_{23}$ | $R_{24}$ | $R_{25}$ | $Y_1$ |
|-----|-------|-------|----------|----------|----------|----------|----------|-------|
| A-1 | —$C_2H_5$ | —$C_2H_5$ | —H | —$CH_3$ | —H | —H | —H | —$nC_4H_9$ |
| A-2 | —$C_2H_5$ | —$C_2H_5$ | —H | —$CH_3$ | —$CH_3$ | —$CH_3$ | —H | —$nC_4H_9$ |
| A-3 | —$CH_3$ | —$CH_3$ | —H | —$CH_3$ | —H | —H | —H | —$nC_4H_9$ |

| No. | $X_1$ | $X_2$ | $Y_1$ |
|-----|-------|-------|-------|
| A-4 | —$C_2H_5$ | —$C_2H_5$ | —O—C(O)—C$_6$H$_4$—O(CH$_2$)$_4$OCOCH=CH$_2$ |
| A-5 | —$C_2H_5$ | —$C_2H_5$ | —O—C(O)—C$_6$H$_4$—O(CH$_2$)$_{11}$OCOCH=CH$_2$ |

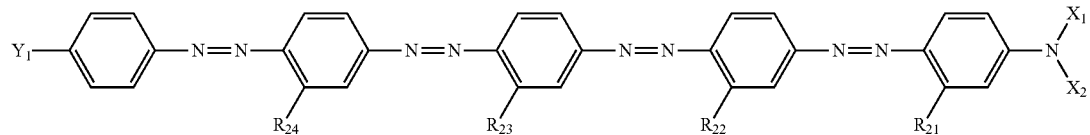

| No. | $X_1$ | $X_2$ | $R_{21}$ | $R_{22}$ | $R_{23}$ | $R_{24}$ | $Y_1$ |
|---|---|---|---|---|---|---|---|
| A-9 | —$C_2H_5$ | —$C_2H_5$ | —H | —$CH_3$ | —H | —H | —$nC_4H_9$ |
| A-10 | —$C_2H_5$ | —$C_2H_5$ | —$CH_3$ | —$CH_3$ | —H | —H | —$nC_4H_9$ |
| A-11 | —$C_2H_5$ | —$C_2H_5$ | —H | —$CH_3$ | —$CH_3$ | —$CH_3$ | —$nC_4H_9$ |

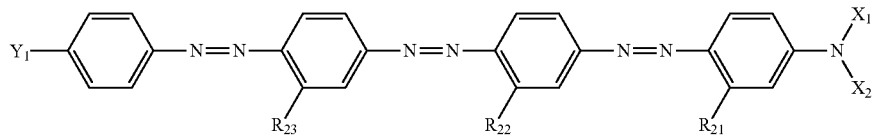

| No. | $X_1$ | $X_2$ | $R_{21}$ | $R_{22}$ | $R_{23}$ | $Y_1$ |
|---|---|---|---|---|---|---|
| A-16 | —$C_2H_5$ | —$C_2H_5$ | —H | —$CH_3$ | —H | —$nC_4H_9$ |
| A-17 | —$C_2H_5$ | —$C_2H_5$ | —H | —$CH_3$ | —$CH_3$ | —$nC_4H_9$ |
| A-18 | —$C_2H_5$ | —$C_2H_5$ | —H | —$CH_3$ | —H | —O—C(O)—C$_6$H$_4$—O(CH$_2$)$_4$OCOCH=CH$_2$ |
| A-19 | —$C_2H_5$ | —$C_2H_5$ | —H | —$CH_3$ | —H | —O—C(O)—C$_6$H$_4$—O(CH$_2$)$_{11}$OCOCH=CH$_2$ |
| A-24 | —$C_2H_5$ | —$C_2H_5$ | —$OCH_3$ | —$CH_3$ | —H | —$nC_4H_9$ |
| A-25 | —$C_2H_5$ | —$C_2H_5$ | —H | —$CH_3$ | —$CH_3$ | —O—C(O)—C$_6$H$_4$—O(CH$_2$)$_4$OCOCH=CH$_2$ |

| No. | |
|---|---|
| A-27 | 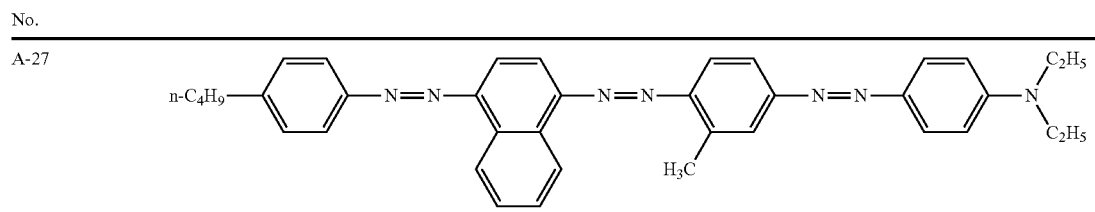 |
| A-28 | 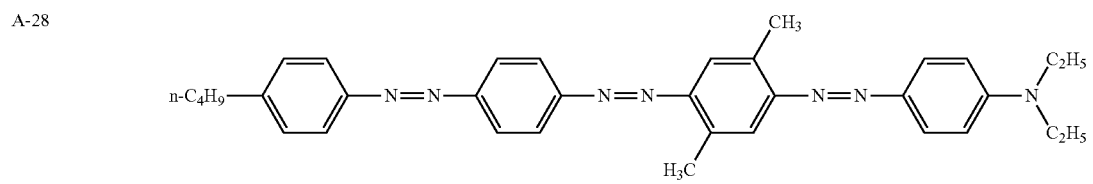 |
| A-29 | 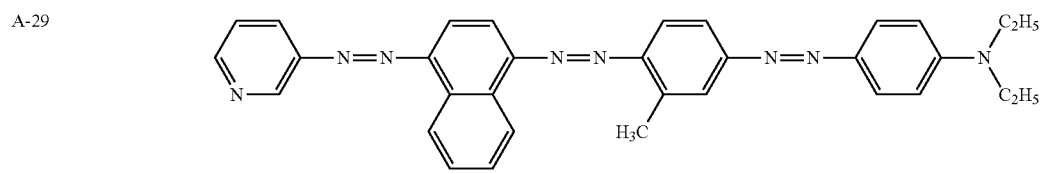 |

-continued
| No. | |
|---|---|
| A-30 | 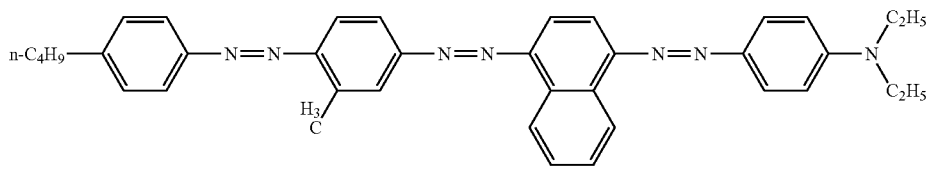 |
| A-31 | 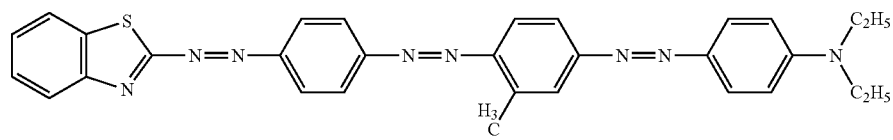 |
| A-32 | 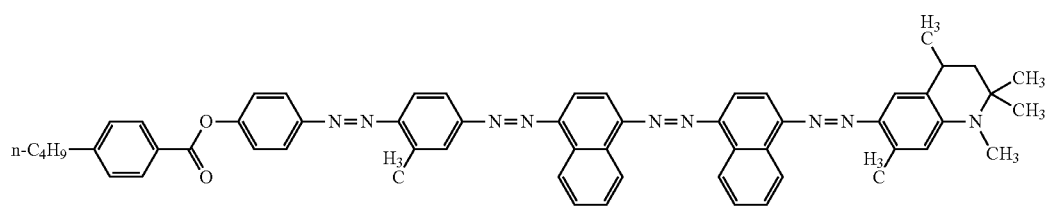 |
| A-33 | 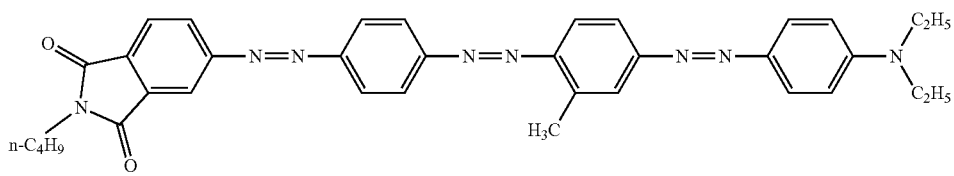 |
| A-34 | 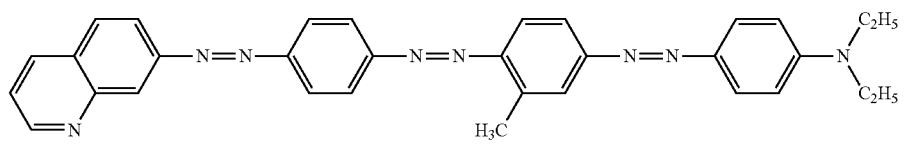 |
| A-35 | 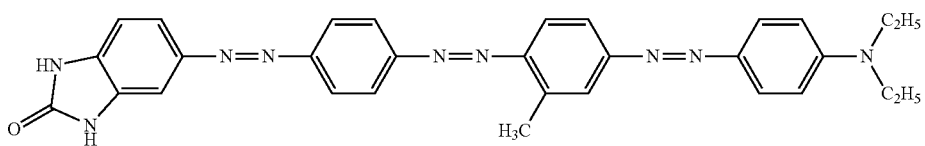 [SMILES: CCN(CC)c1ccc(N=Nc2ccc(N=Nc3ccc(N=Nc4ccc5[nH]c(=O)[nH]c5c4)cc3)c(C)c2)cc1] |
| A-36 | 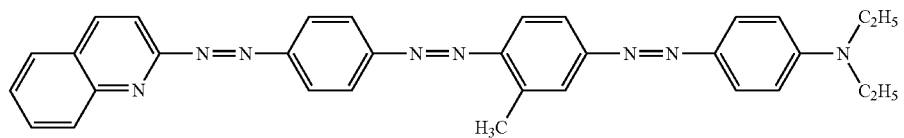 [SMILES: CCN(CC)c1ccc(N=Nc2ccc(N=Nc3ccc(N=Nc4ccc5ccccc5n4)cc3)c(C)c2)cc1] |
| A-37 | 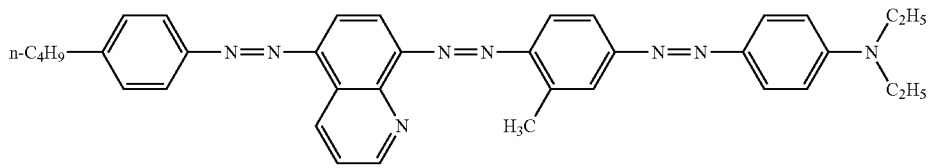 |

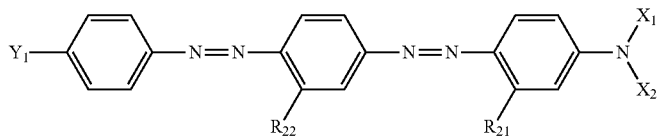
| No. | X₁ | X₂ | R₂₁ | R₂₂ | Y₁ |
|---|---|---|---|---|---|
| A-38 | —C₂H₅ | —C₂H₅ | —H | —CH₃ | (ester-phenyl-O(CH₂)₄OCOCH=CH₂) |
| A-40 | —C₂H₅ | —C₂H₅ | —H | —CH₃ | —nC₄H₉ |
A-41, A-42, A-45, A-46, A-47, A-48, A-50, A-51 (structures shown)

-continued
| No. | |
|---|---|
| A-52 | 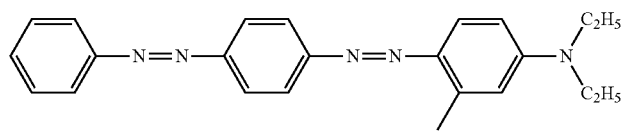 |
| A-53 | 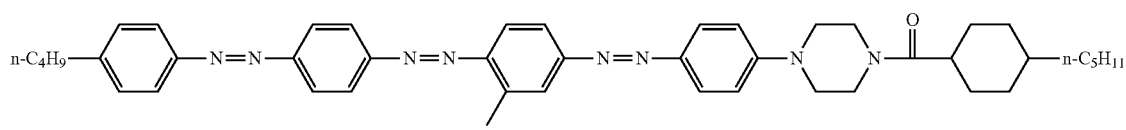 |
| A-54 | 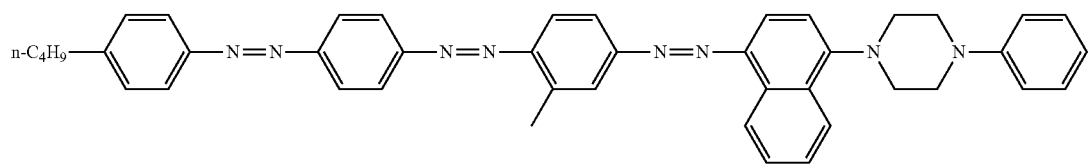 |
| A-55 | 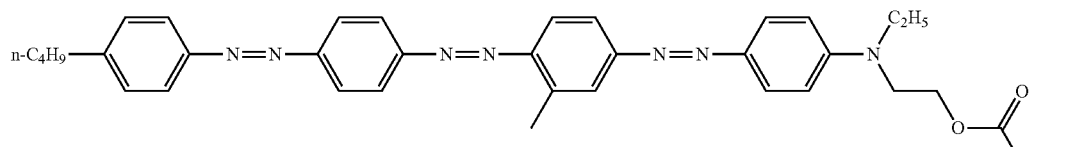 |
| A-56 | 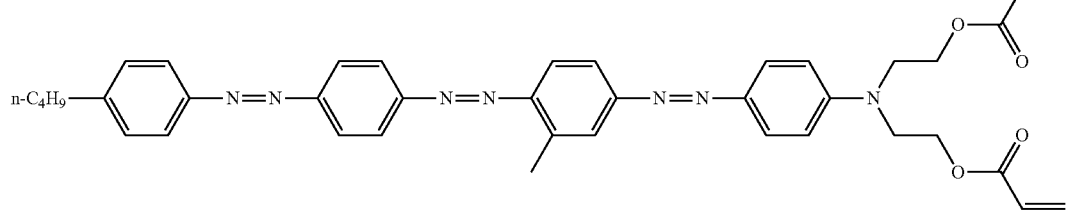 |
| A-57 | 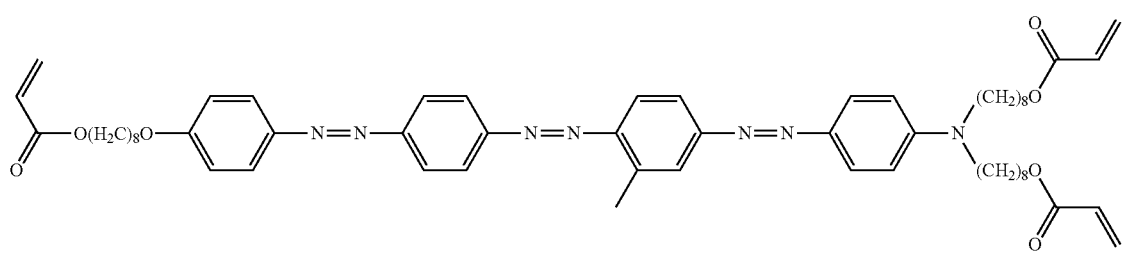 |
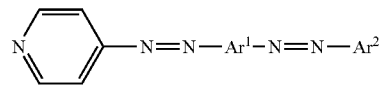
| No. | Ar₁ | Ar₂ |
|---|---|---|
| B-1 | | |
| B-2 | | |
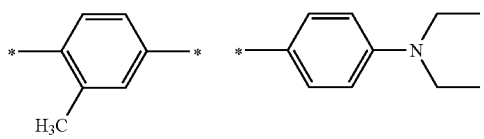
-continued
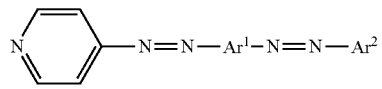
| No. | Ar₁ | Ar₂ |
|---|---|---|
| B-4 | | |
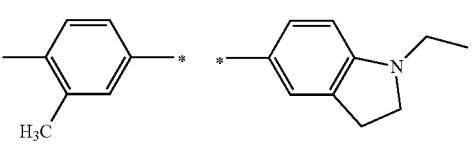

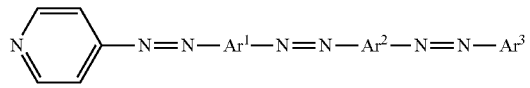

| No. | Ar¹ | Ar² | Ar³ |
|---|---|---|---|
| B-5 | *-C₆H₄-* (para) | *-C₆H₃(CH₃)-* (2-methyl-1,4) | *-C₆H₄-N(C₂H₅)₂ |
| B-6 | *-C₆H₃(CH₃)-* (3-methyl-1,4) | *-C₆H₃(CH₃)-* (2-methyl-1,4) | *-C₆H₄-N(C₂H₅)₂ |
| B-7 | *-C₆H₄-* (para) | *-C₆H₃(CH₃)-* (2-methyl-1,4) | *-C₆H₄-N(C₄H₉)₂ |
| B-8 | *-C₆H₄-* (para) | *-C₆H₃(CH₃)-* (2-methyl-1,4) | *-C₆H₄-N(C₂H₅)(CH₂CH₂OH) |
| B-10 | *-C₆H₄-* (para) | *-C₆H₃(CH₃)-* (2-methyl-1,4) | *-(1-ethylindolin-5-yl) |
| B-11 | *-C₆H₄-* (para) | *-C₆H₃(CH₃)-* (2-methyl-1,4) | *-(1-(3-carboxypropyl)indolin-5-yl) |

| No. | Structure |
|---|---|
| B-12 | 2-chloropyridin-4-yl—N=N—C₆H₄—N=N—C₆H₃(CH₃)—N=N—C₆H₄—N(C₂H₅)₂ |
| B-13 | pyridin-4-yl—N=N—C₆H₄—N=N—C₆H₃(CH₃)—N=N—C₆H₃(CH₃)—N=N—C₆H₄—N(C₂H₅)₂ |

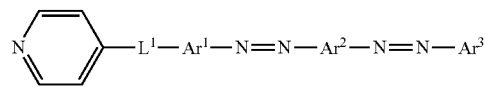
| No. | L¹ | Ar¹ | Ar² | Ar³ |
|---|---|---|---|---|
| B-14 | 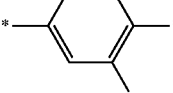 | 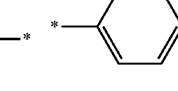 | 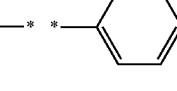 | 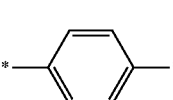 |
| B-15 | 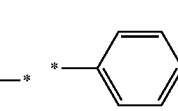 | 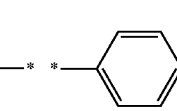 | 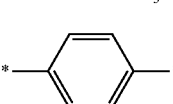 | 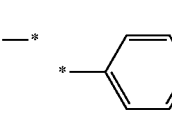 |
| B-16 | *—N=CH—* | 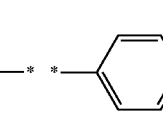 | 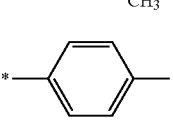 | 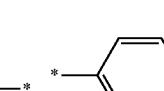 |
| B-17 | *—CH=CH—* | 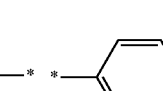 | | |
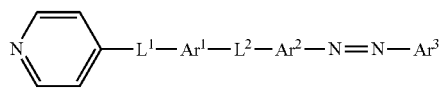
| No. | L¹ | Ar¹ | L² | Ar² | Ar³ |
|---|---|---|---|---|---|
| B-18 | *—N=N—* | 2-methyl-1,4-phenylene | *—O—C(=O)—* | 1,4-phenylene | 4-(N,N-diethylamino)phenyl |
| B-19 | *—N=N—* | 2-methyl-1,4-phenylene | *—O—C(=O)—* | 1,4-phenylene | 4-(N,N-diethylamino)phenyl |
| B-20 | *—N=N—* | 2-methyl-1,4-phenylene | *—N=CH—* | 1,4-phenylene | 4-(N,N-diethylamino)phenyl |
| B-21 | *—CH=CH—* | 1,4-phenylene | *—O—C(=O)—* | 2-methyl-1,4-phenylene | 4-(N,N-diethylamino)phenyl |

| No. | Structure |
|---|---|
| C-1 | (C₂H₅)₂N–C₆H₄–N=N–C₆H₃(CH₃)–N=N–C₆H₄–C(=O)–O–C₆H₄–CN |
| C-2 | (C₂H₅)₂N–C₆H₄–N=N–C₆H₃(CH₃)–N=N–C₆H₄–C(=O)–O–C₆H₄–$C_4H_9^n$ |
| C-3 | (C₂H₅)₂N–C₆H₄–N=N–C₆H₃(CH₃)–N=N–C₆H₄–C(=O)–O–C₆H₄–$OC_4H_9^n$ |
| C-4 | (C₂H₅)₂N–C₆H₄–N=N–C₆H₃(CH₃)–N=N–C₆H₄–C(=O)–O–C₆H₄–C₆H₄–CN |
| C-5 | (C₂H₅)₂N–C₆H₄–N=N–C₆H₃(CH₃)–N=N–C₆H₄–C(=O)–O–(4-pyridyl) |
| C-6 | (1-ethyl-indolin-5-yl)–N=N–C₆H₃(CH₃)–N=N–C₆H₄–C(=O)–O–C₆H₄–$C_4H_9^n$ |
| C-7 | (C₂H₅)₂N–C₆H₄–N=N–C₆H₃(CH₃)–N=N–C₆H₄–O–C(=O)–C₆H₁₀–$C_5H_{11}^n$ |
| C-8 | (C₂H₅)₂N–C₆H₄–N=N–C₆H₃(CH₃)–N=N–C₆H₄–CH=N–C₆H₄–CH₃ |
| C-9 | (C₂H₅)₂N–C₆H₄–N=N–C₆H₃(CH₃)–N=N–C₆H₄–CH=N–C₆H₄–$C_3H_7^n$ |
| C-10 | (C₂H₅)₂N–C₆H₄–N=N–C₆H₃(CH₃)–N=N–C₆H₄–CH=N–C₆H₄–$C_4H_9^n$ |
| C-11 | (C₂H₅)₂N–C₆H₄–N=N–C₆H₃(CH₃)–N=N–C₆H₄–CH=N–C₆H₄–$C_4H_9^{iso}$ |

-continued

| No. | Structure |
|---|---|
| C-12 | (Et)₂N–C₆H₄–N=N–C₆H₃(CH₃)–N=N–C₆H₄–CH=N–C₆H₄–$C_5H_{11}{}^n$ |
| C-13 | (Et)₂N–C₆H₄–N=N–C₆H₃(CH₃)–N=N–C₆H₄–CH=N–C₆H₄–$C_7H_{15}{}^n$ |
| C-14 | (Et)₂N–C₆H₄–N=N–C₆H₃(CH₃)–N=N–C₆H₄–CH=N–C₆H₄–$OC_3H_7{}^n$ |
| C-15 | (Et)₂N–C₆H₄–N=N–C₆H₃(CH₃)–N=N–C₆H₄–CH=N–C₆H₄–$OCH_2CH_2OCH_3$ |
| C-16 | (Et)₂N–C₆H₄–N=N–C₆H₃(CH₃)–N=N–C₆H₄–CH=N–C₆H₄–$O(CH_2CH_2O)_2CH_3$ |
| C-17 | (Et)₂N–C₆H₄–N=N–C₆H₃(CH₃)–N=N–C₆H₄–CH=N–C₆H₄–CN |
| C-18 | (Et)₂N–C₆H₄–N=N–C₆H₃(CH₃)–N=N–C₆H₄–CH=N–(4-pyridyl) |
| C-19 | (Et)₂N–C₆H₄–N=N–C₆H₃(CH₃)–N=N–C₆H₄–CH=CH–(4-pyridyl) |
| C-20 | (Et)₂N–C₆H₄–N=N–C₆H₃(CH₃)–N=N–C₆H₄–N=CH–C₆H₄–$OC_4H_8{}^n$ |
| C-21 | (Et)₂N–C₆H₄–N=N–C₆H₄–CH=N–C₆H₄–N=N–C₆H₄–$C_4H_9{}^n$ |
| C-22 | (Et)₂N–C₆H₄–N=N–C₆H₄–CH=N–C₆H₃(CH₃)–N=N–C₆H₄–$C_4H_9{}^n$ |
| C-23 | (Et)₂N–C₆H₄–N=N–C₆H₄–CH=N–C₆H₃(CH₃)–N=N–C₆H₄–$C_4H_9{}^n$ |

-continued
| No. | |
|---|---|
| C-24 | 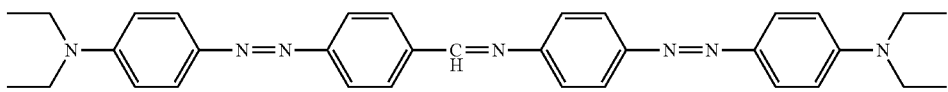 [SMILES: CCN(CC)c1ccc(N=Nc2ccc(C=Nc3ccc(N=Nc4ccc(N(CC)CC)cc4)cc3)cc2)cc1] |
| C-25 | 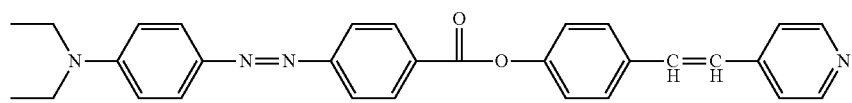 [SMILES: CCN(CC)c1ccc(N=Nc2ccc(C(=O)Oc3ccc(C=Cc4ccncc4)cc3)cc2)cc1] |
| C-26 | 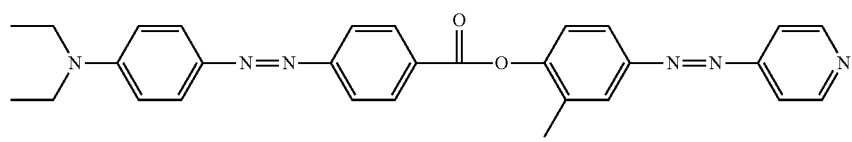 [SMILES: CCN(CC)c1ccc(N=Nc2ccc(C(=O)Oc3ccc(N=Nc4ccncc4)cc3C)cc2)cc1] |
| C-27 | 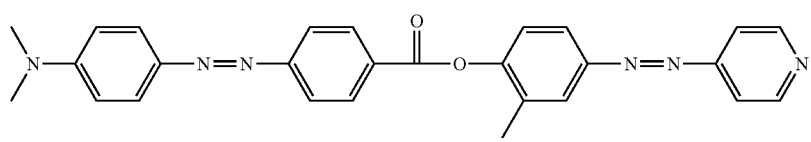 [SMILES: Cc1cc(N=Nc2ccncc2)ccc1OC(=O)c1ccc(N=Nc2ccc(N(C)C)cc2)cc1] |
| C-28 | 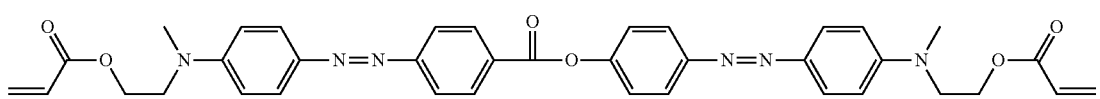 |
| C-29 | 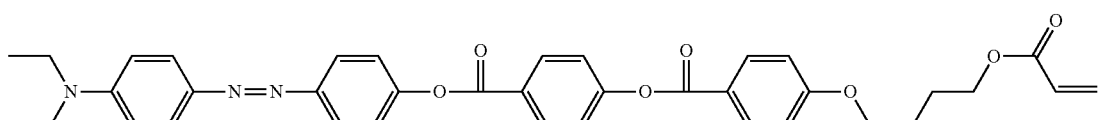 |
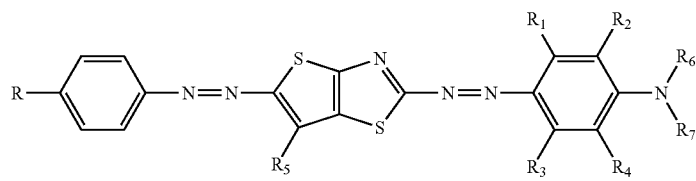
| No. | $R_1$ | $R_2$ | $R_3$ | $R_4$ | $R_5$ | $R_6$ | $R_7$ | R |
|---|---|---|---|---|---|---|---|---|
| D-1 | —H | —H | —H | —H | —H | —$C_2H_5$ | —$C_2H_5$ | —$nC_4H_9$ |
| D-2 | —H | —H | —H | —H | —H | —$C_2H_5$ | —$C_2H_5$ | —$nC_7H_{15}$ |
| D-3 | —H | —H | —H | —H | —H | —$C_2H_5$ | —$C_2H_5$ | —$OnC_4H_9$ |
| D-4 | —H | —H | —H | —H | —H | —$C_2H_5$ | —$C_2H_5$ | —$CF_3$ |
| D-5 | —H | —H | —H | —H | —H | —$C_2H_5$ | —$C_2H_5$ | —OH |
| D-6 | —H | —H | —H | —H | —H | —$C_2H_5$ | —$C_2H_5$ | —CN |
| D-7 | —H | —H | —H | —H | —H | —$C_2H_5$ | —$C_2H_5$ | —$NO_2$ |
| D-8 | —H | —H | —H | —H | —H | —$C_2H_5$ | —$C_2H_5$ | —F |
| D-9 | —H | —H | —H | —H | —H | —$C_2H_5$ | —$C_2H_5$ | —Br |
| D-10 | —H | —H | —H | —H | —H | —$C_2H_5$ | —$C_2H_5$ | —I |

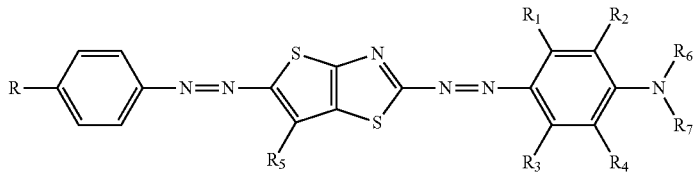

| No. | R₁ | R₂ | R₃ | R₄ | R₅ | R₆ | R₇ | R |
|---|---|---|---|---|---|---|---|---|
| D-11 | —H | —H | —H | —H | —H | —CH₃ | —H | —nC₄H₉ |
| D-12 | —H | —H | —H | —H | —H | —CH₃ | —CH₃ | —nC₄H₉ |
| D-13 | —H | —H | —H | —H | —H | —CH₃ | —nC₆H₁₃ | —nC₄H₉ |
| D-14 | —H | —H | —H | —H | —H | —CH₃ | —CH₂CH₂OH | —nC₄H₉ |
| D-15 | —H | —H | —H | —H | —H | —CH₃ | —CH₂CH₂OCH₃ | —nC₄H₉ |
| D-16 | —H | —H | —H | —H | —H | —CH₃ | —CH₂CH₂OCOCH=CH₂ | —nC₄H₉ |
| D-17 | —H | —H | —H | —H | —H | —CH₃ | —CH₂CH₂CN | —nC₄H₉ |
| D-18 | —H | —H | —H | —H | —H | —CH₂CH₂OCOCH=CH₂ | —CH₂CH₂OCOCH=CH₂ | —nC₄H₉ |
| D-19 | —CH₃ | —H | —H | —H | —H | —C₂H₅ | —C₂H₅ | —nC₄H₉ |
| D-20 | —F | —H | —H | —H | —H | —C₂H₅ | —C₂H₅ | —nC₄H₉ |

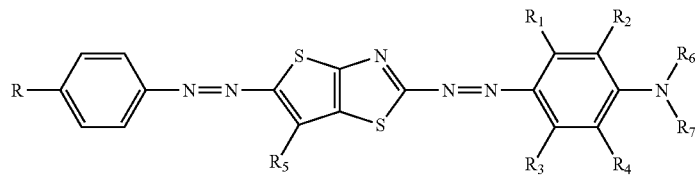

| No. | R₁ | R₂ | R₃ | R₄ | R₅ | R₆ | R₇ | R |
|---|---|---|---|---|---|---|---|---|
| D-21 | —Cl | —H | —H | —H | —H | —C₂H₅ | —C₂H₅ | —nC₄H₉ |
| D-22 | —OH | —H | —H | —H | —H | —C₂H₅ | —C₂H₅ | —nC₄H₉ |
| D-23 | —OCH₃ | —H | —H | —H | —H | —C₂H₅ | —C₂H₅ | —nC₄H₉ |
| D-24 | —H | —OCH₃ | —OCH₃ | —H | —H | —C₂H₅ | —C₂H₅ | —nC₄H₉ |
| D-25 | —H | —H | —H | —H | —CH₃ | —C₂H₅ | —C₂H₅ | —nC₄H₉ |

| No. | |
|---|---|
| D-26 | ![structure] |
| D-27 | ![structure] |
| D-28 | ![structure] |
| D-29 | ![structure] |

-continued
| No. | |
|---|---|
| D-30 | 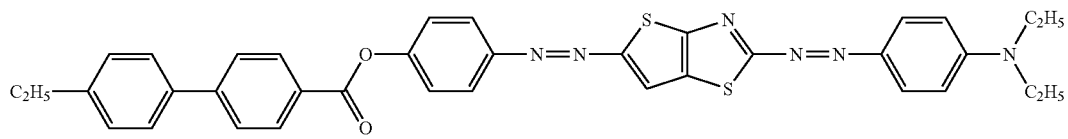 [SMILES: CCc1ccc(-c2ccc(C(=O)Oc3ccc(N=Nc4cc5sc(N=Nc6ccc(N(CC)CC)cc6)nc5s4)cc3)cc2)cc1] |
| D-31 | 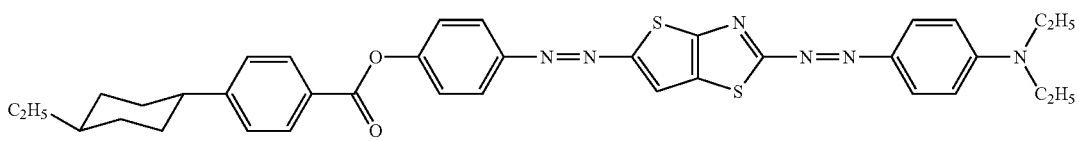 [SMILES: CCC1CCC(c2ccc(C(=O)Oc3ccc(N=Nc4cc5sc(N=Nc6ccc(N(CC)CC)cc6)nc5s4)cc3)cc2)CC1] |
| D-32 | 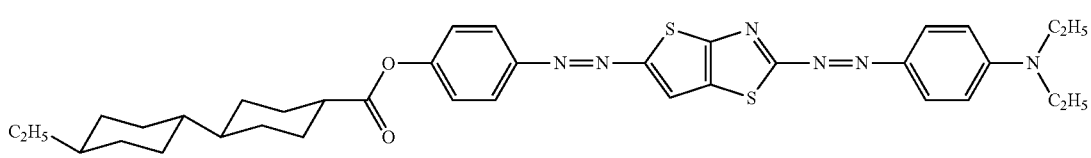 [SMILES: CCC1CCC(C2CCC(C(=O)Oc3ccc(N=Nc4cc5sc(N=Nc6ccc(N(CC)CC)cc6)nc5s4)cc3)CC2)CC1] |
| D-33 | 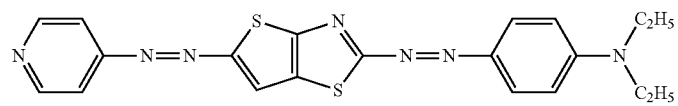 |
| D-34 | 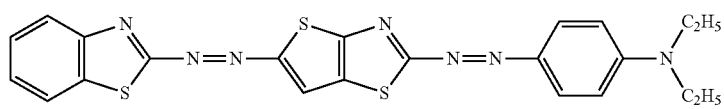 |
| D-35 | 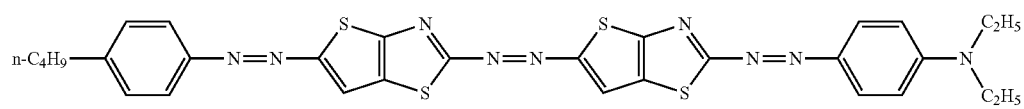 |
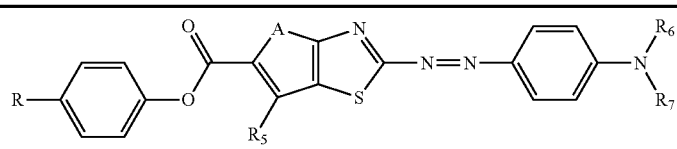
| No. | A | $R_5$ | $R_6$ | $R_7$ | R |
|---|---|---|---|---|---|
| D-36 | S | —H | —$C_2H_5$ | —$C_2H_5$ | —$nC_4H_9$ |
| D-37 | S | —H | —$C_2H_5$ | —$C_2H_5$ | —$nC_7H_{15}$ |
| D-38 | S | —H | —$C_2H_5$ | —$C_2H_5$ | —CN |
| D-39 | S | —H | —$C_2H_5$ | —$C_2H_5$ | —Br |
| D-40 | S | —$CH_3$ | —$C_2H_5$ | —$C_2H_5$ | —$nC_4H_9$ |
| D-41 | S | —H | —$CH_3$ | —$CH_3$ | —$nC_4H_9$ |
| D-42 | O | —H | —$C_2H_5$ | —$C_2H_5$ | —$nC_4H_9$ |
| No. | |
|---|---|
| D-43 | 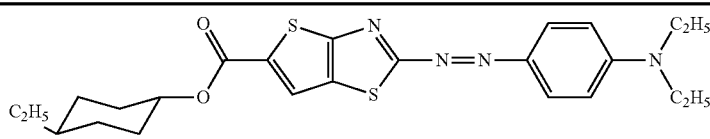 |

-continued

| No. | |
|---|---|
| D-44 | 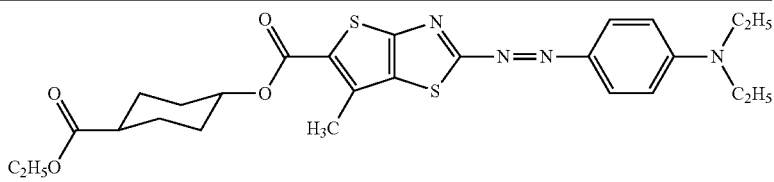 |

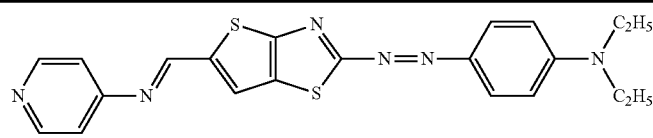

| No. | $R_6$ | $R_7$ | R |
|---|---|---|---|
| D-45 | —$C_2H_5$ | —$C_2H_5$ | —$nC_4H_9$ |
| D-46 | —$C_2H_5$ | —$C_2H_5$ | —$OnC_4H_9$ |
| D-47 | —$C_2H_5$ | —$C_2H_5$ | —$CF_3$ |
| D-48 | —$C_2H_5$ | —$C_2H_5$ | —F |
| D-49 | —$CH_3$ | —$CH_3$ | —$nC_4H_9$ |

| No. | |
|---|---|
| D-50 | 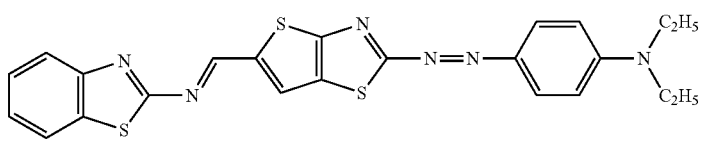 [SMILES: CCN(CC)c1ccc(N=Nc2nc3sc(/C=N/c4nc5ccccc5s4)cc3s2)cc1] |
| D-51 | |
| D-52 | 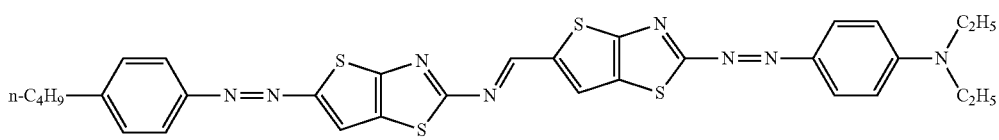 |

The liquid crystallinity of the azo dye represented by General Formula (I) is not particularly limited and may be appropriately determined depending on the intended purpose. The azo dye preferably shows a nematic liquid crystal phase at 10° C. to 300° C., more preferably 100° C. to 250° C.

In the composition containing the liquid crystal compounds such as the above azo dye, the amount of the azo dye represented by General Formula (I) is preferably 80% by mass or more, more preferably 90% by mass or more, with respect to the amount of all dyes. Also, in the total solid content (excluding a solvent), the amount of the azo dye represented by General Formula (I) is preferably 20% by mass or more, more preferably 30% by mass or more. The total solid content (%) of the composition is preferably 0.1% by mass to 10% by mass, more preferably 0.5% by mass to 5% by mass.

The polarizing layer formed from the above composition in the present invention has a thickness of 0.01 μm to 2 μm, more preferably 0.05 μm to 2 μm.

—Various Resins—

In the present invention, the various resins which can be incorporated into the liquid crystal compound layer are not particularly limited, so long as they do not impede orientation of the liquid crystal compounds, and may be appropriately selected depending on the intended purpose. Examples thereof include polyacrylic acid esters. The various resins may be commercially available resins or may be synthesized by a known polymerization method using various monomers or oligomers. These monomers are not particularly limited and may be appropriately selected depending on the intended purpose. Examples thereof include non-liquid-crystalline polyfunctional monomers containing a radial polymerizable group, and non-liquid-crystalline polyfunctional monomers containing a cation polymerizable group. Of these, from the viewpoint of curability, preferred are non-liquid-crystalline polyfunctional monomers containing a radial polymerizable group.

[Non-Liquid-Crystalline Polyfunctional Monomers Containing a Radial Polymerizable Group]

As described above, the non-liquid-crystalline polyfunctional monomers containing a radial polymerizable group are used to synthesize the various resins contained in the liquid crystal compound layer. In the present invention, the polyfunctional monomers are not particularly limited, so long as active species of the polyfunctional monomers are polymerized following a radical process, and may be appropriately selected depending on the intended purpose. As described above, the polyfunctional monomers are not particularly limited and may be appropriately selected depending on the intended purpose. The polyfunctional monomers are preferably those having two or more double bonds in the molecule thereof, more preferably those having ethylenically (aliphatic) unsaturated double bonds in the molecule thereof. Specific examples thereof include functional group-containing polyfunctional monomers such as alkenes, dienes, acrylates, methacrylates, diesters of unsaturated polyvalent carboxylic acids, amides of α, β-unsaturated carboxylic acids, unsaturated nitriles, styrene or derivatives thereof, vinyl esters and vinyl ethers. The number of double bonds in the molecule is preferably 2 to 20, more preferably 2 to 15, most preferably 2 to 6. The polyfunctinal monomers are preferably esters formed between unsaturated fatty acids and polyols having two or more hydroxyl groups in the molecule thereof. Examples of the unsaturated fatty acids include acrylic acid, methacrylic acid, maleic acid and itaconic acid, with acrylic acid and methacrylic acid being preferred. The polyols having two or more hydroxyl groups in the molecule thereof are preferably oligomers of tetra or higher-valent alcohols or tri or higher-valent alcohols. The oligomers have a molecular structure in which polyvalent alcohols are linked together via an ether bond, an ester bond or a urethane bond. Preferably, the oligomers have a molecular structure in which polyvalent alcohols are linked together via an ether bond.

Particularly preferably, the polyfunctional monomers are soluble in organic solvents. Such monomers are, for example, compounds having a boiling point of 100° C. of higher under atmospheric pressure. Examples of difunctional (meth)acrylates among the above polyfunctional monomers include ethylene glycol di(meth)acrylate, 1,6-hexanediol di(meth)acrylate, 1,9-nonandiol di(meth)acrylate, polypropylene glycol di(meth)acrylate, tetraethylene glycol di(meth)acrylate and bisphenoxyethanolfluorene diacrylate. Examples of commercially available products thereof include ARONIX M-210, ARONIX M-240 and ARONIX M-6200 (these products are of TOAGOSEI CO., LTD.), KAYARAD HDDA, KAYARAD HX-220 and KAYARAD R-604 (these products are of NIPPON KAYAKU Co., Ltd.) and VISCOAT 260, VISCOAT 312 and VISCOAT 335HP (these products are of OSAKA ORGANIC CHEMICAL INDUSTRIES LTD.).

Examples of tri or higher-functional (meth)acrylates include trimethylolpropane tri(meth)acrylate, pentaerythritol tri(meth)acrylate, tri((meth)acryloyloxyethyl) phosphate, pentaerythritol tetra(meth)acrylate, dipentaerythritol penta(meth)acrylate and dipentaerythritol hexa(meth)acrylate. Examples of commercially available products thereof include ARONIX M-309, ARONIX M-400, ARONIX M-405, ARONIX M-450, ARONIX M-7100, ARONIX M-8030 and ARONIX M-8060 (trade name) (these products are of TOAGOSEI CO., LTD.), KAYARAD TMPTA, KAYARAD DPHA, KAYARAD DPCA-20, KAYARAD DPCA-30, KAYARAD DPCA-60 and KAYARAD DPCA-120 (trade name) (these products are of NIPPON KAYAKU Co., Ltd.) and VISCOAT 295, VISCOAT 300, VISCOAT 360, VISCOAT GPT, VISCOAT 3PA and VISCOAT 400 (trade name) (these products are of OSAKA ORGANIC CHEMICAL INDUSTRIES LTD.).

Examples of di or higher-/tri or higher-functional (meth)acrylates (further exemplary monomers and oligomers) include polyethylene glycol di(meth)acrylate, polyethylene glycol di(meth)acrylate, trimethylolethane triacrylate, trimethylolpropane diacrylate, neopentyl glycol di(meth)acrylate, dipentaerythritol penta(meth)acrylate, hexanediol di(meth)acrylate, trimethylolpropane tri(acryloyloxypropyl) ether, tri(acryloyloxyethyl) isocyanurate, tri(acryloyloxyethyl)cyanurate, glycerin tri(meth)acrylate, tri((meth)acryloyloxyethyl) phosphate, dipentaerythritol penta(meth)acrylate and dipentaerythritol hexa(meth)acrylate; polyfunctional (meth)acrylates formed by, for example, adding ethylene oxide or propylene oxide to polyfunctional alcohols (e.g., trimethylolpropane and glycerin) and treating it so as to have a moiety of (meth)acrylate; poly(meth)acrylates of polyether polyols, poly(meth)acrylates of polyester polyols, and poly(meth)acrylates of polyurethane polyols.

Monomers of esters formed between polyols and acrylic acid are commercially available from MITSUBISHI RAYON CO., LTD. (trade name: DIABEAM UK-4154) and NIPPON KAYAKU Co., Ltd. (trade name: KYARAD-DPHA, SR355).

These di/tri or higher-functional (meth)acrylates may be used individually or in combination, and also may be used in combination with monofunctional (meth)acrylates.

Examples of the monofunctional (meth)acrylates include 2-hydroxyethyl (meth)acrylate, carbitol(meth)acrylate, isoboronyl(meth)acrylate, 3-methoxybutyl(meth)acrylate, 2-(meth)acryloyloxyethyl-2-hydroxy propylphthalate, polyethylene glycol mono(meth)acrylate, polyethylene glycol mono(meth)acrylate, phenoxyethyl(meth)acrylate and ethylene glycol (meth)acrylate. Examples of commercially available products thereof include ARONIX M-101, ARONIX M-111 and ARONIX M-114 (TOAGOSEI CO., LTD.), KAYARAD TC-110S and KAYARAD TC-120S (these products are of NIPPON KAYAKU Co., Ltd.) and VISCOAT 158 and VISCOAT 2311 (these products are of OSAKA ORGANIC CHEMICAL INDUSTRIES LTD.).

As described below, in producing a polarizing layer, the orientation state of nematic liquid crystal dyes is preferably fixed. Specifically, the orientation of dyes is fixed through a polymerization reaction. The polymerization reaction encompasses thermal polymerization using a thermal polymerization initiator and photo polymerization using a photo polymerization initiator.

In the composition used for forming the liquid crystal compound layer containing the liquid crystal compound, the total amount of the dyes and the non-liquid-crystalline polymerizable polyfunctional monomers is preferably 50% by mass or higher, more preferably 70% by mass or higher, with respect to the total solid content excluding the solvent.

[Polymerization Initiator]

The various resins contained in the above liquid crystal compound layer may be synthesized optionally using a polymerization initiator. In particular, in order to cure the composition containing the above radical polymerizable polyfunctional monomer, a polymerization initiator is preferably used.

The polymerization initiator is not particularly limited and may be appropriately selected depending on the intended purpose. Known polymerization initiators can be suitably used depending on whether photo polymerization or thermo polymerization is conducted. Examples of the photo polymerization initiator include α-carbonyl compounds (described in U.S. Pat. Nos. 2,367,661 and 2,367,670), acyloin esters (described in U.S. Pat. No. 2,448,828), α-hydrocarbon-substituted aromatic acyloin compounds (described in U.S. Pat. No. 2,722,512), polynuclear quinone compounds (U.S. Pat. Nos. 3,046,127 and 2,951,758), combinations of triarylimidazole dimers and p-amino phenyl ketones (described in U.S. Pat. No. 3,549,367), acrydine compounds and phenazine compounds (described in JP-A No. 60-105667 and U.S. Pat. No. 4,239,850) and oxadiazolyl compounds (described in U.S. Pat. No. 4,212,970).

The amount of the photo polymerization initiator used is preferably 0.01% by mass to 20% by mass, more preferably 1% by mass to 10% by mass, with respect to the total solid content excluding the solvent.

Regarding the type of the photo polymerization initiator used, the amount of the photo polymerization initiator used, and the dose of light applied for polymerization, the description of paragraphs [0050] and [0051] of JP-A No. 2001-91741 can be applied to the present invention.

—Other Additives—

The liquid crystal compound layer in the color filter of the present invention may optionally contain various additives in addition to the above components. Examples of the additives include an air blow-related uneven coating-preventing agent, a cissing inhibitor, an additive for controlling a tilt angle at an orientation layer (a tilt angle of liquid crystal dyes at the interface of a light-absorbable anisotropic film and an orientation layer), an additive for controlling a tilt angle at an air interface (a tilt angle of dyes at the interface of a polarizing plate film and air), a sugar, a drug having at least one of an antifungal function, an antibacterial function and a disinfectant function, and a non-liquid-crystalline binder polymer.

[Air Blow-Related Uneven Coating-Preventing Agent]

The air blow-related uneven coating-preventing agent is not particularly limited, so long as it can prevent a coating liquid of the composition from being uneven by air blow, and may be appropriately selected depending on the intended purpose. In general, a fluorine-containing polymer may be suitably used as the air blow-related uneven coating-preventing agent. The fluorine-containing polymer is not particularly limited, so long as it does not impede a change in tilt angle of dyes and orientation thereof. The fluorine-containing polymer usable as the air blow-related uneven coating-preventing agent is described in, for example, JP-A No. 2004-198511, JP-B No. 4190275, and JP-A Nos. 2004-333852 and 2005-206638. When the dyes and the fluorine-containing polymer are used in combination, unevenness can be prevented, resulting in that high-quality images can be displayed. In addition, coating properties are improved to involve no cissing. Preferably, the amount of the fluorine-containing polymer added as the air blow-related uneven coating-preventing agent, at which orientation of dyes is not impeded, is generally 0.1% by mass to 10% by mass, more preferably 0.5% by mass to 10% by mass, still more preferably 0.5% by mass to 5% by mass, with respect to the dyes.

[Cissing Inhibitor]

The cissing inhibitor is not particularly limited, so long as it can prevent cissing during coating of a composition used for forming the liquid crystal compound layer, and may be appropriately selected depending on the intended purpose. Examples thereof include polymer compounds. The polymers used are not particularly limited, so long as they are compatible to the liquid crystal compound and do not considerably impede a change in tilt angle of dyes and orientation thereof. The polymers usable as the cissing inhibitor are described in, for example, JP-A No. 08-95030. Specifically, cellulose esters are exemplified as particularly preferred polymers. Examples of the cellulose esters include cellulose acetate, cellulose acetate propionate, hydroxypropyl cellulose and cellulose acetate butylate. Preferably, the amount of the polymer added as the cissing inhibitor, at which orientation of liquid crystal compounds is not impeded, is generally 0.1% by mass to 10% by mass, more preferably 0.1% by mass to 8% by mass, still more preferably 0.1% by mass to 5% by mass, with respect to the liquid crystal compound.

When a coating liquid of the composition containing the liquid crystal compounds is applied onto the orientation layer, the dyes are oriented at a tilt angle of the orientation layer at the interface defined by the orientation layer, and are oriented at a tilt angle of the air interface at the interface defined by air. By horizontally orienting the liquid crystal compounds and fixing them at the oriented state, a polarizing layer can be formed.

[Tilt Angle-Controlling Agent at Orientation Layer (Orientation Layer Tilt Angle-Controlling Agent)]

The orientation layer tilt angle-controlling agent is not particularly limited, so long as it controls the tilt angle of an orientation layer, and may be appropriately selected depending on the intended purpose. Compounds having both a polar group and a non-polar group in the molecule thereof may be used. Examples of such compounds include PO—OH, PO—COOH, PO—O—PO, PO—$NH_2$, PO—NH—PO, PO—SH, PO—S—PO, PO—CO—PO, PO—COO—PO, PO—CONH—PO, PO—CONHCO—PO, PO—$SO_3$H, PO—$SO_3$—PO, PO—$SO_2$NH—PO, PO—$SO_2$NHSO_2—PO, PO—=N—PO, HO—P(—OPO)$_2$, (HO—)$_2$PO—OPO, P(—OPO)$_3$, HO—PO(—OPO)$_2$, (HO—)$_2$PO—OPO, PO(—OPO)$_3$, PO—$NO_2$, PO—CN, and organic salts thereof. Here, the organic salts are preferably pyridinium salts as well as ammonium salts, carboxylic acid salts and sulfonic acid salts, for example. Among the above-listed compounds, PO—OH, PO—COOH, PO—O—PO, PO—$NH_2$, PO—$SO_3$H, HO—PO(—OPO)$_2$, (HO—)$_2$PO—OPO, PO(—OPO)$_3$ and organic salts thereof are preferred. Here, PO denotes a non-polar group, and when a plurality of POs are contained, the POs may be identical or different.

Examples of groups denoted by PO include alkyl groups (preferably linear, branched or cyclic, substituted or unsubstituted alkyl groups having 1 to 30 carbon atoms), alkenyl groups (preferably linear, branched or cyclic, substituted or unsubstituted alkenyl groups having 1 to 30 carbon atoms), alkynyl groups (preferably linear, branched or cyclic, substituted or unsubstituted alkynyl groups having 1 to 30 carbon atoms), aryl groups (preferably substituted or unsubstituted aryl groups having 6 to 30 carbon atoms) and silyl groups (preferably substituted or unsubstituted silyl group having 3 to 30 carbon atoms). These non-polar groups may further have a substituent. Example of the substituent include halogen, alkyl (including cycloalkyl and bicycloalkyl), alkenyl (including cycloalkenyl and bicycloalkenyl), alkynyl, aryl, heterocyclic, cyano, hydroxyl, nitro, carboxyl, alkoxyl, aryloxy, silyloxy, heterocyclic oxy, acyloxy, carbamoyloxy, alkoxycarbonyloxy, aryloxycarbonyloxy, amino (including anilino), acylamino, aminocarbonylamino, alkoxycarbonylamino, aryloxycarbonylamino, sulfamoylamino, alkylsulfonylamino, arylsulfonylamino, mercapto, alkylthio, arylthio, heterocyclic thio, sulfamoyl, sulfo, alkylsufinyl, arylsufinyl, alkylsulfonyl, arylsulfonyl, acyl, aryloxycarbonyl, alkoxycarbonyl, carbamoyl, arylazo, heterocyclic azo, imide, phosphino, phosphinyl, phosphinyloxy, phosphinylamino and silyl.

In the present invention, by adding the orientation layer tilt angle-controlling agent to the coating liquid of the composition containing the liquid crystal compounds, and orienting the liquid crystal compounds in the presence of the orientation layer tilt angle-controlling agent, the tilt angle of the dyes can be controlled at the interface defined by the orientation layer. Preferably, the amount of the orientation layer tilt angle-controlling agent is generally 0.0001% by mass to 30% by mass, more preferably 0.001% by mass to 20% by mass, particularly preferably 0.005% by mass to 10% by mass, with respect to the mass of the dyes. In the present invention, the orientation layer tilt angle-controlling agent described in JP-A No. 2006-58801 can be used.

[Air-Interface Tilt Angle Controlling Agent]

The air-interface tilt angle controlling agent is preferably (1) a fluoroaliphatic group-containing compound represented by the following General Formula (III) or (2) a polymer containing, as a polymerization unit, at least one selected from the group consisting of a fluoroaliphatic group-containing monomer represented by the following General Formula (IV) or (V) and an amide group-containing monomer represented by the following General Formula (VI).

General Formula (III)

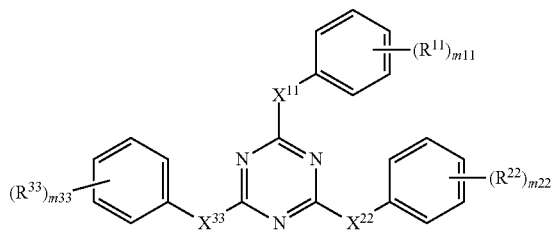

In General Formula (III), $R^{11}$, $R^{22}$ and $R^{33}$ each independently represent an alkoxy group having a $CF_3$ group or $CF_2H$ group at the end thereof, $X^{11}$, $X^{22}$ and $X^{33}$ each independently represent —NH—, —O— or —S—, and $m_{11}$, $m_{22}$ and $m_{33}$ are each independently an integer of 1 to 3.

General Formula (IV)

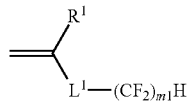

In General Formula (IV), $R^1$ represents a hydrogen atom, a halogen atom or a methyl group, $L^1$ represents a divalent linking group, and m1 is an integer of 1 to 18.

General Formula (V)

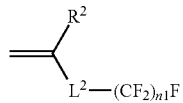

In General Formula (V), $R^2$ represents a hydrogen atom, a halogen atom or a methyl group, $L^2$ represents a divalent linking group, and n1 is an integer of 1 to 18.

General Formula (VI)

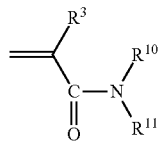

In General Formula (VI), $R^3$ represents a hydrogen atom, a halogen atom or a methyl group, $R^{10}$ and $R^{11}$ each independently represent a hydrogen atom, an alkyl group having 1 to 18 carbon atoms, an aromatic group having 6 to 20 carbon atoms or a heterocyclic group having 1 to 20 carbon atoms, and $R^{10}$ and $R^{11}$ may be linked together to form a heterocyclic structure.

First, the compound represented by General Formula (III) will be described.

In General Formula (III), the substituent represented by $R^{11}$, $R^{22}$ or $R^{33}$ is an alkoxy group having a $CF_3$ group or $CF_2H$ group at the end thereof, and may be linear or branched. The substituent preferably has 4 to 20 carbon atoms, more preferably has 4 to 16 carbon atoms, particularly preferably has 6 to 16 carbon atoms. The alkoxy group having a $CF_3$ group or $CF_2H$ group at the end thereof is an alkoxy group in which some or all hydrogen atoms are substituted with fluorine atoms. In the alkoxy group, 50% or more of the hydrogen atoms are preferably substituted with fluorine atoms, 60% or more of the hydrogen atoms are more preferably substituted with fluorine atoms, and 70% or more of the hydrogen atoms are particularly preferably substituted with fluorine atoms. The alkoxy group (having a $CF_3$ group or $CF_2H$ group at the end thereof) represented by $R^{11}$, $R^{22}$ or $R^{33}$ is exemplified as (1) to (18) given below.

(1): n-$C_8F_{17}$—O—
(2): n-$C_6F_{13}$—O—
(3): n-$C_4F_9$—O—
(4): n-$C_8F_{17}$—$(CH_2)_2$—O—$(CH_2)_2$—O—
(5): n-$C_6F_{13}$—$(CH_2)_2$—O—$(CH_2)_2$—O—
(6): n-$C_4F_9$—$(CH_2)_2$—O—$(CH_2)_2$—O—
(7): n-$C_8F_{17}$—$(CH_2)_3$—O—
(8): n-$C_6F_{13}$—$(CH_2)_3$—O—
(9): n-$C_4F_9$—$(CH_2)_3$—O—
(10): H—$(CF_2)_8$—O—
(11): H—$(CF_2)_6$—O—
(12): H—$(CF_2)_4$—O—
(13): H—$(CF_2)_8$—$(CH_2)$—O—
(14): H—$(CF_2)_6$—$(CH_2)$—O—
(15): H—$(CF_2)_4$—$(CH_2)$—O—
(16): H—$(CF_2)_8$—$(CH_2)$—O—$(CH_2)_2$—O—
(17): H—$(CF_2)_6$—$(CH_2)$—O—$(CH_2)_2$—O—
(18): H—$(CF_2)_4$—$(CH_2)$—O—$(CH_2)_2$—O—

In General Formula (III), each of $X^{11}$, $X^{22}$ and $X^{33}$ preferably represents —NH— or —O—, most preferably —NH—. Each of $m_{11}$, $m_{22}$ and $m_{33}$ is preferably 2.

Specific examples of the compound represented by General Formula (III) will be given below. However, the compound usable in the present invention should not be construed as being limited these specific examples.

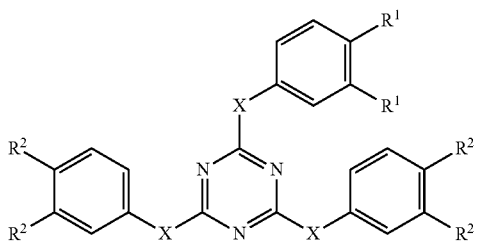

| Compound No. | $R^1$ | $R^2$ | X |
|---|---|---|---|
| I-1 | $O(CH_2)_3(CF_2)_4F$ | $O(CH_2)_3(CF_2)_4F$ | NH |
| I-2 | $O(CH_2)_3(CF_2)_6F$ | $O(CH_2)_3(CF_2)_6F$ | NH |

-continued

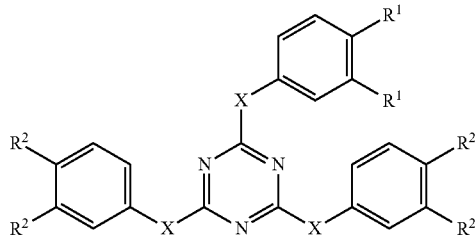

| Compound No. | $R^1$ | $R^2$ | X |
|---|---|---|---|
| I-3 | $O(CH_2)_3(CF_2)_8F$ | $O(CH_2)_3(CF_2)_8F$ | NH |
| I-4 | $OCH_2(CF_2)_6H$ | $OCH_2(CF_2)_6H$ | NH |
| I-5 | $OCH_2(CF_2)_8H$ | $OCH_2(CF_2)_8H$ | NH |
| I-6 | $O(CH_2)_2O(CH_2)_2(CF_2)_6F$ | $O(CH_2)_2O(CH_2)_2(CF_2)_6F$ | NH |
| I-7 | $O(CH_2)_2O(CH_2)_2(CF_2)_4F$ | $O(CH_2)_2O(CH_2)_2(CF_2)_4F$ | NH |
| I-8 | $O(CH_2)_3S(CH_2)_2(CF_2)_6F$ | $O(CH_2)_3S(CH_2)_2(CF_2)_6F$ | NH |
| I-9 | $O(CH_2)_3S(CH_2)_2(CF_2)_4F$ | $O(CH_2)_3S(CH_2)_2(CF_2)_4F$ | NH |
| I-10 | $O(CH_2)_6S(CH_2)_2(CF_2)_6F$ | $O(CH_2)_6S(CH_2)_2(CF_2)_6F$ | NH |
| I-11 | $O(CH_2)_6S(CH_2)_2(CF_2)_4F$ | $O(CH_2)_6S(CH_2)_2(CF_2)_4F$ | NH |
| I-12 | $O(CH_2)_2O(CH_2)(CF_2)_6H$ | $O(CH_2)_2O(CH_2)(CF_2)_6H$ | NH |
| I-13 | $O(CH_2)_3(CF_2)_6F$ | $O(CH_2)_3(CF_2)_6F$ | O |
| I-14 | $OCH_2(CF_2)_6H$ | $OCH_2(CF_2)_6H$ | O |
| I-15 | $O(CH_2)_2O(CH_2)_2(CF_2)_6F$ | $O(CH_2)_2O(CH_2)_2(CF_2)_6F$ | O |
| I-16 | $O(CH_2)_3S(CH_2)_2(CF_2)_6F$ | $O(CH_2)_3S(CH_2)_2(CF_2)_6F$ | O |
| I-17 | $O(CH_2)_2O(CH_2)(CF_2)_6H$ | $O(CH_2)_2O(CH_2)(CF_2)_6H$ | O |
| I-18 | $O(CH_2)_3(CF_2)_6F$ | $O(CH_2)_3(CF_2)_6F$ | S |
| I-19 | $OCH_2(CF_2)_6H$ | $OCH_2(CF_2)_6H$ | S |
| I-20 | $O(CH_2)_2O(CH_2)_2(CF_2)_6F$ | $O(CH_2)_2O(CH_2)_2(CF_2)_6F$ | S |
| I-21 | $O(CH_2)_3S(CH_2)_2(CF_2)_6F$ | $O(CH_2)_3S(CH_2)_2(CF_2)_6F$ | S |
| I-22 | $O(CH_2)_2O(CH_2)(CF_2)_6H$ | $O(CH_2)_2O(CH_2)(CF_2)_6H$ | S |

Next, description will be given with respect to a polymerization unit of a fluoroaliphatic group-containing monomer represented by General Formula (IV) or (V).

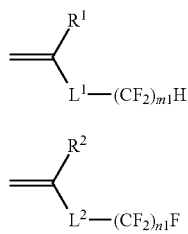

General Formula (IV)

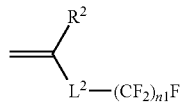

General Formula (V)

In General Formula (IV), $R^1$ represents a hydrogen atom, a halogen atom or a methyl group, and more preferably represents a hydrogen atom or a methyl group. $L^1$ represents a divalent linking group, and m1 is an integer of 1 to 18, preferably 2 to 12, more preferably 4 to 8, particularly preferably 4 or 6.

In General Formula (V), $R^2$ represents a hydrogen atom, a halogen atom or a methyl group, and more preferably represents a hydrogen atom or a methyl group. $L^2$ represents a divalent linking group, and n1 is an integer of 1 to 18, preferably 2 to 12, more preferably 4 to 8, particularly preferably 4 or 6.

Next, $L^1$ and $L^2$, which each represent a divalent linking group, will be described. $L^1$ and $L^2$ are not particularly limited, so long as they each independently represent a divalent substituent, and preferably have a structure represented by the following General Formula (VII). Here, (a) denotes a position at which the linking group is bonded to the double bond, and (b) denotes a position at which the linking group is bonded to the fluoroaliphatic group.

$$(a)\text{---}X^{10}\text{---}R^{20}\text{---}(b)$$ General Formula (VII)

In General Formula (VII), $X^{10}$ represents a single bond or one of the following divalent linking groups: *—COO—**, *—COS—**, *—OCO—**, *—CON($R^{21}$)—** and *—O—**. Here, the symbol "*" denotes a position at which the linking group is bonded to the double bond, and the symbol "**" denotes a position at which the linking group is bonded to $R^{20}$.

$R^{20}$ represents a polymethylene group which may have a substituent (e.g., a methylene group, an ethylene group or a trimethylene group), a phenylene group which may have a substituent (e.g., an o-phenylene group, a m-phenylene group or a p-phenylene group) or a group formed by combining these groups together as desired. Among them, $R^{20}$ preferably represents a polymethylene group, more preferably a methylene group, an ethylene group, a trimethylene group or a tetramethylene group, still more preferably a methylene group or an ethylene group.

$R^{21}$ represents a hydrogen atom, a C1-C8 alkyl group which may have a substituent or a C6-C20 aryl group which may have a substituent, more preferably a hydrogen atom or a C1-C6 alkyl group, still more preferably a hydrogen atom or a C1-C4 alkyl group.

The fluoroaliphatic group-containing monomer represented by General Formula (IV) is preferably a monomer represented by General Formula (VIII).

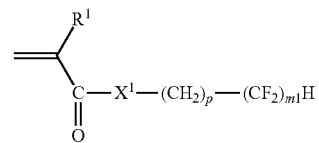

General Formula (VIII)

In General Formula (VIII), $X^1$ represents one of the following divalent groups: —O—, —S— and —N($R^{222}$)—, and p is an integer of 1 to 8. $X^1$ preferably represents —O— or —N($R^{222}$)—, more preferably represents —O—. p is preferably an integer of 1 to 6, more preferably 1 to 3. $R^1$ and m1 have the same meanings as defined in General Formula (IV), and their preferable groups/numerical range are similar. $R^{222}$ represents a hydrogen atom or a C1-C8 alkyl group which may have a substituent, or a C6-C20 aryl group which may have a substituent.

The fluoroaliphatic group-containing monomer represented by General Formula (V) is preferably a monomer represented by the following General Formula (IX).

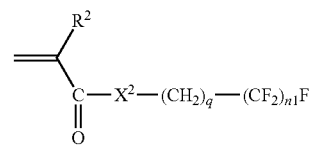

General Formula (IX)

In General Formula (IX), $X^2$ represents one of the following divalent groups: —O—, —S— and —N($R^{222}$)—, and q is an integer of 1 to 8. $X^2$ preferably represents —O— or —N($R^{222}$)—, more preferably represents —O—. p is preferably an integer of 1 to 6, more preferably 1 to 3. $R^2$ and n1 have the same meanings as defined in General Formula (V), and their preferable groups/numerical range are similar. $R^{222}$ has the same meaning as defined in General Formula (VIII).

Next, description will be given with respect to a polymerization unit of an amide group-containing monomer represented by General Formula (VI).

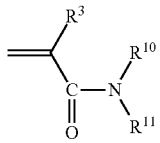

General Formula (VI)

In General Formula (VI), $R^3$ represents a hydrogen atom, a halogen atom or a methyl group, preferably a hydrogen atom or a methyl group. $R^{10}$ and $R^{11}$ each independently represent a hydrogen atom, an alkyl group having 1 to 18 carbon atoms, an aromatic group having 6 to 20 carbon atoms, or a heterocyclic group having 1 to 20 carbon atoms. These substituents may further have a substituent. $R^{10}$ or $R^{11}$ preferably represents an alkyl group having 1 to 12 carbon atoms or an aromatic group having 6 to 15 carbon atoms, more preferably represents an alkyl group having 1 to 6 carbon atoms or an aromatic group having 6 to 12 carbon atoms. $R^{10}$ and $R^{11}$ may be linked together to form a heterocyclic structure which is, for example, a pyrrolidine ring, a piperidine ring or a morpholine ring.

The polymer used in the air-interface tilt angle controlling agent is not particularly limited, so long as the fluoroaliphatic group-containing monomer or the amide group-containing monomer is contained as the polymerization unit, and may be appropriately selected depending on the intended purpose. Preferably, both the fluoroaliphatic group-containing monomer and the amide group-containing monomer are used as polymerization units. The polymer may contain, as polymerization units, two or more of the fluoroaliphatic group-containing monomer and two or more of the amide group-containing monomer. Also, the polymer may be a copolymer additionally containing one or more other copolymerizable monomers as a polymerization unit(s). Examples of such copolymerizable monomers employable include those described in Polymer Handbook 2nd ed., J. Brandrup, Wiley Interscience (1975) Chapter 2, Pages 1 to 483; specifically, compounds having one addition polymerizable unsaturated bond selected from acrylic acid esters, methacrylic acid esters, methacryl amides, allyl compounds, vinyl ethers and vinyl esters.

The polymer used in the air-interface tilt angle controlling agent preferably has a weight average molecular weight of 2,000 to 100,000, more preferably 3,000 to 80,000, still more preferably 4,000 to 60,000. Here, the weight average molecular weight and molecular weight are those (converted to polystyrene) obtained through refractive index detection with a GPC analysis apparatus using columns of TSKgel GMHxL, TSKgel G4000HxL and TSKgel G2000HxL (trade name) (these products are of TOSOH CORPORATION) (the solvent used: THF).

Next, specific structural examples of the polymer employable as the air-interface tilt angle controlling agent will be given below. However, the polymer usable in the present invention should not be construed as being limited these specific examples. Notably, the numbers in the chemical structures are ratios by mass of monomer components. Mw denotes a weight average molecular weight.

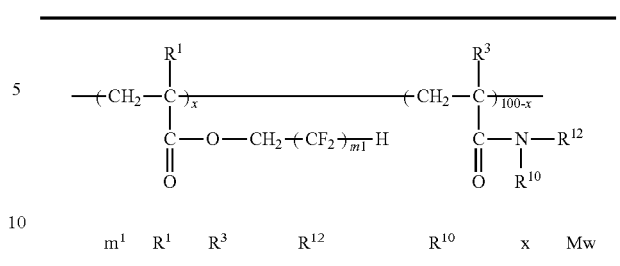

| | $m^1$ | $R^1$ | $R^3$ | $R^{12}$ | $R^{10}$ | x | Mw |
|---|---|---|---|---|---|---|---|
| P-1 | 4 | $CH_3$ | H | $CH_3$ | $CH_3$ | 60 | $1.9 \times 10^4$ |
| P-2 | 4 | H | H | $CH_3$ | $CH_3$ | 80 | $1.4 \times 10^4$ |
| P-3 | 6 | H | H | $CH_3$ | $CH_3$ | 70 | $2.8 \times 10^4$ |
| P-4 | 6 | H | H | $CH_3$ | $CH_3$ | 80 | $1.6 \times 10^4$ |
| P-5 | 6 | H | H | $CH_3$ | $CH_3$ | 90 | $1.8 \times 10^4$ |
| P-6 | 8 | H | H | $CH_3$ | $CH_3$ | 75 | $8.2 \times 10^4$ |
| P-7 | 8 | H | H | $CH_3$ | $CH_3$ | 95 | $4.6 \times 10^4$ |
| P-8 | 6 | H | H | $C_2H_5$ | $C_2H_5$ | 85 | $1.5 \times 10^4$ |
| P-9 | 6 | $CH_3$ | $CH_3$ | $C_4H_9$ (n) | $C_4H_9$ (n) | 80 | $1.9 \times 10^4$ |
| P-10 | 6 | H | H | $CH_2CH_2OCH_3$ | $CH_2CH_2OCH_3$ | 90 | $1.2 \times 10^4$ |

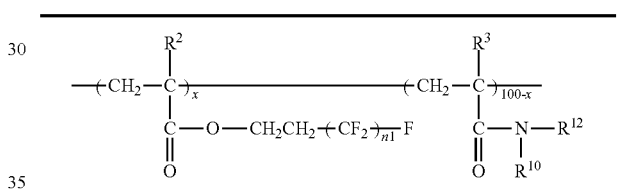

| | $n^1$ | $R^2$ | $R^3$ | $R^{12}$ | $R^{10}$ | x | Mw |
|---|---|---|---|---|---|---|---|
| P-11 | 4 | $CH_3$ | H | $CH_3$ | $CH_3$ | 55 | $8.8 \times 10^3$ |
| P-12 | 4 | H | H | $CH_3$ | $CH_3$ | 40 | $1.3 \times 10^4$ |
| P-13 | 6 | H | H | $CH_3$ | $CH_3$ | 40 | $1.7 \times 10^4$ |
| P-14 | 6 | H | H | $CH_3$ | $CH_3$ | 35 | $2.1 \times 10^4$ |
| P-15 | 6 | H | H | $CH_3$ | $CH_3$ | 45 | $9.0 \times 10^4$ |
| P-16 | 8 | H | H | $CH_3$ | $CH_3$ | 30 | $1.5 \times 10^4$ |
| P-17 | 6 | H | H | $CH_3$ | $CH_3$ | 40 | $4.6 \times 10^4$ |
| P-18 | 6 | H | H | $C_2H_5$ | $C_2H_5$ | 40 | $1.9 \times 10^4$ |
| P-19 | 6 | $CH_3$ | $CH_3$ | $CH_2CH_2OCH_3$ | $CH_2CH_2OCH_3$ | 40 | $1.2 \times 10^4$ |
| P-20 | 6 | H | H | $CH_2CH_2OH$ | $CH_2CH_2OH$ | 40 | $1.1 \times 10^4$ |

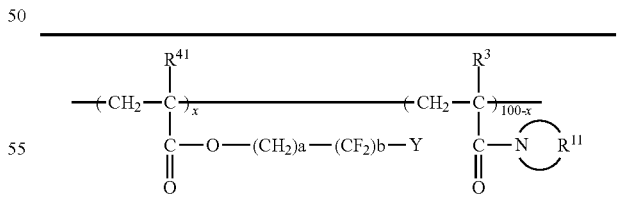

| | A | b | Y | $R^{41}$ | $R^3$ | $R^{11}$ | x | Mw |
|---|---|---|---|---|---|---|---|---|
| P-21 | 1 | 4 | H | H | $CH_3$ | $(CH_2)_4$ | 80 | $1.5 \times 10^4$ |
| P-22 | 1 | 6 | H | H | H | $(CH_2)_5$ | 85 | $1.3 \times 10^4$ |
| P-23 | 1 | 6 | H | H | H | $(CH_2)_2O(CH_2)_2$ | 80 | $1.8 \times 10^4$ |
| P-24 | 2 | 4 | F | H | $CH_3$ | $(CH_2)_4$ | 45 | $1.2 \times 10^4$ |
| P-25 | 2 | 6 | F | H | H | $(CH_2)_5$ | 35 | $1.5 \times 10^4$ |
| P-26 | 2 | 6 | F | H | H | $(CH_2)_2O(CH_2)_2$ | 40 | $2.3 \times 10^4$ |
| P-27 | 3 | 6 | F | H | H | $(CH_2)_5$ | 40 | $1.7 \times 10^4$ |
| P-28 | 6 | 6 | F | $CH_3$ | $CH_3$ | $(CH_2)_2O(CH_2)_2$ | 40 | $1.9 \times 10^4$ |

$$-\left(CH_2-\underset{\underset{O}{\overset{\|}{C}}-O-(CH_2)_a-(CF_2)_b-Y}{\overset{R^{41}}{C}}\right)_x-\left(CH_2-\underset{\underset{O}{\overset{\|}{C}}-\underset{H}{N}-R^{11}}{\overset{R^{3}}{C}}\right)_{100-x}-$$

| | a | b | Y | R⁴¹ | R³ | R¹¹ | x | Mw |
|---|---|---|---|---|---|---|---|---|
| P-29 | 1 | 4 | H | H | CH₃ | C₆H₁₃ (n) | 90 | 2.0 × 10⁴ |
| P-30 | 1 | 6 | H | H | H | CH(CH₃)₂ | 85 | 1.3 × 10⁴ |
| P-31 | 1 | 6 | H | H | H | CH₂CH₂Ph | 80 | 1.8 × 10⁴ |
| P-32 | 2 | 4 | F | H | CH₃ | C₄H₉ (n) | 45 | 2.7 × 10⁴ |
| P-33 | 2 | 6 | F | H | H | CH(CH₃)₂ | 40 | 1.8 × 10⁴ |
| P-34 | 2 | 6 | F | H | H | O(CH₃)₂CH₂COCH₃ | 35 | 1.8 × 10⁴ |
| P-35 | 3 | 6 | F | H | H | CH₂OC₄H₉ (n) | 40 | 1.7 × 10⁴ |
| P-36 | 6 | 6 | F | CH₃ | CH₃ | C₄H₉ (t) | 45 | 1.9 × 10⁴ |

$$-\left(CH_2-\underset{\underset{O}{\overset{\|}{C}}-O-CH_2-\underset{OH}{CH}-(CF_2)_{n^1}F}{\overset{R^{1}}{C}}\right)_x-\left(CH_2-\underset{\underset{O}{\overset{\|}{C}}-\underset{R^{10}}{N}-R^{11}}{\overset{R^{3}}{C}}\right)_{100-x}-$$

| | $n^1$ | R² | R³ | R¹¹ | R¹⁰ | x | Mw |
|---|---|---|---|---|---|---|---|
| P-37 | 4 | H | H | CH₃ | CH₃ | 55 | 1.1 × 10⁴ |
| P-38 | 4 | H | H | H | CH(CH₃)₂ | 40 | 1.3 × 10⁴ |
| P-39 | 6 | H | H | CH₃ | CH₃ | 40 | 1.6 × 10⁴ |
| P-40 | 6 | CH₃ | H | CH₃ | CH₃ | 35 | 2.7 × 10⁴ |
| P-41 | 6 | H | H | H | CH(CH₃)₂ | 45 | 1.4 × 10⁴ |
| P-42 | 6 | H | H | H | C(CH₃)₂CH₂COCH₃ | 30 | 1.9 × 10⁴ |
| P-43 | 6 | H | H | (CH₂)₄ | | 40 | 1.7 × 10⁴ |
| P-44 | 6 | CH₃ | CH₃ | (CH₂)₂O(CH₂)₂ | | 40 | 1.8 × 10⁴ |

Note:
P-43 and P-44 are examples in which R¹⁰ and R¹¹ are linked to form a ring.

$$-\left(CH_2-\underset{\underset{O}{\overset{\|}{C}}-O-CH_2CH_2-(CF_2)_cCF(CF_3)_2}{\overset{R^{1}}{C}}\right)_x-\left(CH_2-\underset{\underset{O}{\overset{\|}{C}}-\underset{R^{10}}{N}-R^{11}}{\overset{R^{3}}{C}}\right)_{100-x}-$$

| | c | R² | R³ | R¹¹ | R¹⁰ | x | Mw |
|---|---|---|---|---|---|---|---|
| P-45 | 4 | H | H | CH₃ | CH₃ | 45 | 3.3 × 10⁴ |
| P-46 | 4 | H | H | H | CH(CH₃)₂ | 40 | 1.5 × 10⁴ |
| P-47 | 6 | H | H | CH₃ | CH₃ | 40 | 1.6 × 10⁴ |
| P-48 | 6 | CH₃ | H | H | CH(CH₃)₂ | 40 | 2.4 × 10⁴ |
| P-49 | 6 | H | H | (CH₂)₂O(CH₂)₂ | | 40 | 1.7 × 10⁴ |

Note:
P-49 is an example in which R¹⁰ and R¹¹ are linked to form a ring.

| | Structure | Mw |
|---|---|---|
| P-50 | $-(CH_2-CH)_{55}-(CH_2-CH)_{15}-(CH_2-CH)_{30}-$ with substituents $-C(=O)-O-CH_2(CF_2)_6H$, $-C(=O)-O-CH_2CH_2(CF_2)_3F$, $-C(=O)-N(CH_3)_2$ | 1.7 × 10⁴ |
| P-51 | $-(CH_2-CH)_{40}-(CH_2-CH)_{30}-(CH_2-C(CH_3))_{30}-$ with substituents $-C(=O)-O-CH_2CH_2(CF_2)_6F$, $-C(=O)-N(CH_3)_2$, $-C(=O)-O-CH_3$ | 2.0 × 10³ |
| P-52 | $-(CH_2-C(CH_3))_{40}-(CH_2-CH)_{50}-(CH_2-C(CH_3))_{10}-$ with substituents $-C(=O)-O-CH_2CH_2(CF_2)_6F$, $-C(=O)-N(CH_3)_2$, $-C(=O)-O-CH_3$ | 2.5 × 10⁴ |

In addition, the air-interface tilt angle controlling agent used may be horizontally orienting agents described in JP-A Nos. 2005-99248, 2005-134884, 2006-126768 and 2006-267183.

In the present invention, the compounds serving as the air-interface tilt angle controlling agent may be used individually or in combination. The amount of the horizontally orienting agent added is preferably 0.1% by mass to 10% by mass, more preferably 0.5% by mass to 10% by mass, particularly preferably 0.5% by mass to 5% by mass, with respect to the amount of the dye added.

In the present invention, the term "tilt angle" refers to an angle formed between the major axes of the dye molecules and the interface (orientation layer interface or air interface). When the dyes are horizontally oriented so that the tilt angle at the side of the orientation layer becomes small in some degree, optical properties preferable as the polarizing layer are effectively obtained. Thus, in terms of polarization properties, the tilt angle at the side of the orientation layer is preferably 0° to 10°, more preferably 0° to 5°, particularly preferably 0° to 2°, most preferably 0° to 1°. Also, the tilt angle at the side of the air interface is preferably 0° to 10°, more preferably 0° to 5°, particularly preferably 0° to 2°.

In the present invention, by adding, to the composition containing the liquid crystal compounds, at least one of a fluoroaliphatic group-containing compound represented by General Formula (III) or a polymer containing, as a polymerization unit, at least one selected from the group consisting of a fluoroaliphatic group-containing monomer represented by General Formula (IV) or (V) and an amide group-containing monomer represented by General Formula (VI), the tilt angle at the side of the orientation layer in the polarizing plate formed using this composition can be adjusted to, for example, 2° or lower.

[Sugars]

The sugars are not particularly limited and may be appropriately selected depending on the intended purpose. When the sugars are added to the liquid crystal compound layer, the association degree of dye associates is increased, resulting in that the molecular orientation of the liquid crystal compounds can be increased.

Examples of the sugars include monosaccharides, disaccharides, polysaccharides and derivatives of sugars such as sugar alcohols. In particular, in terms of molecular association in achieving the effects of the present invention, the lower limit of the number of hydroxyl groups contained therein is generally 2, preferably 3, and the upper limit of the number of hydroxyl groups contained therein is generally 18, preferably 12. When the number of hydroxyl groups is too large, the sugars interact with the dyes too strongly to cause precipitation, impeding orientation of the liquid crystal compound layer. When the number of hydroxyl groups is too small, the sugars are not sufficiently compatible to the liquid crystal compounds, not improving orientation of the liquid crystal compound layer. Needless to say, both cases are not preferred.

The molecular weight of the sugar is not particularly limited and may be determined depending on the intended purpose. The molecular weight is preferably 1,000 or lower, more preferably 700 or lower. When the molecular weight of the sugar is too high, the sugar and the liquid crystal compounds cause phase separation to potentially impede orientation of the liquid crystal compound layer, which is not preferred.

The number of carbon atoms contained in the sugar is generally 36 or less, preferably 24 or less. When the number of carbon atoms contained in the sugar is large, the molecular weight thereof becomes high. Thus, as described above, the sugar and the liquid crystal compounds cause phase separation to potentially impede orientation of the liquid crystal compound layer, which is not preferred.

Among others, monosaccharides, oligo sugars and sugar alcohols are preferred, since they meet the above-described requirements regarding the number of hydroxyl groups and the range of molecular weight. Examples of the monosaccharides include xylose, ribose, glucose, fructose, mannose, sorbose and galactose. Examples of the oligo sugars include trehalose, kojibiose, nigerose, maltose, maltotriose, isomaltotriose, maltotetraose, isomaltose, sophorose, laminaribiose, cellobiose, gentiobiose, lactose, sucrose, melibiose, rutinose, primeverose, turanose, panose, isopanose, cellotriose, manninotriose, solatriose, melezitose, planteose, gentianose, umbeliferose, raffinose and stachyose. Examples of the sugar alcohols include reduced products of the above-listed monosaccharides/oligo sugars, such as threitol, xylitol, ribitol, arabitol, sorbitol and mannitol.

Particularly preferred are xylose, mannose, maltose, maltotriose and arabitol.

These sugars or sugar alcohols have optical isomers. In the present invention, any one or both of the optical isomers may be contained in the composition used for forming the liquid crystal compound layer. Also, in the composition used in the present invention, the above sugars may be used individually or in combination.

In the composition used for forming the liquid crystal compound layer in the present invention, the ratio by mass of the sugar to the liquid crystal compound is preferably 0.1 to 1. The lower limit of the ratio is more preferably 0.2, particularly preferably 0.3. The upper limit of the ratio is more preferably 0.7, particularly preferably 0.6. When the amount of the sugar is more than the upper limit, the association degree of the associates may be decreased. When the amount of the sugar is less than the lower limit, it is insufficient to increase the association degree of the associates of the liquid crystal compounds. Both cases are not preferred.

[Antifungal Agent, Antibacterial Agent and Disinfectant]

The antifungal agent, antibacterial agent and disinfectant are not particularly limited, so long as they have at least one of an antifungal function of inhibiting generation/growth/proliferation of fungi, a killing function of killing microorganisms, and an antibacterial function of inhibiting generation/growth/proliferation of microorganisms, and may be appropriately selected depending on the intended purpose. The antifungal agent, antibacterial agent and/or disinfectant can improve storage stability of the composition used for forming the liquid crystal compound layer.

The antifungal agent, antibacterial agent and disinfectant are not particularly limited and may be appropriately selected depending on the intended purpose. For example, known antifungal agents, disinfectants and antibacterial agents may be used. Preferably, they do not deteriorate optical characteristics of the liquid crystal compound layer formed using the composition for the liquid crystal compound layer. In the present invention, examples of the drug having at least one of antifungal, antibacterial and disinfectant functions include conventionally used phenols (e.g., 2,4,4'-trichloro-2'-hydroxydiphenyl), chlorine-based drugs (e.g., chlorine dioxide), indine-based drugs (e.g., iodine) and quaternary ammonium-based drugs (e.g., benzalkonium chloride).

In addition, Proxel BDN, Proxel BD20, Proxel GXL, Proxel LV, Proxel XL and Proxel XL2, Proxel Ultra10 (trade name) (these products are of Avecia Co.) are exemplified as drugs containing 1,2-benzisothiazolin-3-on as an active ingredient. Proxel IB (trade name) (product of Avecia Co.) is exemplified as drugs containing hexamethylene biguanide hydrochloride as an active ingredient. Densil P (trade name) (product of Avecia Co.) is exemplified as drugs containing dithio-2,2'-bis(benzmethylamide) as an active ingredient.

Also, the following compounds are particularly preferred since they exhibit antibacterial effects even in a trace amount.

| No. | Compound Name |
|---|---|
| 1. | 2-Chloromethyl-5-chloro-3-isothiazolone |
| 2. | 2-Cyanomethyl-5-chloro-3-isothiazolone |
| 3. | 2-Hydroxymethyl-5-chloro-3-isothiazolone |
| 4. | 2-(3-Methylcyclohexyl)-3-isothiazolone |
| 5. | 2-(4-Chlorophenyl)-4,5-dichloro-3-isothiazolone |
| 6. | 2-(4-Ethylphenyl)-3-isothiazolone |
| 7. | 2-(4-Nitrophenyl)-5-chloro-3-isothiazolone |
| 8. | 2-Chloromethyl-3-isothiazolone |
| 9. | 2-Methoxyphenyl-4-methyl-5-chloro-3-isothiazolone |
| 10. | 2-Morpholinomethyl-5-chloro-3-isothiazolone |

These compounds can be synthesized referring to, for example, the description of JP-A No. 02-278. Alternatively, commercially available products such as TRIBACTRAN (trade name) (product of Hoechst AG) may be used.

In the present invention, the drugs having at least one of an antifungal function, an antibacterial function and a disinfectant function may be used individually or in combination. The amount of the drug(s) contained in the composition for forming the liquid crystal compound layer is not particularly limited. The lower limit thereof is generally 0.01% by mass, preferably 0.001% by mass. The upper limit thereof is generally 0.5% by mass, preferably 0.3% by mass. When the amount of the antifungal/antibacterial/disinfectant drug is too small, satisfactory antifungal/antibacterial/disinfectant effects cannot be obtained even when used in the formation of the liquid crystal compound layer. When the amount of the antifungal/antibacterial/disinfectant drug is too large, the drug or other agents may precipitate during the formation of the liquid crystal compound layer, or phase separation may occur in the formed liquid crystal compound layer, potentially causing optical defects such as point defects and light scattering.

In the present invention, in order for the polarizing layer to have high polarization degree, electron-deficient discotic compounds and electron-rich compounds (dyes) are preferably contained in the composition used for forming the liquid crystal compound layer in the present invention. In the present invention, compounds described in, for example, JP-A No. 2006-323377 may be used as the electron-deficient discotic compounds and the electron-rich compounds.

Regarding the amount of the electron-deficient discotic compound contained in the composition used for forming the liquid crystal compound layer in the present invention, the lower limit is generally 0.1 parts by mass, preferably 0.2 parts by mass, while the upper limit is generally 50 parts by mass, preferably 40 parts by mass, with the total amount of the composition being 100 parts by mass. When the amount of the electron-deficient discotic compound is less than the lower limit, the advantageous effects of the electron-deficient discotic compound may not be obtained. When the amount of the electron-deficient discotic compound is more than the upper limit, the viscosity of the composition is disadvantageously increased, potentially making it difficult to handle the composition. Needless to say, both cases are not preferred.

The amount of the electron-rich compound (dye) contained in the composition used for forming the liquid crystal compound layer in the present invention is generally 50 parts by mass or less, preferably 40 parts by mass or less, per 100 parts by mass of the total amount of the composition. When the amount is more than the upper limit, the viscosity of the resultant composition is increased to potentially make it difficult to handle the composition, which is not preferred.

In general, the ratio by mass of the electron-deficient discotic compound to the electron-rich compound is preferably in the range of 10/90 to 90/10. When the ratio deviates this range, the effects of the electron-deficient discotic compound and the electron-rich compound may not be obtained, which is not preferred.

[Non-Liquid-Crystalline Binder Polymer]

The composition used for forming the liquid crystal compound layer in the present invention may contain known resins as a binder polymer. Examples of the binder polymer include acrylic resins (e.g., polyacrylonitriles, polyacrylic acid esters and polyacrylamides), polystyrene resins, polyvinyl acetal resins (e.g., polyvinyl acetoacetals and polyvinyl butyrals), modified cellulose resins (e.g., ethyl cellulose, hydroxy ethyl cellulose, ethyl hydroxy cellulose, hydroxy propyl cellulose, ethyl hydroxyethyl cellulose, methyl cellulose, cellulose acetate, cellulose butyrate, cellulose acetate propionate and cellulose nitrate), cellulose resins (e.g., nitrocellulose, ethyl hydroxyethyl cellulose and ethyl cellulose), polyurethane resins, polyamide resins, polyester resins, polycarbonate resins, phenoxy resins, phenol resins, epoxy resins and various elastomers. These may be used individually, or may be mixed upon or before use or copolymerized upon or before use.

The non-liquid-crystalline binder polymer is preferably an acrylic polymer (an acrylic copolymer or a resin containing an acrylic copolymer as a backbone. Particularly preferably, the non-liquid-crystalline binder polymer is soluble to an organic solvent.

The acrylic polymer may be produced by, for example, a known radial polymerization method. In this case, the polymerization conditions (e.g., temperature, pressure, the type and amount of a radical initiator used, and the type of a solvent used) in the radical polymerization method can be easily set by those skilled in the art, or can be set experimentally.

Examples of copolymerization components of the acrylic polymer include unsaturated carboxylic acids (e.g., (meth)acrylic acid, crotonic acid, itaconic acid, maleic acid and fumaric acid), aromatic vinyl compounds (e.g., styrene, α-methylstyrene, vinyltoluene, 2-vinylpyridine, 4-vinylpyridine and N-vinylimidazole), (meth)acrylic acid alkyl esters (e.g., methyl(meth)acrylate, ethyl(meth)acrylate, n-butyl (meth)acrylate, i-butyl(meth)acrylate, hexyl (meth)acrylate, cyclohexyl(meth)acrylate and dodecyl(meth)acrylate), (meth)acrylic acid alkyl aryl esters (e.g., benzyl(meth)acrylate), (meth)acrylic acid-substituted alkyl esters (e.g., glycidyl(meth)acrylate and 2-hydroxyethyl (meth)acrylate), carboxylic acid vinyl esters (e.g., vinyl acetate and vinyl propionate), vinyl cyanides (e.g., (meth)acrylonitrile and α-chloroacrylonitrile) and aliphatic conjugated dienes (e.g., 1,3-butadiene and isoprene), with unsaturated carboxylic acids, aromatic vinyl compounds, (meth)acrylic alkyl esters, (meth)acrylic alkyl aryl esters and carboxylic acid vinyl esters being particularly preferred. Here, the term "(meth) acrylic acid" collectively refers to acrylic acid and methacrylic acid. Similarly, the term "(meth)acrylate" collectively refers to acrylate and methacrylate.

Furthermore, preferably exemplified are acrylic polymers containing a (meth)acryloyl group in the side chain thereof, and acrylic graft polymers containing, as a copolymerization component, a macromonomer such as a polystyrene macromonomer, a polymethyl methacrylate macromonomer, a polyethylene glycol mono(meth)acrylate, polyethylene glycol mono(meth)acrylate and/or polyethylene glycol polyethylene glycol mono(meth)acrylate). These may be used individually or in combination.

—¼ Wavelength Layer—

The ¼ wavelength layer is not particularly limited, so long as it can adjust a difference in optical path between ordinary rays and extraordinary rays to ¼ of the wavelength of an incident light, and may be appropriately selected depending on the purpose.

The ¼ wavelength layer may be a film formed by horizontally orienting liquid crystal materials. In this film formation, the liquid crystal materials are preferably fixed through polymerization crosslinking or ion aggregation. Alternatively, the ¼ wavelength layer may be made of a material having birefringence anisotropy such as a uniaxially stretched polymer film. The polymer forming the film is not particularly limited, and may be a polyvinyl alcohol, a polycarbonate, a polysulfone, a cellulose resin, a norbornene resin or an olefin resin.

The phase difference between the fast axis and the slow axis in the ¼ wavelength layer is not particularly limited and may be appropriately determined depending on the intended purpose. In the case of light having a wavelength of 548.3 nm, the phase difference is preferably within 137 nm (i.e., $\lambda/4$)±45 nm, more preferably within 137 nm±30 nm, particularly preferably within 137 nm±15 nm.

Regarding the wavelength distribution of the ¼ wavelength layer, a wavelength difference in each wavelength is preferably $\lambda/4$. Ideally, Re (628.2) (nm) (i.e., a phase difference at a wavelength of 628.2 nm), Re (548.3) (nm) (i.e., a phase difference at a wavelength of 548.3 nm) and Re (480.4) (nm) (i.e., a phase difference at a wavelength of 480.4 nm) meet the following equations.

$$Re(628.2)\,(nm)/Re(548.3)\,(nm)=1.146$$

$$Re(480.4)\,(nm)/Re(548.3)\,(nm)=0.8762$$

Re (628.2) (nm)/Re (548.3) (nm) is preferably 0.6 or higher but lower than 1.6, more preferably 0.8 or higher but lower than 1.4, particularly preferably 1.0 or higher but lower than 1.2.

Re (480.4) (nm)/Re (548.3) (nm) is preferably 0.4 or higher but lower than 1.4, more preferably 0.6 or higher but lower than 1.2, particularly preferably 0.8 or higher but lower than 1.0.

The ¼ wavelength layer may also be formed by laminating a plurality of phase difference layers. Examples of such phase difference layers include a phase difference layer described in JP-A No. 2003-270435 and formed by laminating a $\lambda/2$ layer on a $\lambda/4$ layer to make suitable the wavelength distribution characteristics.

The angle formed between the slow axis of the ¼ wavelength layer and the transmission axis of the polarizing layer is preferably within 45°±15°, more preferably within 45°±10°, particularly preferably within 45°±5°.

Preferred examples of the films forming the ¼ wavelength layer include a film formed by laminating a $\lambda/2$ layer on a $\lambda/4$ layer described in JP-A No. 2003-270435, polyester films described in JP-A Nos. 2007-4143 and 2007-112980, polycarbonate films described in JP-A No. 2005-156685 and JP-B No. 3325560, cellulose acetate films described in JP-A Nos. 2000-137116 and 2002-98837, and polyester films described in JP-A Nos. 2009-86651 and 2002-98648.

<Selective Reflection Layer>

The color filter in accordance with a second embodiment of the present invention has a circularly polarizing layer and a selective reflection layer which are formed in the optical path of white light emitted from a light-emitting display element.

In the present invention, the selective reflection layer (which selectively reflects a circularly polarized light) must be adjusted and disposed so that it has a selective reflection central wavelength in response to the wavelength of color light emitted from each pixel of the light-emitting display element. Examples of liquid crystal phases which selectively reflect a circularly polarized light include a chiral smectic liquid crystal phase and a cholesteric liquid crystal phase both of which have a helix structure. Liquid crystal compounds showing a cholesteric liquid crystal phase or chiral smectic liquid crystal phase can be formed by mixing a non-chiral liquid crystal compound with a chiral compound. Alternatively, these compounds are co-polymerized to form a polymeric liquid crystal.

The central wavelength $\lambda$ of the selective reflection band depends on the pitch length P (=period of the helix) of the helix structure of the cholesteric phase or the chiral smectic phase, and satisfies the relationship $\lambda=n\times P$, where n denotes an average refractive index of the selective reflection layer. Thus, by adjusting the pitch length of the helix structure, the wavelength of light selectively reflected can be adjusted. The pitch length depends on the type of the chiral compound contained in the liquid crystal composition and/or the concentration of the chiral compound contained therein. Therefore, by appropriately selecting the chiral compound and adjusting the concentration thereof, a desired pitch length can be obtained. Also, regarding the half-value width of the selective reflection band, $\Delta\lambda$ depends on the pitch length P and the birefringence $\Delta n$ of the liquid crystal compound and satisfies the relationship $\Delta\lambda=\Delta n\times P$. Thus, the width of the selective reflection band can be controlled by adjusting $\Delta n$. Here, $\Delta n$ can be adjusted by appropriately selecting the type of the liquid crystal and controlling the temperature during fixing of oriented liquid crystal compounds.

Next, description will be given with respect to the material for the selective reflection layer and a method for forming the selective reflection layer.

The selective reflection layer can be formed by fixing a cholesteric liquid crystal composition containing a liquid crystal compound, a chiral compound, optional other additives (a polymerization initiator, a crosslinking agent and a surfactant) and any other components.

—Liquid Crystal Compound—

The liquid crystal compound is preferably a low-molecular-weight liquid crystal compound and a high-molecular-weight liquid crystal compound. The liquid crystal compound is more preferably a low-molecular-weight liquid crystal compound, since the time required for orientation is short and highly uniform orientation can be achieved.

The liquid crystal compound preferably has a polymerizable group, more preferably shows a nematic phase or chiral smectic phase. In addition, the molecular shape thereof is preferably discotic or rod-like. In terms of productivity, the molecular shape is more preferably rod-like. In the case where it is important to reduce angle dependency of the width of selective reflection, the molecular shape is more preferably discotic. Rod-like nematic liquid crystal compounds having no polymerizable group are described in various literatures (for example, Y. Goto et. al., Mol. Cryst. Liq. Cryst. 1995, Vol. 260, pp. 23-28).

The polymerizable group is not particularly limited, and can be introduced into a nematic liquid crystal compound by a known method. The polymerizable group is not particularly limited and may be appropriately selected depending on the intended purpose. Examples of the polymerizable group include an epoxy group, a thioepoxy group, an oxetane group, a thiethanyl group, an aziridinyl group, a pyrrole group, a fumarate group, a cinnamoyl group, an isocyanate group, an isothiocyanate group, an amino group, a hydroxyl group, a carboxyl group, an alkoxysilyl group, a mercapto group, a vinyl group, an allyl group, a mathacryl group and an acryl group. These groups may be used individually or in combination.

Preferably usable discotic compounds having the above polymerizable group(s) are described in JP-A Nos. 08-27284, 2001-100028 and 2006-76992. When two or more polymerizable nematic liquid crystal compounds are used in combination, precipitation of crystals can be prevented during coating and orienting, and the temperature required for orientation can be decreased.

—Cholesteric Liquid Crystal Composition and Chiral Compound—

The cholesteric liquid crystal composition can be obtained by, for example, mixing a polymerizable nematic liquid crystal compound with a chiral compound (optically active compound).

The chiral compound is not particularly limited and may be known compounds (e.g., compounds described in "Liquid Crystal Device Handbook," Chapter 3, Section 4-3, chira agents for TN and STN, p. 199, edited by Japan Society for the Promotion of Science, 142 Comittee, 1989), isosorbide or isomannide derivatives.

The chiral compound (optically active compound) has generally an asymmetric carbon. The chiral compound usable contains those having no asymmetric carbon like axially asymmetric compounds and planarily asymmetric compounds. Examples of the axially asymmetric compounds and planarily asymmetric compounds include binaphthyl, helicene, paracyclophane and derivatives thereof.

The chiral compound may have a polymerizable group. The chiral compound having a polymerizable group is polymerized with the polymerizable nematic liquid crystal compound, to thereby form a polymer having a nematic liquid crystalline repeating unit and an optically active structure. The polymerizable group of the optically active compound is preferably similar to the polymerizable group of the polymerizable nematic liquid crystal compound. Therefore, the polymerizable group of the optically active compound is also preferably unsaturated polymerizable groups, an epoxy group or an aziridinyl group, more preferably unsaturated polymerizable groups, still more preferably ethylenically unsaturated polymerizable groups.

The chiral agent preferably has a photoisomerizable group, since a desired pattern of reflection wavelengths can be formed, responding to the wavelength of light emitted from the pixels, through one process including coating, orienting, and irradiating with active rays through a photomask. The photoisomerizable group is preferably isomerizable moieties of photochromic compounds, an azo group, an azoxy group or a cinnamoyl group. Specifically, the compounds described in the following patent literatures can be employed: JP-A Nos. 2002-80478, 2002-80851, 2002-179668, 2002-179669, 2002-179670, 2002-179681, 2002-179682, 2002-338575, 2002-338668, 2003-313189 and 2003-313292.

The amount of the optically active compound is preferably 0.01 mol % to 200 mol %, more preferably 1 mol % to 30 mol %, with respect to the amount of the polymerizable nematic liquid crystal compound.

—Polymerization Initiator—

The cholesteric liquid crystal composition is preferably contains a polymerization initiator for initiating polymerization reaction. The polymerization reaction encompasses thermal polymerization using a thermal polymerization initiator and photo polymerization using a photo polymerization initiator. Of these, photo polymerization using a photo polymerization initiator is particularly preferred. The photo polymerization initiator is not particularly limited and may be appropriately selected depending on the intended purpose. Examples thereof include α-carbonyl compounds, acyloyn ethers, α-hydrocarbon-substituted aromatic acyloyn compounds, polynuclear compounds, combinations of triaryl imidazole dimers and p-amino phenyl ketone, oxadiazole compounds, halomethylated triazine compounds, halomethylated oxadiazole derivatives, imidazole derivatives, anthraquinone derivatives, benzanthrone derivatives, benzophenone derivatives, thioxanthone derivatives, acrydine derivatives, phenadine derivatives and oxime derivatives.

The amount of the photo polymerization initiator is preferably 0.01% by mass to 20% by mass, more preferably 0.5% by mass to 5% by mass, with respect to the solid content of the cholesteric liquid crystal composition.

—Crosslinking Agent—

Before polymerization, a crosslinking agent may optionally be incorporated into the composition, in order for a cured film to have improved film strength and improved durability. The crosslinking agent suitably usable is those causing curing reaction by the action of UV rays, heat, moisture, etc.

The crosslinking agent is not particularly limited and may be appropriately selected depending on the intended purpose. Examples thereof include polyfunctional acrylate compounds (e.g., trimethylolpropane tri(meth)acrylate and pentaerythritol tri(meth)acrylate), epoxy compounds (e.g., glycidyl(meth)acrylate and ethylene glycol diglycidyl ethers), aziridine compounds (e.g., 2,2-bishydroxymethylbutanol-tris[3-(1-aziridinyl)propionete] and 4,4-bis(ethyleneiminocarbonylamino)diphenylmethane), isocyanate compounds (e.g., hexamethylene diisocyanate and biuret-type isocyanate), polyoxazoline compounds containing an oxazoline group in the side chain thereof, and alkoxysilane compounds (e.g., vinyltrimethoxysilane and N-(2-aminoethyl)-3-aminopropyl trimethoxysilane). Also, in consideration of reactivity of the crosslinking agent used, a known catalyst may be used to improve productivity in addition to film strength and durability. These may be used individually or in combination.

The amount of the crosslinking agent is preferably 3% by mass to 20% by mass, more preferably 5% by mass to 15% by mass. When the amount of the crosslinking agent is less than 3% by mass, the crosslinking density may not be improved. When the amount of the crosslinking agent is more than 20% by mass, the stability of the formed selective reflection layer may be decreased.

—Surfactant—

A surfactant can be used to adjust the surface tension of a coating film obtained by coating a base film with a cholesteric liquid crystal composition containing the above polymerization initiator and the liquid crystal compound. As a result, a layer having a uniform thickness can be obtained.

The surfactant usable may be appropriately selected from those which do not impede orientation.

The surfactant suitably usable is, for example, nonionic surfactants containing siloxane and/or a fluorinated alkyl group as a hydrophobic moiety. The surfactant particularly suitably usable is oligomers having two or more hydrophobic moieties in one molecule thereof.

The surfactant may be commercially available products. Examples thereof include PF-151N, PF-636, PF-6320, PF-656, PF-6520, PF-3320, PF-651 and PF-652 (PolyFox) (these products are of OMNOVA Co.), FTX-209F, FTX-208G and FTX-204D (Ftergent) (these products are of NEOS CO., LTD.) and KH-40 (Surflon) (product of SEIMI CHEMICAL CO. LTD.). Other surfactants suitably usable are fluoride compounds described in paragraph [0087] of JP-A No. 2002-341126, and paragraphs [0064] to [0080] and [0092] to [0096] of JP-A No. 2005-99248.

The amount of the surfactant contained in the selective reflection layer is preferably 0.01% by mass to 1% by mass. When the amount of the surfactant is less than 0.01% by mass, the surface tension at the interface defined by air is not sufficiently decreased, potentially causing unfavorable orientation. When the amount of the surfactant is more than 1% by mass, the excessive surfactant form an ununiform structure at the side of the interface defined by air, potentially degrading uniform orientation.

—Method for Producing Selective Reflection Layer—

In a method for producing the selective reflection layer, the above polymerizable liquid crystal compound, the above polymerization initiator, the above chiral agent (optionally used), the above surfactant (optionally used), etc. are dissolved in a solvent to prepare a cholesteric liquid crystal composition; the thus-prepared cholesteric liquid crystal composition is applied onto a horizontally orientation film on a substrate, followed by drying; and the resultant coating film is irradiated with active rays for polymerizing the cholesteric liquid crystal composition, to thereby form a selective reflection layer in which the cholesteric liquid crystals are orderly oriented and fixed.

In the above method, irradiation of the active rays is performed through a photomask, and then the uncured portions of the resultant coating film on the substrate are washed (removed) with a solvent, whereby the selective reflection layer can be formed at desired positions only. This treatment is repeated in red, green and blue pixels, to thereby form a selective reflection layer responding to the wavelength of light emitted from each pixel.

—Solvent—

The solvent used for preparing the above cholesteric liquid crystal composition is not particularly limited and may be appropriately selected depending on the intended purpose. Organic solvents are preferably used.

The organic solvents are not particularly limited and may be appropriately selected depending on the intended purpose. Examples thereof include ketones, alkyl halides, amides, sulfoxides, heterocyclic compounds, hydrocarbons, esters and ethers. These solvents may be used individually or in combination. Among them, ketones are particularly preferred in consideration of environmental loads.

—Horizontally Orienting Film—

The horizontally orienting film may be formed by, for example, rubbing treatment of an organic compound or polymer (resins such as polyimides, polyvinyl alcohols, polyesters, polyarylates, polyamide-imides, polyetherimides, polyamides and modified polyamides), oblique deposition of an inorganic compound, formation of a layer having microgrooves, or accumulation of organic compounds (e.g., ω-tricosanoic acid, dioctadecylmethyl ammonium chloride and methyl stearate) by the Langmuir-Blodgett method (LB film). Furthermore, some known orienting films exhibit an orientation function through the application of an electrical or magnetic field, or through light irradiation. Among others, particularly preferred are orienting films formed by rubbing a polymer. The rubbing treatment can be performed by rubbing paper or cloth several times against a surface of a polymer layer in a certain direction.

—Coating—

The coating method for coating the orienting film with the cholesteric liquid crystal composition is not particularly limited and may be appropriately selected depending on the intended purpose. Examples thereof include a curtain coating method, an extrusion coating method, a direct gravure coating method, a die coating method, a spin coating method, a dip coating method, a spray coating method and a slide coating method. In one alternative method, a separately provided support is coated with the cholesteric liquid crystal composition, and the obtained coating is transferred onto the orienting film. The coated cholesteric liquid crystal composition is heated to orient the liquid crystal compounds. The heating temperature is preferably 200° C. or lower, more preferably 130° C. or lower. In an optical thin film obtained through this orienting treatment, rod-like polymerizable nematic liquid crystal compounds are twisted (oriented) so as to have a helix axis substantially perpendicular to a surface of the optical thin film.

—Fixing—

The oriented rod-like polymerizable nematic liquid crystal compounds are further polymerized. The polymerization is preferably photo polymerization through light irradiation, rather than thermal polymerization. The light irradiation is preferably UV ray irradiation. The dose of energy is preferably 20 mJ/cm$^2$ to 50 J/cm$^2$, more preferably 100 mJ/cm$^2$ to 1,500 mJ/cm$^2$. For promoting photo polymerization reaction, the light irradiation may be performed under heating and/or in a nitrogen atmosphere. The wavelength of the UV light irradiated is preferably 350 nm to 430 nm. The polymerization rate is preferably higher; i.e., 70% or higher, more preferably 80% or higher in terms of stability of the resultant product.

The polymerization rate can be determined by measuring the ratio of the polymerizable functional groups consumed using an IR absorption spectrum.

The thickness of the selective reflection layer (cholesteric oriented optical thin film) is preferably 0.1 µm to 50 µm, more preferably 0.5 µm to 10 µm, still more preferably 1.5 µm to 7 µm.

—Patterning Method—

By patterning the selective reflection layer whose selective reflection wavelength is adjusted in response to the wavelength of light emitted from each pixel in a display device, light-extraction efficiency can be further increased.

Examples of the patterning method include a method including developing with a solvent, a method using the above photoisomerizable chiral agent (JP-A No. 2001-159706), a method in which liquid crystal compounds are oriented/fixed in advance in a selective reflection layer, which is then transferred by a laser or a thermal head (JP-A Nos. 2001-4822 and 2001-4824), an inkjet method (JP-A No. 2001-159709), and a method utilizing the temperature dependency of the helix pitch of cholesteric liquid crystal compounds (JP-A No. 2001-159708). Using these methods, the composition is directly applied onto a substrate of a display device, followed by patterning. Alternatively, a selective reflection layer is formed and patterned on a separately provided support, and then is transferred in a display device.

—Orientation Control and Scattering Control—

By imparting a light scattering property to the selective reflection layer, the viewing angle of the display device can be enlarged or the light-extraction efficiency can be improved depending on the position at which the selective reflection layer is provided.

Examples of the method for imparting a light scattering property to the selective reflection layer include decreasing the temperature at which the oriented liquid crystal compounds are matured, shortening the time for maturing the oriented liquid crystal compounds, decreasing the concentration of a surface tension agent, using an orienting film undergone no rubbing, and using no orienting film.

<Filter Layer>

The color filter of the present invention includes a filter layer 18 which transmits light having a desired wavelength among lights emitted from the light-emitting display element. The shape of the filter layer 18 may be appropriately selected depending on the shape of the color filter. The structure of the filter layer 18 may be appropriately selected depending on the intended purpose, so long as the filter layer can transmit white light emitted from the light-emitting display element and emit light having a desired wavelength among lights emitted from the light-emitting display element. The filter layer may have a white filter portion 18w which transmits white light emitted from the light-emitting display element. The filter layer 18 may additionally have a blue filter portion 18b, a green filter portion 18g and a red filter portion 18r which respectively transmit blue light, green light and red light among lights emitted from the light-emitting display element.

<Other Members>

<<Support>>

The color filter of the present invention may have a support for the purpose of increasing the strength of the color filter. The support is not particularly limited, so long as it does not adversely affect the optical characteristics of the color filter. The support may be, for example, a transparent support which is optically inactive. Also, the support may be those having the functions of the above-described ¼ wavelength layer, in order for the support to change a linearly polarized light to a circularly polarized light. Use of such a support can simplify the structure of the color filter.

The material for the support may be appropriately selected depending on the above purpose. Examples thereof include inorganic materials such as glass and metal oxides; and organic materials excellent in resistance to an organic solvent, such as polyesters (e.g., polyethylene terephthalates and polyethylene naphthalates), polyolefins (e.g., polyethylenes and polypropylenes), polyamides, polyethers, polystyrenes, polyesteramides, polycarbonates, polyphenylene sulfides, polyether esters, polyvinyl chlorides, polyacrylic acid esters, polymethacrylic acid esters, polyether ketones and polyethylene fluorides. The thickness of the support is not particularly limited, so long as the support has a commonly used thickness, and may be appropriately determined depending on the intended purpose. For example, the thickness thereof is preferably 10 µm to 1 cm.

<<Layer Formed by Curing Transparent Resin (Transparent-Resin-Cured Layer)>>

In the present invention, in order to impart physical strength, durability or optical characteristics to the polarizing layer, a transparent-resin-cured layer is preferably formed on a surface of the polarizing layer. The thickness of the transparent-resin-cured layer is preferably 1 µm to 30 µm, more preferably 1 µm to 10 µm.

As described below, the transparent-resin-cured layer is preferably formed through polymerization reaction or crosslinking reaction of an ionizing radiation curable compound. The transparent-resin-cured layer in the present invention can be formed as follows. Specifically, a surface of the polarizing layer is coated with a coating composition containing an ionizing radiation curable polyfunctional monomer or oligomer, and the polyfunctional monomer or oligomer is crosslinked or polymerized.

The ionizing radiation curable polyfunctional monomer or oligomer preferably contains a functional group which is polymerizable with light, electron beams or radiation. In particular, the ionizing radiation curable polyfunctional monomer or oligomer contains a photo-polymerizable functional group.

Examples of the photo-polymerizable functional group include unsaturated polymerizable functional groups such as a (meth)acryloyl group, a vinyl group, a styryl group and allyl group, with a (meth)acryloyl group being preferred. Also, inorganic microparticles may be incorporated into the ionizing radiation curable polyfunctional monomer or oligomer.

Specific examples of the photo-polymerizable polyfunctional monomer having a photo-polymerizable functional group include (meth)acrylic acid diesters of alkylene glycols, such as neopentyl glycol acrylate, 1,6-hexanediol (meth)acrylate and propylene glycol di(meth)acrylate; (meth)acrylic acid diesters of polyoxyalkylene glycols, such as triethylene glycol di(meth)acrylate, dipropylene glycol di(meth)acrylate, polyethylene glycol di(meth)acrylate and polyethylene glycol di(meth)acrylate; (meth)acrylic acid diesters of polyhydric alcohols, such as pentaerythritol di(meth)acrylate; and (meth)acrylic acid diesters of ethylene or propylene oxide adducts, such as 2,2-bis{4-(acryloxy-diethoxy)phenyl}propane and 2-2-bis{4-(acryloxy-polypropoxy)phenyl}propane.

In addition, epoxy(meth)acrylates, urethane (meth)acrylates and polyester (meth)acrylates are exemplified as preferred photo-polymerizable polyfunctional monomers. Among them, esters of polyhydric alcohols and (meth)acrylic acid are preferred. More preferred are polyfunctional monomers having three or more (meth)acryloly groups in one molecule thereof. Specific examples thereof include trimethylolpropane tri(meth)acrylate, trimethylolethane tri(meth)acrylate, 1,2,4-cyclohexane tetra(meth)acrylate, pentaglycerol triacrylate, pentaerythritol tetra(meth)acrylate, pentaerythritol tri(meth)acrylate, dipentaerythritol triacrylate, dipentaerythritol pentaacrylate, dipentaerythritol tetra(meth)acrylate, dipentaerythritol hexa(meth)acrylate, tripentaerythritol triacrylate and tripentaerythritol hexatriacrylate. The polyfunctional monomers may be used in combination.

[Polymerization Initiator]

The polymerization initiator used for forming the above transparent-resin-cured layer is preferably a photo-polymerization initiator. The photo-polymerization initiator is preferably a photo-radical polymerization initiator and a photocation polymerization initiator, more preferably a photo-radical polymerization initiator.

Examples of the photo-radical polymerization initiator include acetophenones, benzophenones, Michler's benzoyl benzoate, α-amyloxime ester, tetramethylthiuram monosulfide and thioxanthone.

Examples of commercially available photo-radical polymerization initiators include KAYACURE (DETX-S, BP-100, BDMK, CTX, BMS, 2-EAQ, ABQ, CPTX, EPD, ITX, QTX, BTC, MCA, etc. (trade name)) (product of NIPPON KAYAKU Co., Ltd.), Irgacure (651, 184, 127, 500, 907, 369, 1173, 2959, 4265, 4263, etc. (trade name)) (product of Ciba Specialty Chemicals Co., Ltd.) and Esacure (KIP100F, KB1, EB3, BP, X33, KT046, KT37, KIP150, TZT, etc. (trade name)) (product of Sartomer Company Inc.).

In particular, a photo-cleavable photo-radical polymerization initiator is preferred. The photo-cleavable photo-radical polymerization initiator is described in "SAISHIN UV KOUKA GIJUTSU (New UV Curing Technology)" (p. 159, Kazuhiro TAKABO in 1991; published from Technical Information Institute Co., Ltd.).

Examples of commercially available photo-cleavable photo-radical polymerization initiator include Irgacure (651, 184, 127 and 907 (trade name)) of Ciba Specialty Chemicals Co., Ltd.

The amount of the photo-polymerization initiator used is preferably 0.1 parts by mass to 15 parts by mass, more preferably 1 part by mass to 10 parts by mass, per 100 parts by mass of the curable resin used for forming the transparent-resin-cured layer.

In addition to the photo-polymerization initiator, a photo-sensitizer may be used. Examples of the photosensitizer include n-butylamine, triethylamine, tri-n-butylphosphine, Michler's ketone and thioxathone. Examples of commercially available photosensitizers include KAYACURE (DMBI and EPA (trade name)) of NIPPON KAYAKU Co., Ltd.

The photo-polymerization reaction (curing reaction) is preferably performed using UV rays after a high-refractive-index layer has been formed and dried.

In order to impart brittleness to the transparent-resin-cured layer, an oligomer or polymer having a weight average molecular weight of 500 or higher, or both of the oligomer and the polymer may be added to the transparent-resin-cured layer.

The oligomer or polymer is not particularly limited and may be appropriately selected depending on the intended purpose. Examples thereof include (meth)acrylate-based polymers, cellulose-based polymers, styrene-based polymers, urethane acrylates and polyester acrylates. Preferred are poly(glycidyl(meth)acrylates) and poly(allyl(meth)acrylates) each having a functional group in the side chain thereof.

The total amount of the oligomer and polymer contained in the transparent-resin-cured layer is preferably 5% by mass to 80% by mass, more preferably 25% by mass to 70% by mass, still more preferably 35% by mass to 65% by mass, with respect to the total mass of the layer.

The strength of the transparent-resin-cured layer is preferably H or harder as measured by the pencil hardness test according to JIS K5400, more preferably 2H or harder, most preferably 3H or harder. Also, the abrasion amount of a test piece of the transparent-resin-cured layer is preferably smaller after the taber test according to JIS K5400.

When the transparent-resin-cured layer is formed through crosslinking reaction or polymerization reaction of the ionizing radiation curable compound, the crosslinking reaction or polymerization reaction is preferably performed in an atmosphere whose oxygen concentration is 10% by volume or lower. By forming the transparent-resin-cured layer in an atmosphere whose oxygen concentration is 10% by volume or lower, the formed transparent-resin-cured layer has excellent physical strength and durability, which is preferred.

The crosslinking reaction or polymerization reaction of the ionizing radiation curable compound is preferably performed in an atmosphere whose oxygen concentration is 6% by volume or lower, more preferably 4% by volume or lower, particularly preferably 2% by volume or lower, most preferably 1% by volume or lower.

The method for adjusting the oxygen concentration to 10% by volume or lower is preferably substituting the atmosphere (nitrogen concentration: about 79% by volume, oxygen concentration: about 21% by volume) with another gas, particularly preferably with nitrogen (nitrogen purging).

The transparent-resin-cured layer is preferably formed by coating a surface of a light-absorbable anisotropic layer with a coating composition for forming the transparent-resin-cured layer.

Also, functions such as optical anisotropy (e.g., $\lambda/4$) may be newly imparted to the transparent-resin-cured layer.

—Production Method of Color Filter—

A method for producing the color filter is not particularly limited, so long as the method can produce a color filter having the above-described structure, and may be appropriately selected depending on the intended purpose. In one employable method, as illustrated in FIGS. 5 and 6, the ¼ wavelength layer 14 is laminated on the filter layer 18 on the support 22 or laminated on the support 22 on the filter layer 18, which is composed of the white filter portion 18w, the red filter portion 18r, the green filter portion 18g and the blue filter portion 18b, and then the polarizing layer 12 is properly laminated only in the optical path through which white light travels. In another employable method, as illustrated in FIG. 7, the ¼ wavelength layer 14 is laminated on the filter layer 18, and then the polarizing layer 12 is properly laminated only in the optical path through which white light travels. In still another employable method, as illustrated in FIGS. 8 and 9, the ¼ wavelength layer 14 and the polarizing layer 12 are laminated on the filter layer 18 on the support 22 or the support 22 on the filter layer 18 so that these layers are formed only in the optical path through which white light travels. In yet another employable method, the support 22, the ¼ wavelength layer 14 and the filter layer 18 are laminated, and then the polarizing layer 12 is formed only in the optical path through which white light travels.

The proper method for laminating the polarizing layer 12 and/or the ¼ wavelength layer 14 is not particularly limited, so long as the above-described layer structure can be obtained, and may be appropriately selected depending on the intended purpose. In one employable method, the polarizing layer 12 and/or the ¼ wavelength layer 14 is cut so as to have such a slit shape that is disposed in the optical path of white light emitted from the light-emitting display element, and then the patterned layer is disposed in the optical path of white light emitted from the light-emitting display element. In another employable method, the polarizing layer 12 and/or the ¼ wavelength layer 14 is patterned so as to have such a shape that is disposed in the optical path of white light emitted from the light-emitting display element, and then the cut layer is disposed in the optical path of white light. In still another employable method, the polarizing layer 12 and/or the ¼ wavelength layer 14 is disposed by an imprint method through patterning using a wire grid. In yet another employable method, an orientation layer is disposed at a position where the polarizing layer 12 and/or the ¼ wavelength layer 14 is to be formed, and a dichroic dye or other materials for the polarizing layer 12 and/or the ¼ wavelength layer 14 is applied to the orientation layer by, for example, an inkjet method. In even another employable method, a photo-orientable orientation film is provided at a position corresponding to the white filter portion 18w of the filter layer 18, followed by photo-orientating, and liquid crystal materials are directly injected and oriented so as to have properties of the polarizing layer 12 and/or the ¼ wavelength layer 14.

—Method for Forming Orientation Layer—

The method for forming the orientation layer is not particularly limited, so long as a desired orientation can be given to the liquid crystal compound layer containing the liquid crystal compounds, and may be appropriately selected depending on the intended purpose. The orientation layer can be formed by, for example, rubbing treatment of an organic compound (preferably a polymer), oblique deposition of an inorganic compound, formation of a layer having micro-grooves, or accumulation of organic compounds (e.g., ω-tricosanoic acid, dioctadecylmethyl ammonium chloride and methyl stearate) by the Langmuir-Blodgett method (LB film). Alternatively, the orientation layer may be treated through the application of an electrical or magnetic field, or through light irradiation so as to have an orientation function. In particular, in the present invention, from the viewpoint of easily controlling the pretilt angle of the orientation layer, the orientation layer is preferably formed through rubbing treatment. Meanwhile, from the viewpoint of obtaining uniform orientation, the orientation layer is preferably a photo-orientable orientation layer formed through light irradiation. In general, the rubbing treatment can be performed by rubbing paper or cloth against a surface of a polymer layer several times in a certain direction. In particular, in the present invention, the rubbing treatment is preferably performed by the method described in "Handbook of Liquid Crystals" (published by Maruzen Company, Limited, Oct. 30, 2000).

The thickness of the orientation layer is preferably 0.01 μm to 10 μm, more preferably 0.01 μm to 1 μm.

—Production Method for Polarizing Layer (Part 1)—

The production method for the polarizing layer in the present invention is not particularly limited, so long as the above-described structure can be obtained, and may be appropriately selected depending on the intended purpose. In particular, the production method may include the following steps [1] to [3].

[1] Rubbing and light-irradiating a substrate or color filter directly, or an orientation layer formed on the substrate or color filter (hereinafter this step is referred to as an "orientation layer treatment step")

[2] Coating the substrate, color filter or orientation layer with a liquid crystal compound layer-forming composition prepared using an organic solvent (hereinafter this step is referred to as a "coating step")

[3] Evaporating the organic solvent to orient the liquid crystal compounds, to thereby form a polarizing layer containing the orientation layer and the liquid crystal compound layer (hereinafter this step is referred to as a "dry orientation step")

Referring now to steps [1] to [3], the production method for the polarizing layer will be described.

[1] Orientation Layer Treatment Step

The orientation layer treatment step is a step of rubbing and light-irradiating a substrate or color filter directly, or rubbing and light-irradiating an orientation layer formed on the substrate or color filter. In this step, the rubbing treatment, to which the substrate, color filter or orientation layer formed on the substrate is subjected, is a treatment including rubbing buff such as dry cotton against a surface of the substrate, etc. in a certain direction to form parallel fine grooves in that direction, and applying dyes onto the rubbed surface (oriented grooves) to finally adsorb the dyes on the surface at the oriented state.

The rubbing density can be changed by the method described in "Handbook of Liquid Crystals" (published by Maruzen Company, Limited). The rubbing density (L) is calculated by the following equation (A).

$$L = Nl(1+2\pi rn/60v)$$ Equation (A)

In Equation (A), N denotes the number of rubbing, l denotes the contact length of a rubbing roller, r denotes the radius of the roller, n denotes the number of rotation of the roller (rpm) and v denotes the moving speed of a stage (per second).

The rubbing density can be increased by increasing the number of rubbing, the contact length of a rubbing roller, the radius of the roller or the number of rotation of the roller or by decreasing the moving speed of a stage. While, the rubbing density can be decreased by decreasing the number of rubbing, the contact length of a rubbing roller, the radius of the roller or the number of rotation of the roller or by increasing the moving speed of a stage.

Regarding the relationship between the rubbing density and the pretilt angle of the orientation layer, the pretilt angle becomes smaller with increasing of the rubbing density, while the pretilt angle becomes greater with decreasing of the rubbing density.

Also, in the light irradiation of this step, the photo-orientable layer formed on the substrate or color filter is irradiated with a linearly polarized light or non-polarized light to produce a photo-orientation layer.

The irradiation of the linearly polarized light is performed to cause light reaction in the photo-orientable material. The wavelength of light used depends on the type of the photo-orientable material used, and is not particularly limited so long as the wavelength is sufficient to cause the light reaction. Preferably, the light used for light irradiation has a peak wavelength of 200 nm to 700 nm. More preferably, the light is ultraviolet light having a peak wavelength of 400 nm or lower.

The light source used for light irradiation is not particularly limited and may be appropriately selected depending on the intended purpose. Examples thereof include commonly used light sources such as lamps (e.g., tungsten lamps, halogen lamps, xenon lamps, xenon flash lamps, mercury lamps, mercury xenon lamps and carbon arc lamps), various lasers (e.g., laser diodes, helium-neon lasers, argon ion lasers, helium cadmium lasers and YAG lasers), light-emitting diodes and cathode-ray tubes.

Examples of the method usable for obtaining a linearly polarized light include a method of using a polarizing plate (e.g., an iodine polarizing plate, a dichroic dye polarizing plate and a wire grid polarizing plate), a method of using a prism device (for example, a Glan-Thomson prism) or a reflection-type polarizing layer utilizing Brewster angle, and a method of using a light emitted from a laser light source and having polarization. Further, the photo-orientable layer may be selectively irradiated with only a light having a necessary wavelength using a filter or a wavelength-converting element.

When a linearly polarized light is employed, the orientable layer may be irradiated with the light from either the upper or rear surface either perpendicularly or at an oblique angle. The incident angle of the light varies depending on the type of the photo-orientable material. For example, the incident angle is preferably 0° to 90° (vertical), more preferably 40° to 90°. When a non-polarized light is employed, the orientation layer is irradiated with the light at an oblique angle. In this case, the incident angle of the light is preferably 10° to 80°, preferably 20° to 60°, particularly preferably 30° to 50°. The irradiation time is preferably 1 min to 60 min, more preferably 1 min to 10 min.

If necessary, the orientation layer can be patterned by performing light irradiation necessary times for patterning or by laser scanning for writing of the pattern.

[2] Coating Step

The coating step is a step of coating the oriented substrate, color filter or orientation layer with a liquid crystal compound layer-forming composition prepared using an organic solvent.

[Coating Solvent]

The liquid crystal compound layer in the present invention is formed using a coating liquid of the composition used for forming the liquid crystal compound layer. The solvent used for preparing the coating liquid is preferably an organic solvent. Examples of the organic solvent include amides (e.g., N,N-dimethylformamide), sulfoxides (e.g., dimethylsulfoxide), heterocyclic compounds (e.g., pyridine), hydrocarbons (e.g., benzene, toluene and hexane), alkyl halides (e.g., chloroform and dichloromethane), esters (e.g., methyl acetate and butyl acetate), ketones (e.g., acetone and methyl ethyl ketone) and ethers (e.g., tetrahydrofuran and 1,2-dimethoxyethane), with hydrocarbons, alkyl halides and ketones being preferred. These organic solvents may be used in combination.

[Coating Method]

The liquid crystal compound layer in the present invention is preferably formed by a wet film forming method. Specific examples of the wet film forming method include known methods described in, for example, "Coating Engineering" (edited by Yuuji Harasaki, published from Asakura Publishing Co., Ltd., Mar. 20, 1971, pp. 253 to 277), and "*Bunshi Kyoucho Zairyo no Sousei to Ouyo* (Creation and Application of Molecular Collaborative Materials)" (under the editorship of Kunihiro Ichimura, published from CMC Publishing Co., Ltd, Mar. 3, 1998, pp. 118 to 149). Alternatively, the coating liquid of the composition, which is used for forming the liquid crystal compound layer on a surface of the oriented substrate or orientation layer, may be applied by a commonly used method such as a spin coating method, a spray coating method, a slit coating method, a slit and spin method, a wire bar coating method, a roll coating method, a blade coating method, a free pass coating method, an extrusion method, a direct gravure coating method, a reverse gravure coating method, a die coating method or an inkjet method. Among them, in the present invention, a slit coating and an inkjet coating are preferred from the viewpoints of performing uniform orientation and increasing use efficiency of the composition.

The temperature at which the coating is performed is not particularly limited and may be appropriately determined depending on the intended purpose. The temperature is preferably 0° to 80°. The humidity is preferably about 10% RH to about 80% RH.

When the composition for forming the liquid crystal compound layer is applied onto a substrate by a wet film forming method, the substrate may be heated or cooled. Preferably, the temperature of the substrate is adjusted to 10° C. to 60° C. When the temperature is higher than the upper limit, the orientation of the liquid crystal compounds may be disturbed before drying under reduced pressure (described below in detail). When the temperature is lower than the lower limit, liquid droplets are formed on the substrate surface to impede coating potentially. The substrate may be heated in drying, under reduced pressure, the liquid crystal compound layer formed by the wet film forming method. In this case, the temperature of the substrate is preferably adjusted to 60° C. or lower. When the temperature is higher than the upper limit, the orientation of the liquid crystal compounds may be disturbed before drying under reduced pressure.

In the present invention, the liquid crystal compound layer may be formed by coating the unidirectionally-oriented substrate or orientation layer with the composition for forming the liquid crystal compound layer in a direction which is not parallel to the orientation direction of the substrate or orientation layer. Preferably, the composition for forming the liquid crystal compound layer is coated in a direction which is substantially parallel to a side of the substrate. As a result, the formed liquid crystal compound layer can have no defects in orientation and have high polarization degree. In addition, the productivity becomes high, since it is not necessary to cut out the substrate so as to obtain pieces having necessary polarization angles after the coating of the composition for forming the liquid crystal compound layer.

[3] Dry Orientation Step

The dry orientation step is a step of depositing the organic solvent (which is contained in the composition for forming the liquid crystal compound layer) to orient the liquid crystal compounds, to thereby form a polarizing layer containing the orientation layer and the liquid crystal compound layer. In this step, the temperature at which drying is performed is not particularly limited and may be appropriately determined depending on the intended purpose. Preferably, the coated product is naturally dried at room temperature. Also, preferably, the orientation state of the liquid crystal compounds coated is not disturbed (to avoid thermal relaxation). Notably, preferably, the solvent is evaporated by reduced pressure treatment and drying is performed at lower temperatures.

Here, the reduced pressure treatment is a treatment in which a substrate on which a coating liquid (coated film of the liquid crystal compound layer) has been applied is placed under reduced pressure to remove/evaporate the solvent thereof. In this treatment, the substrate, having the coated film of the liquid crystal compound layer, is preferably horizontally placed so that the coating liquid does not flow from higher portions to lower portions.

After coating, the interval between the reduced pressure treatment and the coating of the coating liquid for the liquid crystal compound layer is preferably shorter. Specifically, the interval is preferably 1 sec to 30 sec.

The reduced pressure treatment is performed, for example, as follows. Specifically, a coated film, which has been formed by coating a coating liquid of the liquid crystal compound layer, and a substrate, on which the coating liquid has been applied, are placed in an apparatus for reduced pressure treatment, followed by treating under reduced pressure. The apparatus for reduced pressure treatment may be for example, apparatuses illustrated in FIGS. 9 and 10 of JP-A No. 2006-201759. The apparatus for reduced pressure treatment is described in detail in JP-A No. 2004-169975.

Regarding the conditions for reduced pressure treatment, the upper limit of the pressure of the system in which the film of the polarizing layer is present is preferably $2\times10^4$ Pa, more preferably $1\times10^4$ Pa, particularly preferably $1\times10^3$ Pa. Also, the lower limit of the pressure of the system is preferably 1 Pa, more preferably $1\times10^1$ Pa. In general, preferably, the pressure of the system finally reaches the above-described value. When the pressure is higher than the upper limit, the film cannot be dried to potentially disturb orientation. When the pressure is lower than the lower limit, the film is dried too rapidly to potentially cause defects.

The time for reduced pressure treatment is preferably 5 sec to 180 sec. When the time is longer than the upper limit, the coated film of the liquid crystal compound layer cannot be dried rapidly before relaxation of the orientation, potentially disturbing the orientation. When the time is shorter than the lower limit, the coated film of the liquid crystal compound layer cannot be dried to potentially disturb the orientation.

The temperature of the system at the reduced pressure treatment is preferably 10° C. to 60° C. When the temperature is higher than the upper limit, convection occurs during drying to potentially form an ununiform coated film of the liquid crystal compound layer. When the temperature is lower than the lower limit, the coated film cannot be dried to potentially disturb the orientation.

When the dye composition is oriented after drying, the substrate may be heated to promote the orientation. In this case, the temperature of the substrate is preferably 50° C. to 200° C., particularly preferably 70° C. to 180° C. To decrease the temperature at which the orientation is performed, an additive such as a plasticizer may be added to the dye composition optionally.

[Orientation and Curing]

When the liquid crystal compound layer is formed from the composition for forming the liquid crystal compound layer, preferably, the liquid crystal compounds are oriented and then polymerized/cured through light irradiation (preferably UV ray irradiation), heating or both light irradiation and heating.

Through the above procedure, the polarizing layer in the present invention, containing the orientation layer and the liquid crystal compound layer, can be formed. In addition, the polarizing layer may be provided with a transparent-resin-cured layer, an adhesive layer, an anti-reflection layer, etc.

—Production Method of Polarizing Layer (Part 2)—

The production method of the polarizing layer is not particularly limited and may be appropriately selected depending on the intended purpose. In addition to the above-described method including the orientation layer treatment step, coating step and dry orientation step, the polarizing layer may be formed directly on a predetermined surface such as a color filter substrate, or a transfer material having the polarizing layer may be transferred onto a predetermined position of the color filter. In particular, when the polarizing layer is formed using the transfer material, the number of necessary steps can be reduced to simplify fabrication of a display device with good display performances.

The method for transferring the transfer material onto a predetermined position of the color filter is not particularly limited and may be appropriately selected depending on the intended purpose. For example, the below-described photosensitive layer surface of the below-described transfer material formed into a film may be attached to the substrate through bonding (under heating) with a laminater or a heated and/or pressurized roller or plate. Specifically exemplified are laminaters or laminating methods described in JP-A Nos. 07-110575, 11-77942, 2000-334836 and 2002-148794. From the viewpoint of reducing the amount of foreign matter, the method described in JP-A No. 07-110575 is preferably employed. After laminating, the support of the transfer material may be peeled off, and other layers (e.g., an electrode layer) may be formed on the exposed surface of the polarizing layer film.

The material onto which the transfer material is to be transferred is not particularly limited and may be appropriately selected depending on the intended purpose. Examples thereof include a transparent substrate, known glass plates (e.g., a soda glass plate having a silicon oxide film on a surface thereof, a low-expandable glass plate, a non-alkaline glass plate and a quartz glass plate) and plastic films. The material onto which the transfer material is to be transferred may be a transparent substrate having a color filter or other layers. Also, when the material onto which the transfer material is to be transferred is subjected to coupling treatment in advance, the adhesiveness of the material onto the photosensitive resin layer can be increased. The coupling agents suitably usable are described in JP-A No. 2000-39033.

Notably, an adhesive layer may be formed not on the polarizing layer but the material onto which the transfer material is to be transferred.

[Transfer Material]

The transfer material usable in the above-described transfer method is not particularly limited, so long as the polarizing layer or both the polarizing layer and the selective reflection layer can be formed, and may be appropriately selected depending on the intended purpose. For example, the transfer material contains at least a transfer support and the polarizing layer or both the polarizing layer and the selective reflection layer. Preferably, the transfer material additionally contains at least one photosensitive resin layer laminated on the polarizing layer. Even when the transfer material does not undergo patterning and relevant steps, provision of the photosensitive resin layer is useful since the photosensitive layer facilitates transfer of the polarizing layer. Between the support and the polarizing layer, there may be a layer for imparting unevenness-follow up properties or cushion properties (physical characteristics control) for absorbing unevenness of the target substrate during transfer; a layer serving as an orientation layer for controlling the orientation of dyes of the polarizing layer; or both of these layers. Furthermore, for the purpose of protecting the surface of the photosensitive resin layer, a peelable protecting layer may be formed on the uppermost surface.

[Support for Transfer (Transfer Support)]

The transfer support used for the transfer material is not particularly limited, so long as it has such a mechanical strength to be durable to transfer of the polarizing layer or both the polarizing layer and the selective reflection layer, and may be appropriately selected depending on the intended purpose. The transfer support may be transparent or opaque. Examples of polymers forming the transfer support include cellulose esters (e.g., cellulose acetate, cellulose propionate, cellulose butylate, cellulose acetate propionate and cellulose acetate butylate), polyolefines (e.g., norbornene polymers), poly(meth)acrylic acid esters (e.g., polymethyl methacrylates), polycarbonates, polyesters and polysulfones. In order to measure optical characteristics in the course of the production process, a transparent support made of a material with low birefringence is preferably used. In terms of low birefringence, cellulose esters and norbornene polymers are preferred. Commercially available norbornene polymers usable are, for example, ARTON (product of JSR Corporation) and ZEONEX and ZEONOR (these products are of ZEON CORPORATION). In addition, inexpensive materials such as polycarbonates and polyethylene terephthalates are also preferably used.

[Polarizing Layer]

The polarizing layer of the transfer material is not particularly limited, so long as it has the structure of the polarizing layer forming the color filter of the present invention, and may be appropriately selected depending on the intended purpose. The polarizing layer of the transfer material may be the polarizing layer in the above-described color filter. It is not necessary for the polarizing layer to have sufficient optical characteristics for polarizing performance. For example, after an exposure step performed in the course of transfer, the polarizing layer may show or change polarizing properties to finally have necessary polarizing properties for a polarizing film. In other words, the polarizing layer may be a polarizing layer whose polarizing property is improved through exposure or heating contained in the transfer step to become sufficient for a polarizing film.

[Selective Reflection Layer]

The selective reflection layer of the transfer material is not particularly limited, so long as it has the structure of the selective reflection layer forming the color filter of the present invention, and may be appropriately selected depending on the intended purpose. The selective reflection layer of the transfer material may be the selective reflection layer in the above-described color filter.

[Photosensitive Resin Layer]

The transfer material preferably contains a photosensitive resin layer from the viewpoints of increasing transferrability and adhesiveness. The photosensitive resin layer is made of a photosensitive resin composition. The photosensitive resin layer preferably contains at least (1) an alkaline-soluble resin, (2) a monomer or oligomer and (3) a photo-polymerization initiator or photo-polymerization initiator system.

(1) Alkaline-Soluble Resin

The alkaline-soluble resin (hereinafter may be referred to simply as a "binder") is not particularly limited and may be appropriately selected depending on the intended purpose. From the viewpoint of suitability to patterning, etc., preferred are polymers having in their side chain a polar group(s) such as a carboxylic acid group or carboxylic acid salt group. Examples thereof include methacrylic acid copolymers, acrylic acid copolymers, itaconic acid copolymers, chrotonic acid copolymers, maleic acid copolymers and partially esterified maleic acid copolymers described in JP-A Nos. 59-44615, JP-B Nos. 54-34327, 58-12577 and 54-25957, and JP-A Nos. 59-53836 and 59-71048. Further examples thereof include cellulose derivatives having a carboxylic acid group in their side chain, and hydroxyl group-containing polymers having cyclic acid anhydride added thereto. These can also be used suitably. Also, particularly preferred examples thereof include multi-copolymers of benzyl(meth)acrylate, (meth) acrylic acid and other monomers, and copolymers of benzy (meth)acrylate and (meth)acrylic acid described in U.S. Pat. No. 4,139,391. These (co)polymers may be used individually or in combination. Also, these may be used as a composition in combination with polymers commonly used for forming films. The amount of the alkaline-soluble resin is generally 20% by mass to 50% by mass, preferably 25% by mass to 45% by mass, with respect to the total solid content of the photosensitive resin composition.

(2) Monomer or Oligomer

The monomer or oligomer used in the photosensitive resin layer is not particularly limited and may be appropriately selected depending on the intended purpose. In terms of curability, preferably, the monomer or oligomer contains two or more ethylenically unsaturated double bonds and is addition polymerized through light irradiation. Examples of such monomer or oligomer include compounds having in the molecule thereof at least one addition-polymerizable ethylenically unsaturated group and having a boiling point of 100° C. or higher under normal pressure. Examples of the compounds include monofunctional (meth)acrylates (e.g., polyethylene glycol mono(meth)acrylate, polyethylene glycol mono (meth)acrylate and phenoxy ethyl(meth)acrylate), polyethylene glycol di(meth)acrylate, polyethylene glycol di(meth) acrylate, trimethylolethane triacrylate, trimethylolpropane tri (meth)acrylate, trimethylolpropane diacrylate, neopentyl glycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylolpropane tri(acryloyloxypropyl)ether, tri(acryloyloxyethyl)isocyanurate, tri (acryloyloxyethyl)cyanurate, glycerin tri(meth)acrylate, and polyfunctional (meth)acrylates (e.g., compounds formed by adding ethylene oxide or propylene oxide to polyfunctional alcohols (e.g., trimethylolpropane and glycerin) and treating them so as to have a moiety of (meth)acrylate).

Further examples thereof include urethane acrylates described in JP-B Nos. 48-41708 and 50-6034 and JP-A No. 51-37193, polyester acrylates described in JP-A No. 48-64183 and JP-B Nos. 49-43191 and 52-30490, and polyfunctional (meth)acrylates such as epoxy acrylates which are reaction products of an epoxy resin and (meth)acrylic acid.

Among them, preferred are trimethylolpropane tri(meth) acrylate, pentaerythritol tetra(meth)acrylate, dipentaerythritol hexa(meth)acrylate and dipentaerythritol penta(meth) acrylate.

In addition, "polymerizable compound B" described in JP-A No. 11-133600 can be suitably used.

These monomers or oligomers may be used individually or in combination. The amount of the monomers or oligomers is generally 5% by mass to 50% by mass, preferably 10% by mass to 40% by mass, with respect to the total solid content of the photosensitive resin composition.

(3) Photo-Polymerization Initiator or Photo-Polymerization Initiator System

The photo-polymerization initiator or photo-polymerization initiator system used in the photosensitive resin layer is not particularly limited and may be appropriately selected depending on the intended purpose. Examples thereof include vicinal polyketaldonyl compounds disclosed in U.S. Pat. No. 2,367,660, acyloinethers compounds described in U.S. Pat. No. 2,448,828, aromatic acyloin compounds substituted with α-hydrocarbon disclosed in U.S. Pat. No. 2,722, 512, polynuclear quinone compounds described in U.S. Pat. Nos. 3,046,127 and 2,951,758, combinations of p-aminoketone and triarylimidazole dimers described in U.S. Pat. No. 3,549,367, benzothiazole compounds and trihalomethyl-s-triazine compounds described in JP-B No. 51-48516, trihalomethyl-triazine compounds described in U.S. Pat. No. 4,239,850, and trihalomethyloxadiazole compounds described in U.S. Pat. No. 4,212,976. Particularly preferred are trihalomethyl-s-triazine, trihalomethyloxadiazole and triarylimidazole dimers.

In addition, "polymerizable compound C" described in JP-A No. 11-133600 can be suitably used.

These photo-polymerization initiators or photo-polymerization initiator systems may be used individually or in combination. In particular, two or more of them are preferably used. When at least two of the photo-polymerization initiators are used, display performance can be improved, especially display unevenness can be reduced.

The amount of the photo-polymerization initiator or photo-polymerization initiator system is generally 0.5% by mass to 20% by mass, preferably 1% by mass to 15% by mass, with respect to the total solid content of the photosensitive resin composition.

[Other Layers]

Between the support and the polarizing layer in the transfer material, a thermoplastic resin layer is preferably formed in order to control physical properties and unevenness follow up properties. The component used in the thermoplastic resin layer is not particularly limited and may be appropriately selected depending on the intended purpose. Organic polymer compounds described in JP-A No. 05-72724 are preferred. Also, the component is preferably selected from organic polymer compounds having a softening point of about 80° C. or lower as measured by the Vicat method (specifically, the measurement method for softening point of polymer, according to American Standard for Testing Materials ASTM D1235). Specific examples thereof include organic polymers such as polyolefins (e.g., polyethylene and polypropylene), ethylene copolymers of ethylene and vinyl acetate or saponificated products thereof, ethylene and acrylic acid esters or saponificated products thereof, vinyl chloride copolymers (e.g., polyvinyl chlorides, and vinyl chloride and vinyl acetate or saponificated products thereof), polyvinylidene chlorides, vinylidene chloride copolymers, polystyrenes, styrene copolymers (e.g., styrene and (meth) acrylic acid ester or saponificated products thereof), polyvinyl toluene, vinyl toluene copolymers (e.g., vinyl toluene and (meth)acrylic acid esters or saponificated products thereof), (meth)acrylic acid ester copolymers (e.g., poly(meth)acrylic acid esters and butyl(meth)acrylate and vinyl acetate), vinyl acetate copolymer nylon, a copolymerized nylon, N-alkoxymethylated nylon, and polyamide resins (e.g., N-dimethylaminated nylon).

In order to prevent the components from being mixed together during formation of a plurality of coating layers and storage after coating, an intermediate layer is preferably provided in the transfer material. The intermediate layer is not particularly limited and may be appropriately selected depending on the intended purpose. Preferably used are oxygen-shielding films (having the function of shielding oxygen) described as "separation layer" in JP-A No. 05-72724. When the intermediate layer is provided, the sensitivity upon exposure is increased to shorten the occupation time of an exposing device, leading to improvement in productivity. Preferably, the oxygen-shielding film exhibits low oxygen permeability, and can be dispersed or dissolved in water or an alkaline aqueous solution. The oxygen-shielding film may be appropriately selected from those known in the art. Particularly preferably are combinations of polyvinyl alcohols and polyvinyl pyrrolidones.

The thermoplastic resin layer and/or the intermediate layer may serve also as the orientation layer. In particular, polyvinyl alcohols and polyvinyl pyrrolidones, which are preferably used in the intermediate layer, are advantageously used also as the orientation layer. Thus, the intermediate layer and the orientation layer are preferably formed as one layer.

For the protection from stains or damage during storage, a thin protecting film is preferably formed on the resin layer. The protecting film may be made of a material which is the same as or similar to that of the temporary support. Alternatively, the protecting film may be made of a material which can be separated from the resin layer. The material for the protecting film is not particularly limited and may be appropriately selected depending on the intended purpose. Examples thereof include silicone paper sheets, polyolefins sheets and polytetrafluoroethylene sheets.

The polarizing layer, the selective reflection layer, the photosensitive resin layer, the orientation layer optionally formed, the thermoplastic resin layer optionally formed and the intermediate layer optionally formed can be formed by the coating method for the polarizing layer. Two or more of the layers may be formed simultaneously. The simultaneous coating method is described in U.S. Pat. Nos. 2,761,791, 2,941,898, 3,508,947 and 3,526,528 and "Coating Engineering" (edited by Yuuji Harasaki, published from Asakura Publishing Co., Ltd. (1973), p. 253).

—Method for Forming Transparent-Resin-Cured Layer—

The method for forming the transparent-resin-cured layer optionally provided in the present invention is not particularly limited and may be appropriately selected depending on the intended purpose. For example, the transparent-resin-cured layer can be formed, for example, as follows. Specifically, a coating liquid containing resin-forming materials such as the ionizing radiation curable compound (one exemplary material for forming the transparent-resin-cured layer) is applied by a known method, followed by curing.

[Coating Solvent]

The solvent used in the coating liquid containing the resin-forming materials is not particularly limited and may be appropriately selected depending on the intended purpose. For example, liquids having a boiling point of 60° C. to 170° C. are preferably used as the solvent, since they can be rapidly evaporated. Specific examples thereof include water, alcohols (e.g., methanol, ethanol, isopropanol, butanol and benzyl alcohol), ketones (e.g., acetone, methyl ethyl ketone, methyl isobutyl ketone and cyclohexanone), esters (e.g., methyl acetate, ethyl acetate, propyl acetate, butyl acetate, methyl formate, ethyl formate, propyl formate and butyl formate), aliphatic hydrocarbons (e.g., hexane and cyclohexane), halogenated hydrocarbon (e.g., methylene chloride, chloroform and carbon tetrachloride), aromatic hydrocarbons (e.g., benzene, toluene and xylene), amides (e.g., dimethylformamide, dimethylacetamide and n-methylpyrrolidone), ethers (e.g., diethyl ether, dioxane and tetrahydrofuran) and ether alcohols (e.g., 1-methoxy-2-propanol), with toluene, xylene, methyl ethyl ketone, methyl isobutyl ketone, cyclohexanone, ethanol and butanol being preferred, with methyl ethyl ketone, methyl isobutyl ketone, cyclohexanone and ethanol being more preferred.

The amount of the coating solvent used is adjusted so that the solid content of the coating liquid containing the resin-forming materials is 2% by mass to 50% by mass, more preferably 3% by mass to 40% by mass.

[Coating Method]

The method for coating the coating liquid containing the resin-forming materials is not particularly limited and may be appropriately selected depending on the intended purpose. Examples thereof include the above-exemplified coating methods for the composition for forming the liquid crystal compound layer, that is, wet film forming methods such as a spin coating method, a spray coating method, a slit coating method, a slit and spin method, a wire bar coating method, a roll coating method, a blade coating method, a free pass coating method, an extrusion method, a direct gravure coating method, a reverse gravure coating method, a die coating method or an inkjet method.

[Curing]

The method for curing the coating liquid containing the resin-forming materials is not particularly limited and may be appropriately selected depending on the intended purpose. For example, when the transparent-resin-cured layer is formed, curing is preferably performed through UV ray irradiation in terms of rapid curing.

(Light-Emitting Display Element)

A light-emitting display element of the present invention includes the color filter of the present invention and a light-emitting layer which emits at least white light; and, if necessary, includes other members.

Figure 20:
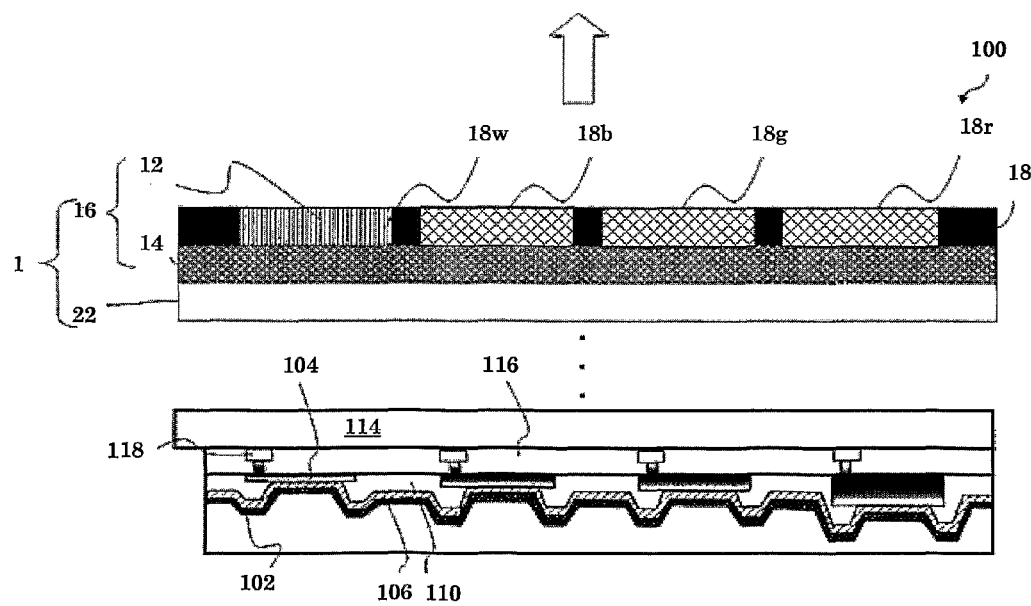
FIG. 20 is a cross-sectional view of one example of a light-emitting display element of the present invention.
Figure 21:
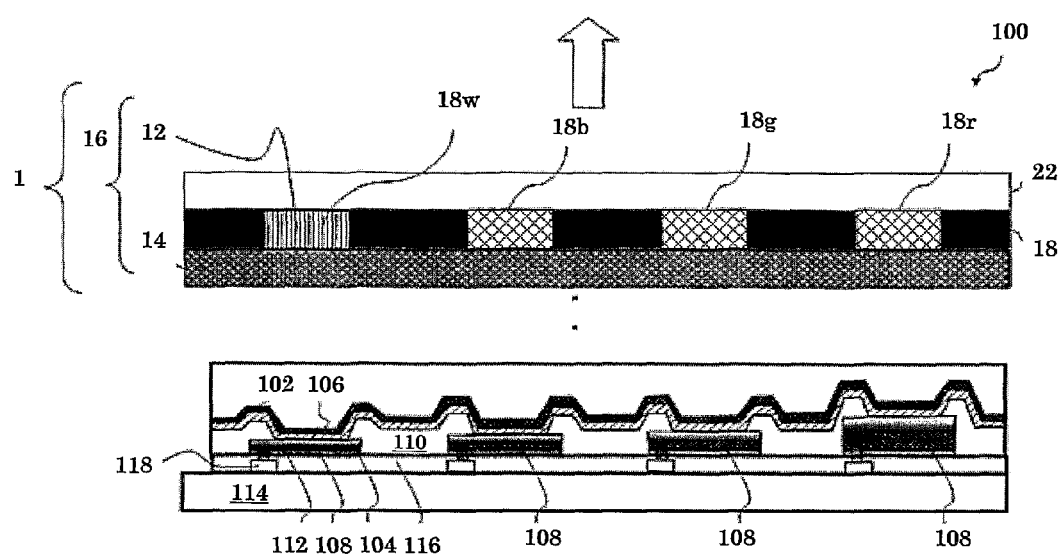
FIG. 21 is a cross-sectional view of another example of a light-emitting display element of the present invention.
Figure 22:
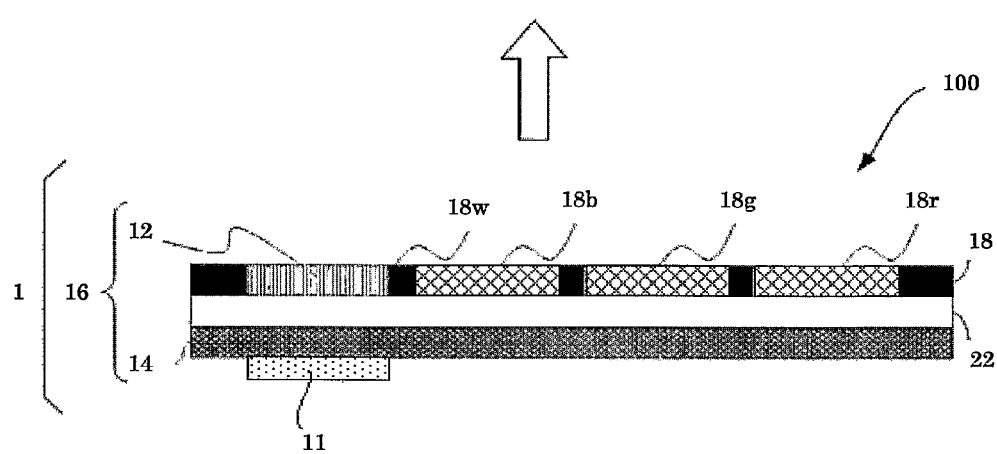
FIG. 22 is a cross-sectional view of still another example of a light-emitting display element of the present invention.
Figure 22:
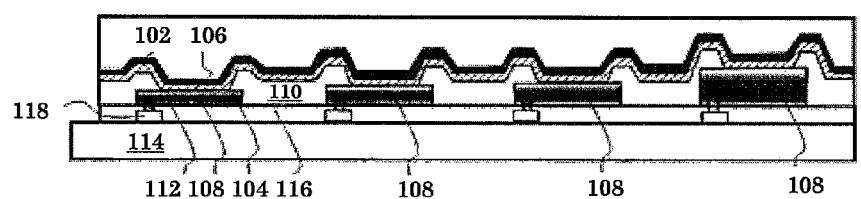

Each of FIGS. 20, 21 and 22 is a cross-sectional view of one embodiment of the light-emitting display element of the present invention. A light-emitting display element 100 includes the above-described color filter 1 of the present invention, and a light-emitting layer 106 emitting at least white light and disposed between a pair of electrodes (a cathode 102 and an anode 104). Notably, in FIGS. 20, 21 and 22, each arrow indicates a direction in which light is emitted from the light-emitting layer 106. In FIGS. 20, 21 and 22, the space between the color filter 1 and a substrate 114 or the cathode 102 means that a layer structure in the space is not particularly limited and, if necessary, appropriate members may be disposed in the space.

The light-emitting display element of the present invention may have a structure of a light resonator (light resonance structure) in which light emitted from the light-emitting layer is optically resonated as a result of repetitive reflection/interference. The light resonance structure is not particularly limited, so long as light emitted from the light-emitting layer can be repeatedly reflected/interfered, and may be appropriately selected depending on the intended purpose. For example, in the light-emitting display element 100 illustrated in FIGS. 20, 21 and 22, a semi-transparent cathode 102, a light-emitting layer 106 and a reflective layer 112 are provided between the color filter 1 and a flattening layer 116 so that the semi-transparent cathode, the light-emitting layer and the reflective layer are disposed in this order from the side of the color filter 1, to thereby form a light resonance structure between the cathode 102 and the reflective layer 112. With this structure, the color intensity is increased by virtue of multiplex interference. Thus, provision of this structure enables the light-emitting display element to exhibit high light intensity. Notably, in the light-emitting display element 100 illustrated in FIGS. 20, 21 and 22, reference numeral 114 denotes a substrate such as a glass substrate, reference numeral 108 denotes an optical path length adjusting layer which adjusts the optical path length in each pixel, reference numeral 110 denotes an insulative layer which electrically insulates each pixel, and reference numeral 118 denotes a TFT.

<Light-Emitting Layer>

In the present invention, the light-emitting layer is not particularly limited, so long as it emits white light when an electrical field is applied, and may be appropriately selected depending on the intended purpose. The structure of the light-emitting layer is not particularly limited, so long as the light-emitting layer emits white light. The light-emitting layer may have layers all of which emit white light. Alternatively, the light-emitting layer may have layers emitting white light and layers emitting blue light, green light and/or red light. Notably, the light-emitting display device illustrated in FIG. 20 contains a single light-emitting layer, but the present invention encompasses light-emitting display devices containing layers emitting white, blue, green and red lights disposed along the light-emitted surface of the light-emitting layer.

The relationship in position between the light-emitting layer and the color filter is not particularly limited, so long as the circularly polarizing layer is disposed only in the optical path of white light emitted from the light-emitting layer, and may be appropriately determined depending on the intended purpose. When all the light-emitting layers emit white light, the circularly polarizing layer 16 of the color filter 1 may be disposed above the light-emitting layer, since white light is emitted from the entire light-emitted surface of the light-emitting layers. In the case where the layer emitting white light as well as the layer(s) emitting blue light, green light and/or red light are provided along the light-emitted surface of the light-emitting layer, the circularly polarizing layer may be formed in the optical path of white light emitted from the light-emitting layer.

The material for the light-emitting layer may be an organic light-emitting material or an inorganic light-emitting material. In particular, an organic light-emitting material is preferred, since color hue can be variously selected and drive voltage is low. Next, description will be given with respect to an organic compound layer having a light-emitting layer made of an organic light-emitting material.

—Organic Compound Layer—

As a lamination pattern of the organic compound layer, preferably, a hole-transport layer, an organic light-emitting layer and an electron transport layer are laminated in this order from the anode side. Moreover, a hole-injection layer is provided between the hole-transport layer and the cathode, and/or an electron-transportable intermediate layer is provided between the organic light-emitting layer and the electron transport layer. Also, a hole-transportable intermediate layer may be provided between the organic light-emitting layer and the hole-transport layer. Similarly, an electron-injection layer may be provided between the cathode and the electron-transport layer. Notably, each layer may be composed of a plurality of secondary layers.

The organic light-emitting layer corresponds to the light-emitting layer, and the anode, the cathode and the other layers than the organic light-emitting layer correspond to the above other layers.

The layers constituting the organic compound layer can be suitably formed by any of a dry film-forming method (e.g., a vapor deposition method and a sputtering method), a transfer method, a printing method, a coating method, an ink-jet method and a spray method.

The light-emitting display element of the present invention includes at least one organic compound layer including an organic light-emitting layer. Examples of the other organic compound layers than the organic light-emitting layer include a hole-transport layer, an electron transport layer, a hole blocking layer, an electron blocking layer, a hole injection layer and an electron injection layer.

In the light-emitting display element of the present invention, the layers constituting the organic compound layer can be suitably formed by any of a dry film-forming method (e.g., a vapor deposition method and a sputtering method), a wet film-forming method, a transfer method, a printing method and an ink-jet method.

—Organic Light-Emitting Layer—

The organic light-emitting layer is a layer having the functions of receiving holes from the anode, the hole injection layer, or the hole-transport layer, and receiving electrons from the cathode, the electron-injection layer, or the electron transport layer, and providing a field for recombination of the holes with the electrons for light emission, when an electric field is applied.

The light-emitting layer may be composed only of a light-emitting material, or may be a layer formed form a mixture of a host material and a light-emitting dopant. The light-emitting dopant may be a fluorescent or phosphorescent light-emitting material, and may contain two or more species. The host material is preferably a charge-transporting material. The host material may contain one or more species, and, for example, is a mixture of a hole-transporting host material and an electron-transporting host material. Further, a material which does not emit light nor transport any charge may be contained in the organic light-emitting layer.

The organic light-emitting layer may be a single layer or two or more layers. When it is two or more layers, the layers may emit lights of different colors.

The above light-emitting dopant may be, for example, a phosphorescent light-emitting material (phosphorescent light-emitting dopant) and a fluorescent light-emitting material (fluorescent light-emitting dopant).

The organic light-emitting layer may contain two or more different light-emitting dopants for improving color purity and/or expanding the wavelength region of light emitted therefrom. From the viewpoint of drive durability, it is preferred that the light-emitting dopant is those satisfying the following relation(s) with respect to the above-described host compound: i.e., 1.2 eV>difference in ionization potential ($\Delta$Ip)>0.2 eV and/or 1.2 eV>difference in electron affinity ($\Delta$Ea)>0.2 eV.

The fluorescent light-emitting material is not particularly limited and may be appropriately selected depending on the intended purpose. Examples thereof include complexes containing a transition metal atom or a lanthanoid atom.

The transition metal atom is not particularly limited and may be selected depending on the intended purpose. Preferred are ruthenium, rhodium, palladium, tungsten, rhenium, osmium, iridium gold, silver, copper and platinum. More preferred are rhenium, iridium and platinum. Particularly preferred are iridium and platinum.

The lanthanoid atom is not particularly limited and may be appropriately selected depending on the intended purpose. Examples thereof include lanthanum, cerium, praseodymium, neodymium, samarium, europium, gadolinium, terbium, dysprosium, holmium, erbium, thulium, ytterbium and lutetium, with neodymium, europium and gadolinium being preferred.

Examples of ligands in the complex include those described in, for example, "Comprehensive Coordination Chemistry" authored by G. Wilkinson et al., published by Pergamon Press Company in 1987; "Photochemistry and Photophysics of Coordination Compounds" authored by H. Yersin, published by Springer-Verlag Company in 1987; and "YUHKI KINZOKU KAGAKU-KISO TO OUYOU— (Metalorganic Chemistry—Fundamental and Application—)" authored by Akio Yamamoto, published by Shokabo Publishing Co., Ltd. in 1982.

Preferred examples of the ligands include halogen ligands (preferably, chlorine ligand), aromatic carbon ring ligands (preferably 5 to 30 carbon atoms, more preferably 6 to 30 carbon atoms, still more preferably 6 to 20 carbon atoms, particularly preferably 6 to 12 carbon atoms, such as cyclopentadienyl anion, benzene anion and naphthyl anion); nitrogen-containing hetero cyclic ligands (preferably 5 to 30 atoms, more preferably 6 to 30 carbon atoms, still more preferably 6 to 20 carbon atoms, particularly preferably 6 to 12 carbon atoms, such as phenyl pyridine, benzoquinoline, quinolinol, bipyridyl and phenanthrorine), diketone ligands (e.g., acetyl acetone), carboxylic acid ligands (preferably 2 to 30 carbon atoms, more preferably 2 to 20 carbon atoms, still more preferably 2 to 16 carbon atoms, such as acetic acid ligand), alcoholate ligands (preferably 1 to 30 carbon atoms, more preferably 1 to 20 carbon atoms, particularly preferably 6 to 20 carbon atoms, such as phenolate ligand), silyloxy ligands (preferably 3 to 40 carbon atoms, more preferably 3 to 30 carbon atoms, still more preferably 3 to 20 carbon atoms, such as trimethyl silyloxy ligand, dimethyl tert-butyl silyloxy ligand and triphenyl silyloxy ligand), carbon monoxide ligand, isonitrile ligand, cyano ligand, phosphorus ligand (preferably 3 to 40 carbon atoms, more preferably 3 to 30 carbon atoms, still more preferably 3 to 20 carbon atoms, particularly preferably, 6 to 20 carbon atoms, such as triphenyl phosphine ligand), thiolate ligands (preferably 1 to 30 carbon atoms, more preferably 1 to 20 carbon atoms, still more preferably 6 to 20 carbon atoms, such as phenyl thiolate ligand) and phosphine oxide ligands (preferably 3 to 30 carbon atoms, more preferably 8 to 30 carbon atoms, particularly preferably 18 to 30 carbon atoms, such as triphenyl phosphine oxide ligand), with nitrogen-containing hetero cyclic ligand being more preferred.

The above-described complexes may be a complex containing one transition metal atom in the compound, or a so-called polynuclear complex containing two or more transition metal atoms. In the latter case, the complexes may contain different metal atoms at the same time.

Among them, specific examples of the light-emitting dopants include phosphorescence luminescent compounds described in Patent Literatures such as U.S. Pat. No. 6,303, 238B1, U.S. Pat. No. 6,097,147, International Publication Nos. WO00/57676, WO00/70655, WO01/08230, WO01/39234A2, WO01/41512A1, WO02/02714A2, WO02/15645A1, WO02/44189A1 and WO05/19373A2, JP-A Nos. 2001-247859, 2002-302671, 2002-117978, 2003-133074, 2002-235076, 2003-123982 and 2002-170684, EP1211257, JP-A Nos. 2002-226495, 2002-234894, 2001-247859, 2001-298470, 2002-173674, 2002-203678, 2002-203679, 2004-357791, 2006-256999, 2007-19462, 2007-84635 and 2007-96259. Among them, Ir complexes, Pt complexes, Cu complexes, Re complexes, W complexes, Rh complexes, Ru complexes, Pd complexes, Os complexes, Eu complexes, Tb complexes, Gd complexes, Dy complexes and Ce complexes are preferred, with Ir complexes, Pt complexes and Re complexes being more preferred. Among them, Ir complexes, Pt complexes, and Re complexes each containing at least one coordination mode of metal-carbon bonds, metal-nitrogen bonds, metal-oxygen bonds and metal-sulfur bonds are still more preferred. Furthermore, Ir complexes, Pt complexes, and Re complexes each containing a tri-dentate or higher poly-dentate ligand are particularly preferred from the viewpoints of, for example, light-emission efficiency, drive durability and color purity.

The fluorescence luminescent dopant is not particularly limited and may be appropriately selected depending on the intended purpose. Examples thereof include benzoxazole, benzoimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bis-styrylanthracene, quinacridone, pyrrolopyridine, thiadiazolopyridine, cyclopentadiene, styrylamine, aromatic dimethylidene compounds, condensed polyaromatic compounds (e.g., anthracene, phenanthroline, pyrene, perylene, rubrene and pentacene), various metal complexes (e.g., metal complexes of 8-quinolinol, pyromethene complexes and rare-earth complexes), polymer compounds (e.g., polythiophene, polyphenylene and polyphenylenevinylene), organic silanes and derivatives thereof.

Specific examples of the luminescent dopants include the following compounds, which should be construed as limiting the present invention thereto.

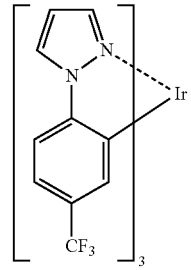

D-1

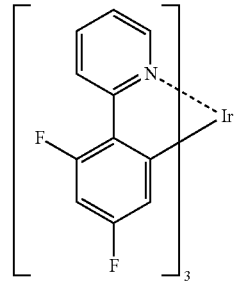

D-2

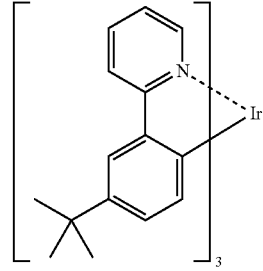

D-3

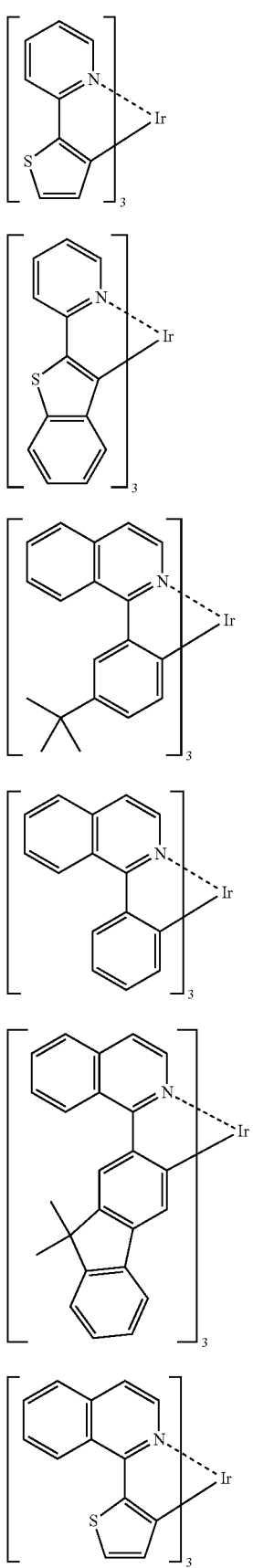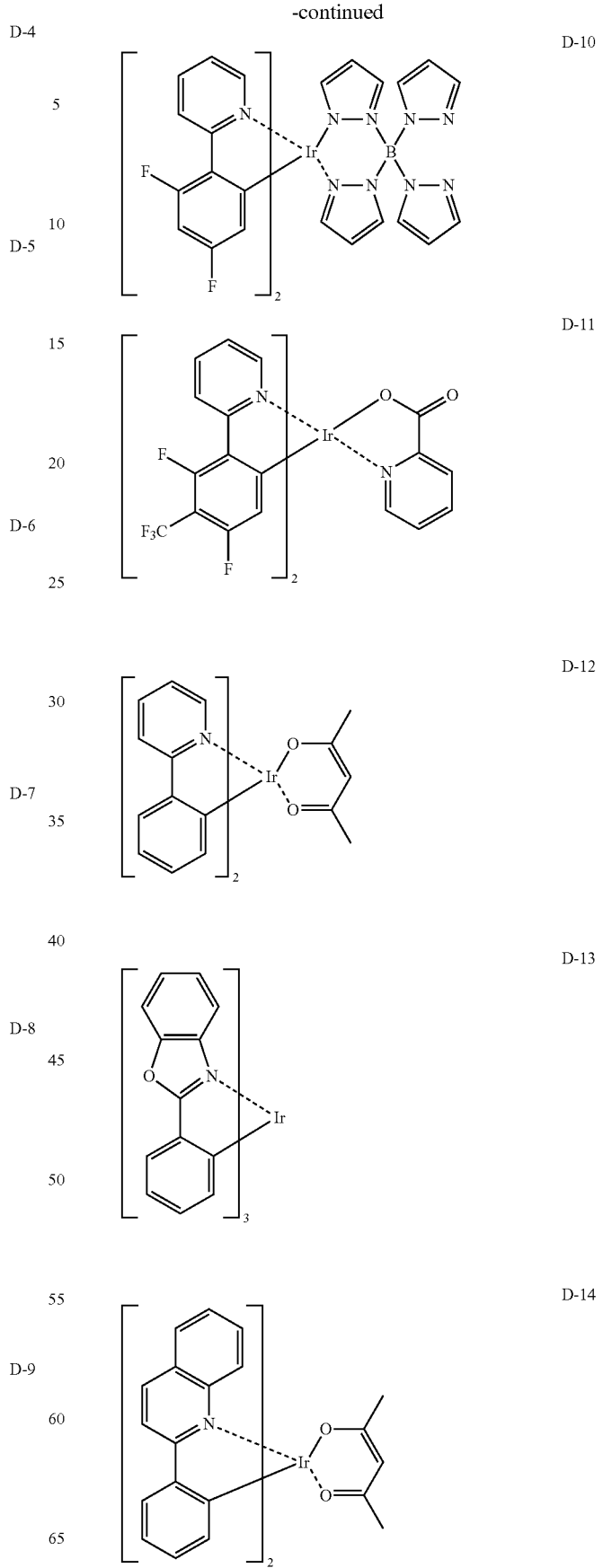

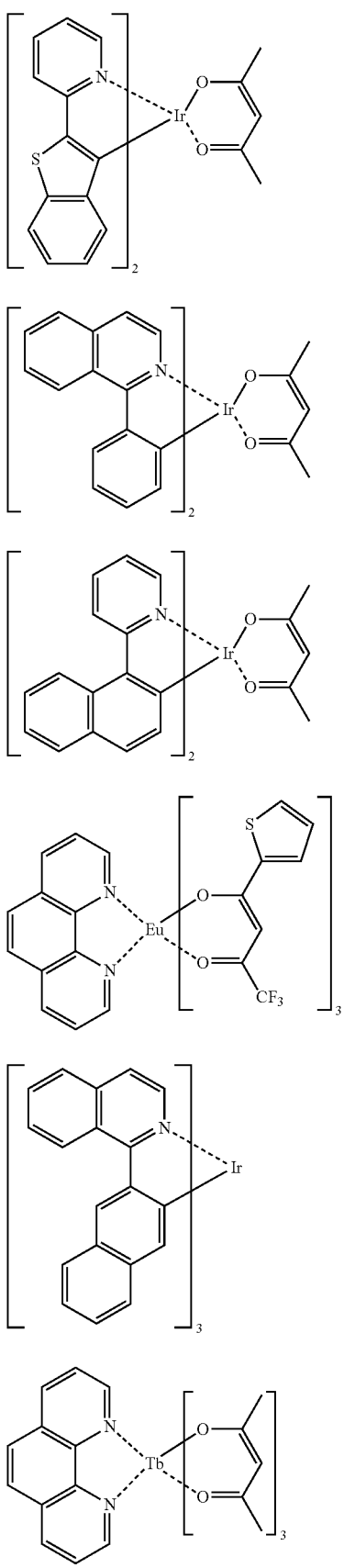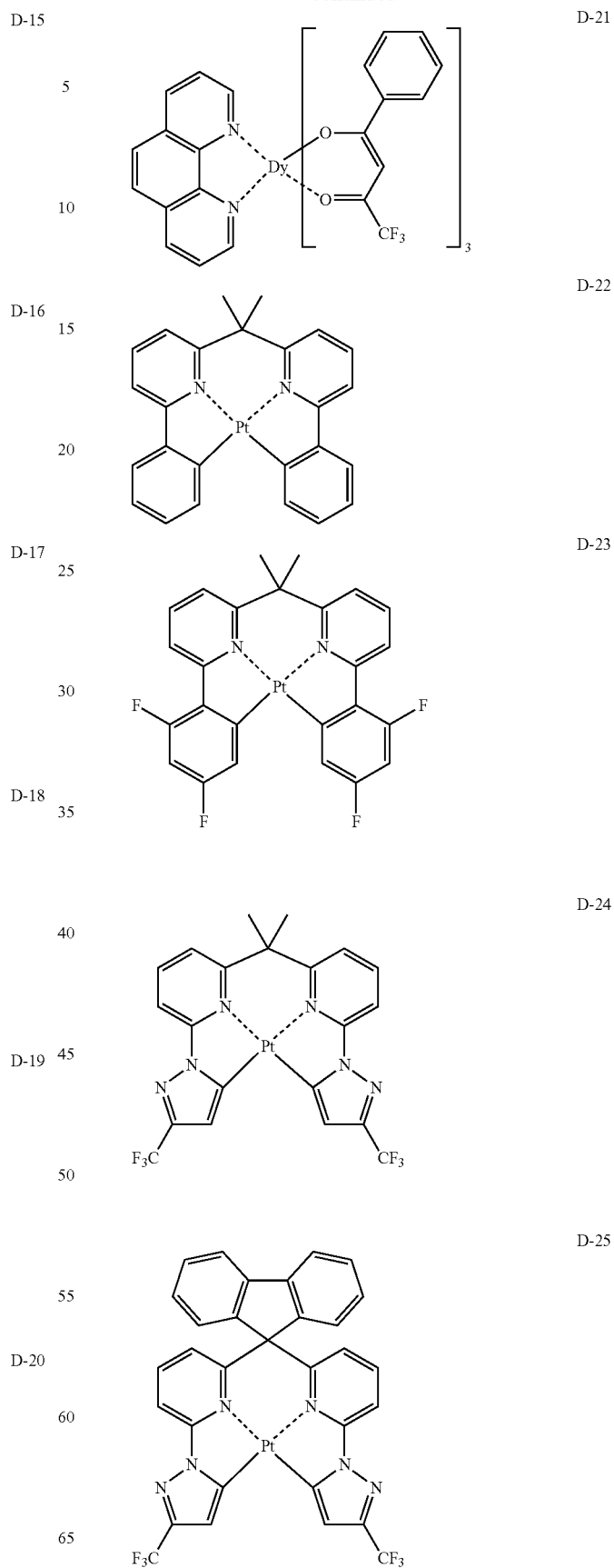

-continued
D-26
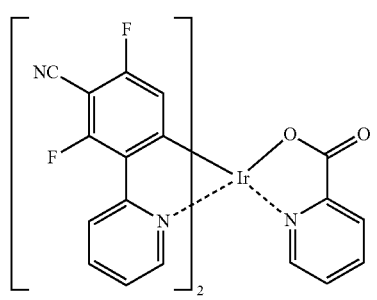
D-27
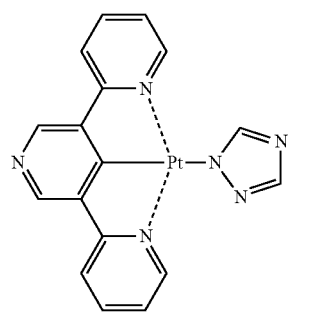
D-28
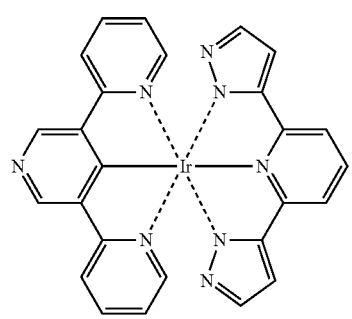
D-29
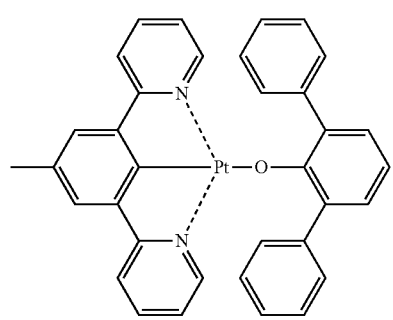
D-30
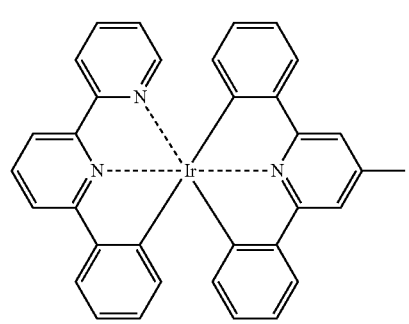
D-31
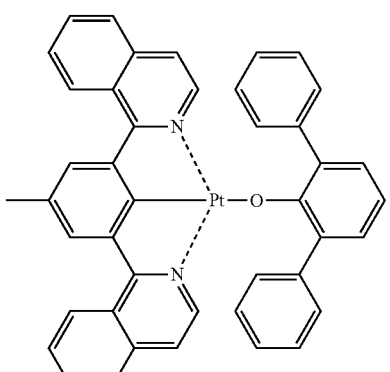
D-32
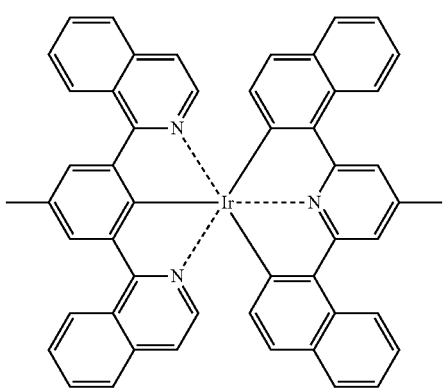
D-33
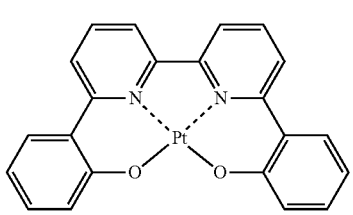
D-34
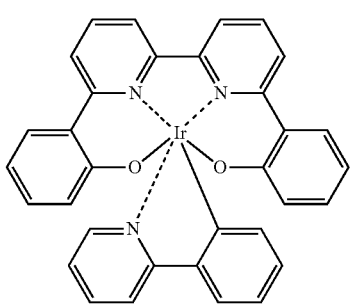
D-35
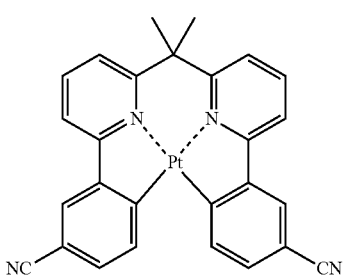

-continued
D-36
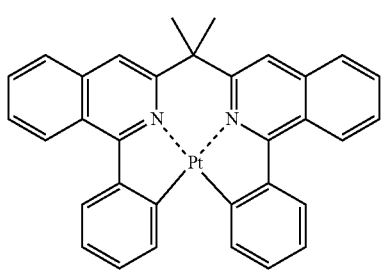
D-37
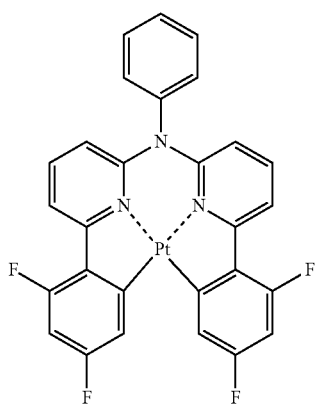
D-38
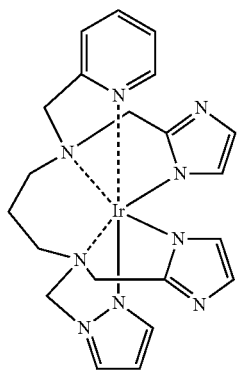
D-39
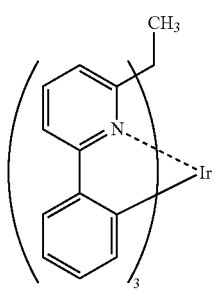
-continued
D-40
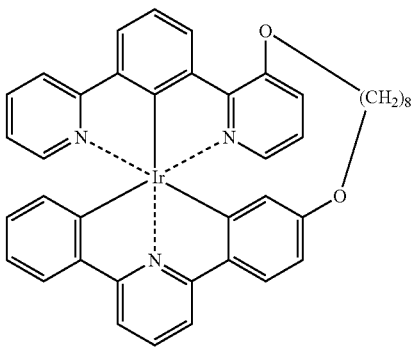
D-41
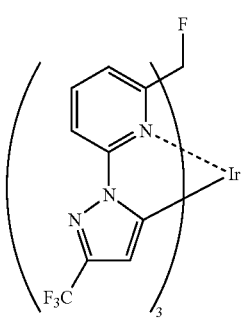
D-42
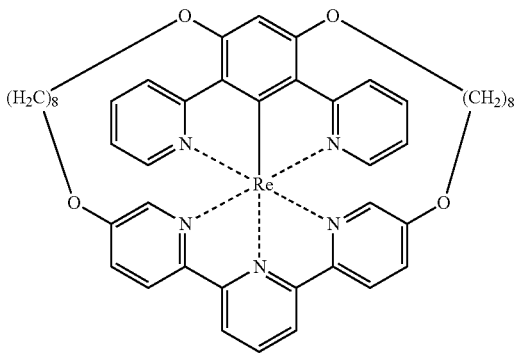
D-43
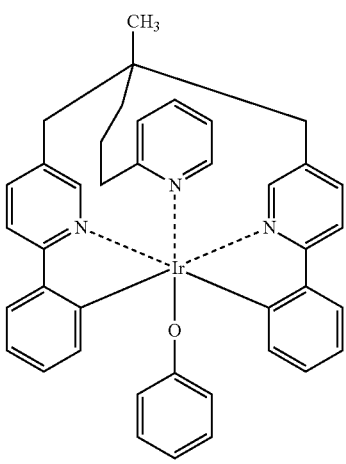
The light-emitting dopant is contained in the light-emitting layer in an amount of 0.1% by mass to 50% by mass with respect to the total amount of the compounds generally forming the light-emitting layer. From the viewpoints of drive durability and external light-emission efficiency, it is preferably contained in an amount of 1% by mass to 50% by mass, more preferably 2% by mass to 40% by mass.

The thickness of the light-emitting layer is not particularly limited and may be appropriately determined depending on the intended purpose. It is preferably 2 nm to 500 nm. From the viewpoint of external light-emission efficiency, it is more preferably 3 nm to 200 nm, particularly preferably 5 nm to 100 nm.

The host material may be hole transporting host materials excellent in hole transporting property (which may be referred to as a "hole transporting host") or electron transporting host compounds excellent in electron transporting property (which may be referred to as an "electron transporting host").

The hole transporting host material contained in the organic light-emitting layer is not particularly limited and may be appropriately selected depending on the intended purpose. Examples thereof include pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, conductive high-molecular-weight oligomers (e.g., thiophene oligomers and polythiophenes), organic silanes, carbon films and derivatives thereof. Among them, indole derivatives, carbazole derivatives, aromatic tertiary amine compounds and thiophene derivatives are preferred. Also, compounds each containing a carbazole group in the molecule are more preferred. Further, compounds each containing a t-butyl-substituted carbazole group are particularly preferred.

The electron transporting host to be used in the organic light-emitting layer preferably has an electron affinity Ea of 2.5 eV to 3.5 eV, more preferably 2.6 eV to 3.4 eV, particularly preferably 2.8 eV to 3.3 eV, from the viewpoints of improvement in durability and decrease in drive voltage. Also, it preferably has an ionization potential Ip of 5.7 eV to 7.5 eV, more preferably 5.8 eV to 7.0 eV, particularly preferably 5.9 eV to 6.5 eV, from the viewpoints of improvement in durability and decrease in drive voltage.

The electron transporting host is not particularly limited and may be appropriately selected depending on the intended purpose. Specific examples thereof include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides (e.g., naphthalene and perylene), phthalocyanine, derivatives thereof (which may form a condensed ring with another ring) and various metal complexes such as metal complexes of 8-quinolinol derivatives, metal phthalocyanine, and metal complexes having benzoxazole or benzothiazole as a ligand. Preferred electron transporting hosts are metal complexes, azole derivatives (e.g., benzimidazole derivatives and imidazopyridine derivatives) and azine derivatives (e.g., pyridine derivatives, pyrimidine derivatives and triazine derivatives). Among them, metal complexes are preferred in terms of durability.

As the metal complexes, preferred are those containing a ligand which has at least one nitrogen atom, oxygen atom, or sulfur atom and which is coordinated with the metal.

The metal ion contained in the metal complex is not particularly limited and may be appropriately selected depending on the intended purpose. For example, it is preferably a beryllium ion, a magnesium ion, an aluminum ion, a gallium ion, a zinc ion, an indium ion, a tin ion, a platinum ion or a palladium ion; more preferably is a beryllium ion, an aluminum ion, a gallium ion, a zinc ion, a platinum ion or a palladium ion; particularly preferably is an aluminum ion, a zinc ion or a palladium ion.

The ligands to be contained in the metal complexes are not particularly limited and may be appropriately selected from various known ligands. Examples thereof include those described in, for example, "Photochemistry and Photophysics of Coordination Compounds" authored by H. Yersin, published by Springer-Verlag Company in 1987; and "YUHKI KINZOKU KAGAKU—KISO TO OUYOU—(Metalorganic Chemistry—Fundamental and Application—)" authored by Akio Yamamoto, published by Shokabo Publishing Co., Ltd. in 1982.

The ligand is preferably nitrogen-containing heterocyclic ligands (preferably having 1 to 30 carbon atoms, more preferably 2 to 20 carbon atoms, particularly preferably 3 to 15 carbon atoms). It may be a unidentate ligand or a bi- or higher-dentate ligand. Preferred are bi- to hexa-dentate ligands, and mixed ligands of bi- to hexa-dentate ligands with a unidentate ligand.

Examples of the ligand include azine ligands (e.g., pyridine ligands, bipyridyl ligands and terpyridine ligands); hydroxyphenylazole ligands (e.g., hydroxyphenylbenzoimidazole ligands, hydroxyphenylbenzoxazole ligands, hydroxyphenylimidazole ligands and hydroxyphenylimidazopyridine ligands); alkoxy ligands (those having preferably 1 to 30 carbon atoms, more preferably 1 to 20 carbon atoms, particularly preferably 1 to 10 carbon atoms, such as methoxy, ethoxy, butoxy and 2-ethylhexyloxy); and aryloxy ligands (those having preferably 6 to 30 carbon atoms, more preferably 6 to 20 carbon atoms, particularly preferably 6 to 12 carbon atoms, such as phenyloxy, 1-naphthyloxy, 2-naphthyloxy, 2,4,6-trimethylphenyloxy and 4-biphenyloxy).

Further examples include heteroaryloxy ligands (those having preferably 1 to 30 carbon atoms, more preferably 1 to 20 carbon atoms, particularly preferably 1 to 12 carbon atoms, examples of which include pyridyloxy, pyrazyloxy, pyrimidyloxy and quinolyloxy); alkylthio ligands (those having preferably 1 to 30 carbon atoms, more preferably 1 to 20 carbon atoms, particularly preferably 1 to 12 carbon atoms, examples of which include methylthio and ethylthio); arylthio ligands (those having preferably 6 to 30 carbon atoms, more preferably 6 to 20 carbon atoms, particularly preferably 6 to 12 carbon atoms, examples of which include phenylthio); heteroarylthio ligands (those having preferably 1 to 30 carbon atoms, more preferably 1 to 20 carbon atoms, particularly preferably 1 to 12 carbon atoms, examples of which include pyridylthio, 2-benzimidazolylthio, 2-benzoxazolylthio and 2-benzothiazolylthio); siloxy ligands (those having preferably 1 to 30 carbon atoms, more preferably 3 to 25 carbon atoms, particularly preferably 6 to 20 carbon atoms, examples of which include a triphenylsiloxy group, a triethoxysiloxy group and a triisopropylsiloxy group); aromatic hydrocarbon anion ligands (those having preferably 6 to 30 carbon atoms, more preferably 6 to 25 carbon atoms, particularly preferably 6 to 20 carbon atoms, examples of which include a phenyl anion, a naphthyl anion and an anthranyl anion); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion and a benzothiophene anion); and indolenine anion ligands. Among them, nitrogen-containing heterocyclic ligands, aryloxy ligands, heteroaryloxy groups, siloxy ligands, etc. are preferred, and nitrogen-containing heterocyclic ligands, aryloxy ligands, siloxy ligands, aromatic hydrocarbon anion ligands, aromatic heterocyclic anion ligands, etc. are more preferred.

Examples of the metal complex electron transporting host include compounds described in, for example, JP-A Nos.

2002-235076, 2004-214179, 2004-221062, 2004-221065, 2004-221068 and 2004-327313.

In the light-emitting layer, it is preferred that the lowest triplet excitation energy (T1) of the host material is higher than T1 of the phosphorescence light-emitting material, from the viewpoints of color purity, light-emission efficiency and drive durability.

The amount of the host compound is not particularly limited and may be appropriately determined depending on the intended purpose. It is preferably 15% by mass to 95% by mass with respect to the total amount of the compounds forming the light-emitting layer, in terms of light emitting efficiency and drive voltage.

Hole-Injection Layer and Hole-Transport Layer

The hole-injection layer and hole-transport layer are layers having the function of receiving holes from the anode or from the anode side and transporting the holes to the cathode side. Materials to be incorporated into the hole-injection layer or the hole-transport layer may be a low-molecular-weight compound or a high-molecular-weight compound.

Specifically, these layers preferably contain, for example, pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, phthalocyanine compounds, porphyrin compounds, thiophene derivatives, organosilane derivatives and carbon.

Also, an electron-accepting dopant may be incorporated into the hole-injection layer or the hole-transport layer. The electron-accepting dopant may be, for example, an inorganic or organic compound, so long as it has electron accepting property and the function of oxidizing an organic compound.

Specific examples of the inorganic compound include metal halides (e.g., ferric chloride, aluminum chloride, gallium chloride, indium chloride and antimony pentachloride) and metal oxides (e.g., vanadium pentaoxide and molybdenum trioxide).

As the organic compounds, those having a substituent such as a nitro group, a halogen, a cyano group and a trifluoromethyl group; quinone compounds; acid anhydride compounds; and fullerenes may be preferably used.

In addition, there can be preferably used compounds described in, for example, JP-A Nos. 06-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637 and 2005-209643.

Among them, preferred are hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine and fullerene C60. More preferred are hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone and 2,3,5,6-tetracyanopyridine. Particularly preferred is tetrafluorotetracyanoquinodimethane.

These electron-accepting dopants may be used alone or in combination.

The amount of the electron-accepting dopant used is not particularly limited and depends on the type of material, the dopant is preferably used in an amount of 0.01% by mass to 50% by mass, more preferably 0.05% by mass to 20% by mass, particularly preferably 0.1% by mass to 10% by mass, with respect to the material of the hole-transport layer.

The thicknesses of the hole-injection layer and the hole-transport layer are each preferably 500 nm or less in terms of reducing drive voltage. The thickness of the hole-transport layer is preferably 1 nm to 500 nm, more preferably 5 nm to 200 nm, still more preferably 10 nm to 100 nm. The thickness of the hole-injection layer is preferably 0.1 nm to 200 nm, more preferably 0.5 nm to 100 nm, particularly preferably 1 nm to 100 nm.

Each of the hole-injection layer and the hole-transport layer may have a single-layered structure made of one or more of the above-mentioned materials, or a multi-layered structure made of a plurality of layers which are identical or different in composition.

—Electron-Injection Layer and Electron-Transport Layer—

The electron-injection layer and the electron-transport layer are layers having the functions of receiving electrons from the cathode or the cathode side and transporting the electrons to the anode side. The electron-injection materials or electron-transport materials for these layers may be low-molecular-weight or high-molecular-weight compounds.

Specific examples thereof include pyridine derivatives, quinoline derivatives, pyrimidine derivatives, pyrazine derivatives, phthalazine derivatives, phenanthoroline derivatives, triazine derivatives, triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyradine derivatives, aryl tetracarboxylic anhydrides such as perylene and naphthalene, phthalocyanine derivatives, metal complexes (e.g., metal complexes of 8-quinolinol derivatives, metal phthalocyanine, and metal complexes containing benzoxazole or benzothiazole as the ligand) and organic silane derivatives (e.g., silole).

The electron-injection layer or the electron-transport layer in the light-emitting display element of the present invention may contain an electron donating dopant. The electron donating dopant to be introduced in the electron-injection layer or the electron-transport layer may be any material, so long as it has an electron-donating property and a property for reducing an organic compound. Preferred examples thereof include alkali metals (e.g., Li), alkaline earth metals (e.g., Mg), transition metals including rare-earth metals, and reducing organic compounds. Among the metals, those having a work function of 4.2 eV or less are particularly preferably used. Examples thereof include Li, Na, K, Be, Mg, Ca, Sr, Ba, Y, Cs, La, Sm, Gd and Yb. Also, examples of the reducing organic compounds include nitrogen-containing compounds, sulfur-containing compounds and phosphorus-containing compounds.

In addition, there may be used materials described in, for example, JP-A Nos. 06-212153, 2000-196140, 2003-68468, 2003-229278 and 2004-342614.

These electron donating dopants may be used alone or in combination. The amount of the electron donating dopant used depends on the type of the material, but it is preferably 0.1% by mass to 99% by mass, more preferably 1.0% by mass to 80% by mass, particularly preferably 2.0% by mass to 70% by mass, with respect to the amount of the material of the electron transport layer.

The thicknesses of the electron-injection layer and the electron-transport layer are each preferably 500 nm or less in terms of reducing drive voltage. The thickness of the electron-transport layer is preferably 1 nm to 500 nm, more preferably 5 nm to 200 nm, particularly preferably 10 nm to 100 nm. The thickness of the electron-injection layer is preferably 0.1 nm to 200 nm, more preferably 0.2 nm to 100 nm, particularly preferably 0.5 nm to 50 nm.

Each of the electron-injection layer and the electron-transport layer may have a single-layered structure made of one or more of the above-mentioned materials, or a multi-layered structure made of a plurality of layers which are identical or different in composition.

—Hole Blocking Layer—

The hole blocking layer is a layer having the function of preventing the holes, which have been transported from the anode side to the light-emitting layer, from passing toward the cathode side, and may be provided as an organic compound layer adjacent to the light-emitting layer on the cathode side.

Examples of the compound forming the hole blocking layer include aluminum complexes (e.g., BAlq), triazole derivatives and phenanthroline derivatives (e.g., BCP).

The thickness of the hole blocking layer is preferably 1 nm to 500 nm, more preferably 5 nm to 200 nm, particularly preferably 10 nm to 100 nm.

The hole blocking layer may have a single-layered structure made of one or more of the above-mentioned materials, or a multi-layered structure made of a plurality of layers which are identical or different in composition.

—Electron Blocking Layer—

An electron blocking layer is a layer having the function of preventing the electrons, which have been transported from the cathode side to the light-emitting layer, from passing toward the anode side, and may be provided as an organic compound layer adjacent to the light-emitting layer on the anode side in the present invention.

Examples of the compound forming the electron blocking layer include those listed as a hole-transport material.

The thickness of the electron blocking layer is preferably 1 nm to 500 nm, more preferably 5 nm to 200 nm, particularly preferably 10 nm to 100 nm.

The electron blocking layer may have a single-layered structure made of one or more of the above-mentioned materials, or a multi-layered structure made of a plurality of layers which are identical or different in composition.

In order to improve the light-emission efficiency, the light-emitting layer may have such a configuration that charge generation layers are provided between a plurality of light-emitting layers.

The charge generation layer is a layer having the functions of generating charges (i.e., holes and electrons) when an electrical field is applied, and of injecting the generated charges into the adjacent layers.

The material for the charge generation layer is not particularly limited, so long as it has the above-described functions. The charge generation layer may be made of a single compound or a plurality of compounds.

Specifically, the material may be those having conductivity, those having semi-conductivity (e.g., doped organic layers) and those having electrical insulating property. Examples thereof include the materials described in JP-A Nos. 11-329748, 2003-272860 and 2004-39617.

Specific examples thereof include transparent conductive materials (e.g., ITO and IZO (indium zinc oxide)), fullerenes (e.g., C60), conductive organic compounds (e.g., oligothiophene, metal phthalocyanine, metal-free phthalocyanine, metal porphyrins and non-metal porphyrins), metal materials (e.g., Ca, Ag, Al, Mg—Ag alloys, Al—Li alloys and Mg—Li alloys), hole conducting materials, electron conducting materials and mixtures thereof.

Examples of the hole conducting materials include hole transport organic materials (e.g., 2-TNATA and NPD) doped with an oxidant having an electron-attracting property (e.g., F4-TCNQ, TCNQ and $FeCl_3$), P-type conductive polymers and P-type semiconductors. Examples of the electron conducting materials include electron transport organic materials doped with a metal or metal compound having a work function lower than 4.0 eV, N-type conductive polymers and N-type semiconductors. Examples of the N-type semiconductors include N-type Si, N-type CdS and N-type ZnS. Examples of the P-type semiconductors include P-type Si, P-type CdTe and P-type CuO.

Also, the charge generation layer may be made of electrical insulating materials such as $V_2O_5$.

The charge generation layer may have a single-layered or multi-layered structure. Examples of the multi-layered structure the charge generation layer has include a structure in which a conductive material (e.g., transparent conductive materials and metal materials) is laminated on a hole or electron transport material, and a structure in which the above-listed hole conducting material is laminated on the above-listed electron conducting material.

In general, the thickness and material of the charge generation layer is preferably determined so that the transmittance thereof with respect to visible light is 50% or higher. The thickness thereof is not particularly limited and may be appropriately determined depending on the intended purpose. The thickness is preferably 0.5 nm to 200 nm, more preferably 1 nm to 100 nm, still more preferably 3 nm to 50 nm, particularly preferably 5 nm to 30 nm.

The forming method for the charge generation layer is not particularly limited. The above-described forming methods for the organic compound layer may be employed.

The charge generation layer is formed between two or more layers of the above light-emitting layer. The charge generation layer may contain, at the anode or cathode side, a material having the function of injecting charges into the adjacent layers. In order to increase injectability of electrons into the adjacent layers at the anode side, electron injection compounds (e.g., BaO, SrO, $Li_2O$, LiCl, LiF, $MgF_2$, MgO and $CaF_2$) may be deposited on the charge generation layer at the anode side.

In addition to the above-listed materials, the material for charge generation layer may be selected from those described in JP-A No. 2003-45676, and U.S. Pat. Nos. 6,337,492, 6,107,734 and 6,872,472.

—Anode—

In general, the anode may be any material, so long as it has the function of serving as an electrode that supplies holes to the organic compound layers constituting the light-emitting layer. The shape, structure, size, etc. thereof are not particularly limited and may be appropriately selected from known electrode materials depending on the application/purpose of the light-emitting display element. As described above, the anode is generally provided as a transparent anode.

Preferred examples of the materials for the anode include metals, alloys, metal oxides, conductive compounds and mixtures thereof. Specific examples include conductive metal oxides such as tin oxides doped with, for example, antimony and fluorine (ATO and FTO); tin oxide, zinc oxide, indium oxide, indium tin oxide (ITO) and indium zinc oxide (IZO); metals such as gold, silver, chromium and nickel; mixtures or laminates of these metals and the conductive metal oxides; inorganic conductive materials such as copper iodide and copper sulfide; organic conductive materials such as polyaniline, polythiophene and polypyrrole; and laminates of these materials and ITO. Among them, conductive metal oxides are preferred. In particular, ITO is preferred from the viewpoints of productivity, high conductivity, transparency, etc.

The anode may be formed on the below-described substrate by a method which is appropriately selected from wet methods such as printing methods and coating methods; physical methods such as vacuum deposition methods, sputtering methods and ion plating method; and chemical methods such as CVD and plasma CVD methods, in consideration of suitability for the material for the anode. For example, when ITO is used as a material for the anode, the anode may be formed in accordance with a DC or high-frequency sputtering method, a vacuum deposition method, or an ion plating method.

In the present invention, a position at which the anode is to be disposed is not particularly limited, so long as the anode is provided so as to come into contact with the light-emitting layer. The position may be appropriately determined depending on the application/purpose of the light-emitting display element. The anode may be entirely or partially formed on one surface of the light-emitting layer.

Patterning for forming the anode may be performed by a chemical etching method such as photolithography; a physical etching method such as etching by laser; a method of vacuum deposition or sputtering using a mask; a lift-off method; or a printing method.

The thickness of the anode is not particularly limited and may be appropriately selected depending on the material for the anode and is, therefore, not definitely determined. It is generally about 10 nm to about 50 μm, preferably 50 nm to 20 μm.

The resistance of the anode is preferably $10^3$ Ω/square or less, more preferably $10^2$ Ω/square or less. When the anode is transparent, it may be colorless or colored. For extracting luminescence from the transparent anode side, it is preferred that the anode has a light transmittance of 60% or higher, more preferably 70% or higher.

Concerning transparent anodes, there is a detail description in "TOUMEI DOUDEN-MAKU NO SHINTENKAI (Novel Developments in Transparent Electrode Films)" edited by Yutaka Sawada, published by C.M.C. in 1999, the contents of which can be applied to the present invention. When a plastic substrate having a low heat resistance is used, it is preferred that ITO or IZO is used to form a transparent anode at a low temperature of 150° C. or lower.

—Cathode—

The cathode is not particularly limited, so long as it can apply an electrical field to the light-emitting layer. Depending on the position in the light-emitting display element, the electrode may be appropriately selected from a transparent anode, a transparent cathode, a semi-transparent anode, a semi-transparent cathode, a light-transmissive anode, a light-transmissive cathode, a light-intransmissive anode and a light-intransmissive cathode. For example, a transparent electrode may be used as an electrode located in the light-emitting direction from the light-emitting layer of the light-emitting display element.

The shape, structure, size, etc. thereof are not particularly limited and may be appropriately selected from known electrode materials depending on the application/purpose of the light-emitting display element.

The material for the cathode may be appropriately selected depending on the intended purpose. Examples thereof include metals, alloys, metal oxides, conductive compounds and mixtures thereof. Specific examples thereof include alkali metals (e.g., Li, Na, K and Cs), alkaline earth metals (e.g., Mg and Ca), gold, silver, lead, aluminum, sodium-potassium alloys, lithium-aluminum alloys, magnesium-silver alloys and rare earth metals (e.g., indium and ytterbium). These may be used individually, but it is preferred that two or more of them are used in combination from the viewpoint of satisfying both stability and electron-injection property.

Among them, as the materials for forming the cathode, alkali metals or alkaline earth metals are preferred in terms of excellent electron-injection property, and materials containing aluminum as a major component are preferred in terms of excellent storage stability. The term "material containing aluminum as a major component" refers to a material composed of aluminum alone; alloys containing aluminum and 0.01% by mass to 10% by mass of an alkali or alkaline earth metal; or the mixtures thereof (e.g., lithium-aluminum alloys and magnesium-aluminum alloys).

The materials for the cathode are described in detail in JP-A Nos. 02-15595 and 05-121172. The materials described in these literatures can be used in the present invention.

The method for forming the cathode is not particularly limited, and the cathode may be formed by a known method. For example, the cathode may be formed by a method which is appropriately selected from wet methods such as printing methods and coating methods; physical methods such as vacuum deposition methods, sputtering methods and ion plating methods; and chemical methods such as CVD and plasma CVD methods, in consideration of suitability for the material for the cathode. For example, when a metal (or metals) is (are) selected as a material (or materials) for the cathode, one or more of them may be applied simultaneously or sequentially by a sputtering method.

Patterning for forming the cathode may be performed by a chemical etching method such as photolithography; a physical etching method such as etching by laser; a method of vacuum deposition or sputtering using a mask; a lift-off method; or a printing method.

In the present invention, a position at which the cathode is to be disposed is not particularly limited, so long as the cathode can apply an electric field to the light-emitting layer. The cathode may be entirely or partially formed on the light-emitting layer.

Furthermore, a dielectric layer having a thickness of 0.1 nm to 5 nm and being made, for example, of fluorides and oxides of an alkali or alkaline earth metal may be inserted between the cathode and the organic compound layer. The dielectric layer may be considered to be a kind of electron-injection layer. The dielectric layer may be formed by, for example, a vacuum deposition method, a sputtering method and an ion plating method.

The thickness of the cathode is not particularly limited and may be appropriately selected depending on the material for the cathode and is, therefore, not definitely determined. It is generally about 10 nm to about 5 μm, and preferably 50 nm to 1 μm.

Moreover, the cathode may be transparent, semi-transparent or opaque. The transparent cathode may be formed as follows. Specifically, a 1 nm- to 10 nm-thick thin film is formed from a material for the cathode, and a transparent conductive material (e.g., ITO and IZO) is laminated on the thus-formed film.

<Reflective Layer>

The reflective layer is not particularly limited, so long as it reflects light emitted from the light-emitting layer, and may be appropriately selected depending on the intended purpose. The shape, structure and size of the reflective layer are not particularly limited and may be determined depending on the purpose of the present invention. The thickness of the reflective layer may be 300 nm to 1,000 nm.

The position at which the reflective layer is to be disposed may be appropriately determined depending on the structure of the light-emitting display element. When the below-described substrate is provided, the reflective layer may be disposed between the substrate and the light-emitting layer.

The material for the reflective layer is not particularly limited, so long as it can reflect light emitted from the light-emitting layer. Examples of the material employable include those having a reflectance of 70% or higher with respect to the emitted light. Specific examples of the material for the reflective layer include metals such as Al, Ag and Ni.

<Substrate>

The light-emitting display element of the present invention may contain a substrate for the purposes of ensuring the strength of the light-emitting display element and protecting the light-emitting display element from hazardous materials derived from the environment. The shape, structure, size, etc. of the substrate may be appropriately determined, so long as the above purposes can be achieved. In general, the substrate preferably has a plate-like shape. The structure of the substrate may be single-layered or multi-layered. Also, the substrate is composed of a single member or two or more members. The substrate may be colorless or colored transparent. Preferably, the substrate is colorless transparent, since such colorless transparent substrate does not diffuse or damp light emitted from the organic light-emitting layer.

The position at which the substrate is to be disposed is not particularly limited and may be appropriately determined depending on the intended purpose. Preferably, the substrate is disposed at the outermost position of the light-emitting display element from the viewpoint of shielding hazardous materials derived from the environment.

The material for the substrate is not particularly limited and may be appropriately selected depending on the intended purpose. Examples thereof include inorganic materials such as yttria-stabilized zirconia (YSZ) and glass; and organic materials such as polyesters (e.g., polyethylene terephthalate, polybutylene phthalate and polyethylene naphthalate), polystyrene, polycarbonate, polyether sulfone, polyarylate, polyimide, polycycloolefin, norbornene resins and poly(chlorotrifluoroethylene).

For example, when the substrate is made of glass, the glass is preferably alkali-free glass in order to reduce ions eluted from it. Also, when soda-lime glass is used for the material of the substrate, a barrier coat of silica, etc., is preferably provided on the substrate (e.g., barrier-film substrates). The organic materials are preferably used since they are excellent in heat resistance, dimensional stability, solvent resistance, electrical insulation and processability.

When a thermoplastic substrate is used, a hard coat layer, an under coat layer and other layers may be additionally provided as necessary.

<Other Members>

The light-emitting display element of the present invention may appropriately contain other members known in the art depending on the intended purpose. Examples of the other members include a light-extraction layer which emits light emitted from the light-emitting layer toward the outside of the light-emitting display element, an optical path length-adjusting layer which adjusts the optical path length of light emitted from the light-emitting layer, a gas barrier layer which prevents permeation of air and moisture to the light-emitting display element, a protective layer which protects the members of the light-emitting display element from physical/chemical external forces, and an anti-reflecting layer which prevents reflection of light outside and/or inside of the light-emitting display element.

EXAMPLES

The present invention will next be described by way of Examples, which should not be construed as limiting the present invention thereto.

Example 1

<Fabrication of Light-Emitting Display Element 1>
<<Fabrication of RGBW Color Filter 1>>

Black color resist CK-8400 (product of FUJIFILM Electronics Materials Co., Ltd.) was applied by a spin coater onto a glass substrate for fabricating a color filter so as to have a thickness (after drying) of 1.0 µm, followed by drying at 120° C. for 2 min, to thereby form a uniform black coating film.

Next, using an exposing device, the resultant coating film was irradiated through a 100 µm-thick mask with light having a wavelength of 365 nm at an exposure dose of 300 mJ/cm$^2$. After irradiation, the exposed film was developed with a developer of 10% CD-1 (product of FUJIFILM Electronics Materials Co., Ltd.) at 26° C. for 90 sec. Subsequently, the developed film was rinsed with running water for 20 sec, dried with an air knife, and thermally treated at 220° C. for 60 min, to thereby form a 96 ppi black matrix pattern (image).

Next, the following three color curable compositions were dispersed with a sand mill for one day. Notably, the green color dispersion liquid may be referred to as dispersion liquid (A-1), the red color dispersion liquid as dispersion liquid (A-2), and the blue color dispersion liquid as dispersion liquid (A-3).

[Green Color: Dispersion Liquid (A-1)]
Benzyl methacrylate/methacrylic acid copolymer: 80 parts by mass
(weight average molecular weight: 30,000, acid value: 120)
Propylene glycol monomethyl ether acetate: 500 parts by mass
Copper phthalocyanine pigment: 33 parts by mass
C. I. Pigment Yellow 185: 67 parts by mass
[Red Color: Dispersion Liquid (A-2)]
Benzyl methacrylate/methacrylic acid copolymer: 80 parts by mass
(weight average molecular weight: 30,000, acid value: 120)
Propylene glycol monomethyl ether acetate: 500 parts by mass
C. I. Pigment Red 254: 50 parts by mass
C. I. Pigment Red PR177: 50 parts by mass
[Blue Color: Dispersion Liquid (A-3)]
Benzyl methacrylate/methacrylic acid copolymer: 80 parts by mass
(weight average molecular weight: 30,000, acid value: 120)
Propylene glycol monomethyl ether acetate: 500 parts by mass
C. I. Pigment Blue 15:6: 95 parts by mass
C. I. Pigment Violet 23: 5 parts by mass Next, the following components were added to 60 parts by mass of each of the above color curable compositions (i.e., dispersion liquids (A-1), (A-2) and (A-3)), to thereby obtain compositions of every color.
Dipentaerythritol hexaacrylate (DPHA): 80 parts by mass
4-[o-Bromo-p-N,N-di(ethoxycarbonyl)aminophenyl]2,6-di(trichloromethyl)-S-triazine: 5 parts by mass
7-[{4-Chloro-6-(diethylamino)-S-triazin-2-yl}amino]-3-phenylcoumalin: 2 parts by mass
Hydroquinone monomethyl ether: 0.01 parts by mass
Propylene glycol monomethyl ether acetate: 500 parts by mass The above-prepared compositions for each color were homogeneously mixed and then filtrated with a filter having a pore size of 5 µm, to thereby obtain three color curable compositions of the present invention. Of these, the green curable composition was applied by a spin coater onto the glass substrate, on which the black matrix had been formed, so as to have a thickness (after drying) of 1.0 µm, followed by drying at 120° C. for 2 min, to thereby form a uniform green coating film.

Next, using an exposing device, the resultant coating film was irradiated through a 100 µm-thick mask with light having a wavelength of 365 nm at an exposure dose of 300 mJ/cm$^2$. After irradiation, the exposed film was developed with a developer of 10% CD-1 (product of FUJIFILM Electronics Materials Co., Ltd.) at 26° C. for 60 sec. Subsequently, the developed film was rinsed with running water for 20 sec, dried with an air knife, and thermally treated at 220° C. for 60 min, to thereby form a patterned green image (green pixels). In the same manner as in the green curable composition, each of the red curable composition and the blue curable composition was applied to the same glass substrate, to thereby sequentially form a patterned red image (red pixels) and a patterned blue image (blue pixels).

<<Fabrication of Color Filter 1 Having Polarizing Layer Laminated on W Portion>>
[Preparation of Photo-Orientation Film Composition]

The following components were dissolved to form a homogenous solution, and then the formed solution was pressure-filtered through a membrane filter of 0.45 µm, whereby a photo-orientation film composition was prepared.
Material of orientation layer: azo compound having the following structural formula (Y): 1.00 part by mass

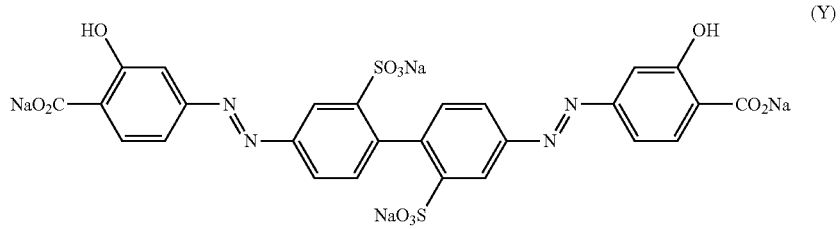
(Y)

Solvent:
N-Methyl-2-pyrrolidone: 49.50 parts by mass
2-Butoxyethanol: 49.50 parts by mass
[Fabrication of Color Filter Substrate Having Photo-Orientation Film]

The thus-prepared photo-orientation film composition was applied onto a substrate with a wire bar, followed by drying at 100° C. for 1 min. Subsequently, UV rays having a wavelength of around 365 nm were applied to a white pixel-formed portion of the substrate perpendicularly thereto. The UV rays applied were emitted from an ultra-high-pressure mercury lamp via a band pass filter, and thus linearly polarized. Through the above procedure, a color filter substrate having a 0.07 μm-thick photo-orientation film was formed. The integral dose of light was found to be 5 J/cm².

[Preparation of Polarizing Layer-Forming Composition]

The following components were mixed together to prepare a polarizing layer-forming composition.
(A) Surfactant: compound (I-6) having the following structural formula: 0.01 parts by mass
(B) Solvent: chloroform: 98.99 parts by mass
(C) Azo dye: compound (A-46) having the following structural formula: 1.00 part by mass slow axis of the phase difference film, to thereby fabricate color filter 1 of Example 1 having a flat surface.

<<Fabrication of Organic EL Element>>

An indium tin oxide (ITO) transparent conductive film (thickness: 150 nm) (product of GEOMATEC Corporaiton) on a glass substrate having TFTs was patterned through photolithography and hydrochloric acid etching, to thereby form an anode.

The thus-patterned ITO substrate was washed through ultrasonication in acetone, washed with pure water, and washed through ultrasonication in isopropyl alcohol. The washed substrate was dried by nitrogen blow, and finally washed through UV-ozone washing. The thus-treated substrated was placed in a vacuum vapor-deposition apparatus, and then, the vacuum vapor-deposition apparatus was evacuated.

Subsequently, 4,4'-bis[N-(1-naphthyl)-N-phenylamino] biphenyl (α-NPD) was heated in the vacuum vapor-deposition apparatus so as to be vapor-deposited at a deposition rate of 0.2 nm/sec, to thereby form a 40 nm-thick hole transport layer.

Subsequently, the following host material, blue light-emitting material, green light-emitting material and red light-

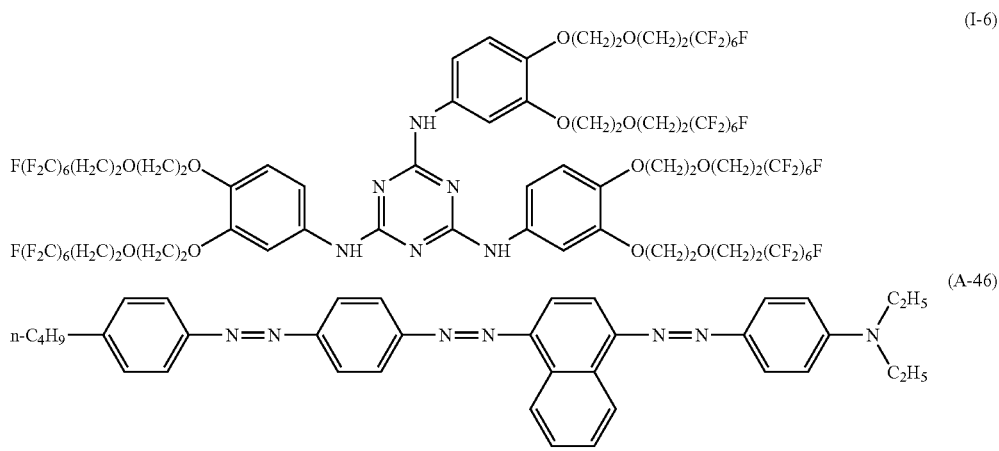

[Formation of Polarizing Layer]

The obtained polarizing layer-forming composition was applied only on a white pixel-formed portion of the color filter substrate having the photo-orientation film, whereby a wet coating film was formed so as to have a thickness $L^1$ of 6 μm. The wet coating film was dried at 70° C. for 60 sec to form a dry coating film having a thickness $L^2$ of 0.06 μm.

Furthermore, a phase difference film (a ¼λ phase difference film: 27344K, product of Edmont Optics Japan) was attached to the entire back surface of the glass substrate with a UV-ray curable adhesive (XNR5516HV, product of Nagase-Chiba Co.) so that an angle of 45° was formed between the transmission axis of the polarizing plate and the emitting material (i.e., the materials for forming a light-emitting layer) were heated and co-deposited simultaneously on the formed hole transport layer, to thereby form blue, green and red light-emitting layers.

Host Materials:
4,4'-N,N'-Dicarbazole-biphenyl (CBP) having the following structural formula Blue Light-Emitting Materials:
Iridium(III)bis[(4,6-difluorophenyl)-pyridinato-N,C2]picolinate (Firpic) having the following structural formula Green Light-Emitting Material:
Tris(2-phenylpyridine)iridium (Ir(ppy)₃) having the following structural formula Red Light-Emitting Material:
Dopant A having the following structural formula

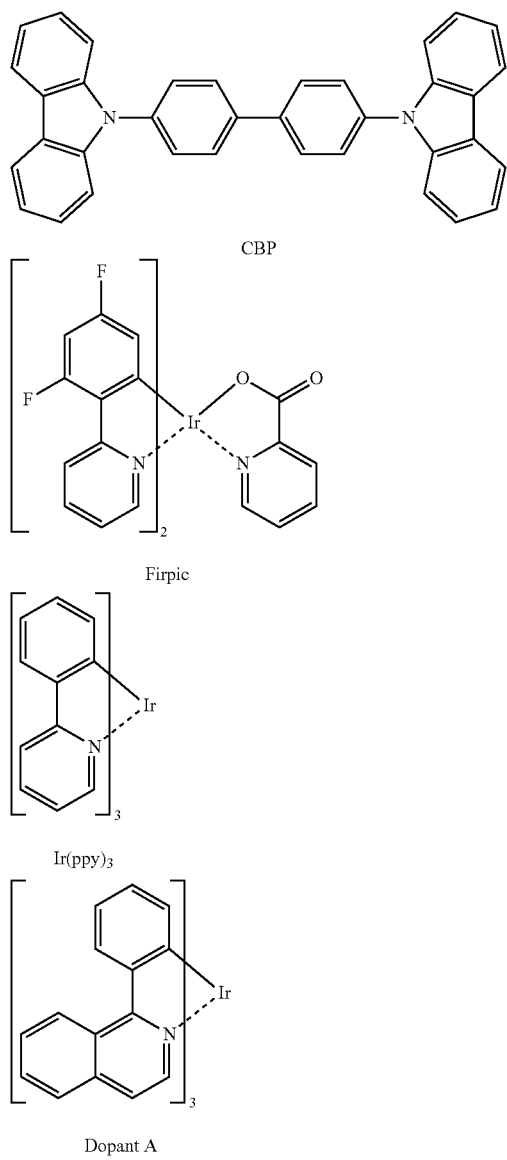

Notably, in the co-deposition, the deposition rate of CBP was adjusted to be 0.2 nm/sec. Also, the amount of Firpic was adjusted to be 1.5% by mass, Ir(ppy)$_3$ 0.5% by mass and Dopant A 0.5% by mass. As a result, blue, green and red light-emitting layers (each having a thickness of 30 nm) were laminated on the hole transport layer.

Furthermore, aluminum(III) bis(2-methyl-8-quinolinato)-4-phenyl phenolate (BAlq) was deposited on each light-emitting layer at a deposition rate of 0.1 nm/sec, to thereby form an electron transport layer having a thickness of 30 nm.

Thereafter, lithium fluoride (LiF) was deposited on the electron transport layer at a deposition rate of 0.1 nm/sec, to thereby form an electron injection layer having a thickness of 1 nm. In addition, aluminum was deposited on the electron injection layer at a deposition rate of 0.5 nm/sec, to thereby form a cathode having a thickness of 150 nm.

Also, an aluminum lead wire was connected to the anode and the cathode. Notably, during vapor deposition, the layer thickness was monitored with a crystal oscillation-type deposition controller so as to obtain a desired layer thickness.

Without being exposed to air, the obtained laminate was placed in a glove box which had been purged with nitrogen gas. Separately, in the glove box, a water absorber (product of SAES Getters Co.) was attached to a glass sealing cover having concave portions in the inner wall thereof. The laminate was sealed by this sealing cover with a UV-ray curable adhesive (XNR5516HV, product of Nagase-Chiba Co.).

Through the above procedure, an organic EL element of Example 1 was fabricated.

The above-fabricated color filter 1 of Example 1 and the organic EL element of Example 1 were joined together with a UV-ray curable adhesive (XNR5516HV, product of Nagase-Chiba Co.) so that color filter 1 was disposed at the side where light emitted from the organic EL element of Example 1 was emitted to the outside, to thereby fabricate a light-emitting display element of Example 1.

Example 2

<Fabrication of Light-Emitting Display Element>

In the fabrication of color filter 1 of Example 1, RGB pixels were formed on a glass substrate (for fabricating a color filter) having a phase difference film (a ¼λ, phase difference film: 27344K, product of Edmont Optics Japan) attached thereto a UV-ray curable adhesive (XNR5516HV, product of Nagase-Chiba Co.) instead of on the glass substrate for fabricating a color filter.

A black matrix pattern was formed on the phase difference film in the same manner as in Example 1, and then a photo-orientation layer and a polarizing layer were formed as described below. Thereafter, similar to Example 1, green, red and blue pattern images were formed to fabricate color filter 2 of Example 2 having a flat surface.

Next, color filter 2 of Example 2 and the organic EL element of Example 1 were used to fabricate a light-emitting display element of Example 2 in the same manner as in Example 1.

<Formation of Color Filter Having ¼λ, Phase Difference Film as Well as Polarizing Layer in W Portion>

[Preparation of Orientation Film Composition]

The following components were mixed together to prepare a rubbing orientation film composition.

Polyvinyl alcohol having the following structural formula (X) (material for orientation fim): 0.40 parts by mass

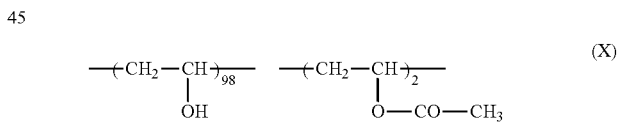

Water: 74.70 parts by mass
Methanol: 24.90 parts by mass

[Fabrication of Color Filter Substrate Having Rubbing Orientation Film as Well as ¼λ Phase Difference Film]

The thus-prepared orientation film composition was applied with a wire bar (#14) onto the color filter substrate having the ¼λ phase difference film, followed by drying at 80° C. for 5 min and rubbing, to thereby fabricate a color filter substrate having a 0.7 μm-thick rubbing orientation film as well as the ¼λ phase difference film.

(Preparation of Polarizing Layer Composition)

Next, the following components were mixed together to prepare a polarizing layer-forming composition.

(A) Surfactant: MEGAFAC F780: 0.01 parts by mass
(product of DIC Corporation, a compound described in Example 1 of JP-B No. 4190275)

(B) Solvent: chloroform: 98.99 parts by mass
(C) Azo dye:
Compound (C-26) having the following structural formula: 0.50 parts by mass
Compound (D-2) having the following structural formula: 0.50 parts by mass (4) Light-emitting portions were covered with a metal cover, and light non-emitting portions were covered with an insulative layer.

(5) Through vacuum vapor deposition, a light-emitting layer (white color light-emitting electrical field) and a semi-transmissive reflective electrode were formed as follows on the transparent electrodes of the R, G, B and W subpixels.

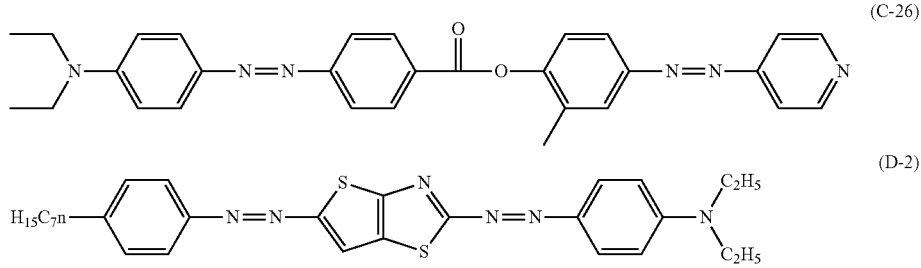

[Formation of Polarizing Layer]

The thus-prepared polarizing layer-forming composition was applied only on a part of the color filter substrate having the rubbing orientation film as well as the ¼λ phase difference film, the part corresponding to a white pixel of a pattern image to be formed on the color filter substrate, whereby a wet coating film was formed so as to have a thickness $L^1$ of 6 μm. The wet coating film was dried at 70° C. for 60 sec to form a dry coating film having a thickness $L^2$ of 0.06 μm.

Comparative Example 1

The procedure of Example 1 was repeated, except that no polarizing plate was formed in color filter 1 of Example 1, to thereby fabricate a color filter of Comparative Example 1 and a light-emitting display element of Comparative Example 1.

Comparative Example 2

The procedure of Example 1 was repeated, except that, in color filter 1 of Example 1, the polarizing plate was attached to the entirety of a patterned image instead of to the white pixels, to thereby fabricate a color filter of Comparative Example 2 and a light-emitting display element of Comparative Example 2.

Comparative Example 3

The procedure of Example 1 was repeated, except that no color filter was formed, to thereby fabricate a light-emitting display element of Comparative Example 3.

Example 3

<Fabrication of Organic EL Element>
(1) Through vacuum film formation, a 100 nm-thick aluminum (Al) layer (serving as a light-reflective layer) patterned correspondingly to R, G, B and W subpixels was formed on a glass substrate having TFTs.
(2) Through ion plating, SiON was laminated on the light-reflective layer of the R, G, B, and W subpixels (i.e., 120 nm in R subpixel, 70 nm in G subpixel, 30 nm in B subpixel, and 2,200 nm in W subpixel), to thereby form optical path length-adjusting layers of a transparent insulative material.
(3) Transparent electrodes (ITO, thickness: 60 nm) were formed through patterning in the optical path length-adjusting layers of the subpixels. Each transparent electrode was conductively connected to the electrode of each TFT through a contact hole provided in the optical path length-adjusting layer and the reflective layer.

First, a 40 nm-thick hole-injection layer was formed by co-depositing 4,4',4"-tris(2-naphthylphenylamino)triphenylamine (abbreviated as "2-TNATA") and F4-TCNQ (tetrafluorotetracyanoquinodimethane) so that the amount of F4-TCNQ was 1.0% by mass with respect to 2-TNATA.

Subsequently, 4,4'-bis[N-(1-naphtyl)-N-phenylamino]biphenyl (α-NPD) was laminated on the hole-injection layer to form a 10 nm-thick hole transport layer.

In addition, a 30 nm-thick light-emitting layer was formed on the hole transport layer by co-depositing 1,3-bis(carbazol-9-yl)benzene (abbreviated as "mCP"), light-emitting material A having the following structural formula (15% by mass to mCP), light-emitting material B having the following structural formula (0.13% by mass to mCP) and light-emitting material C having the following structural formula (0.13% by mass to mCP).

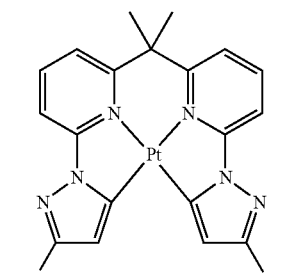

Light-emitting material A

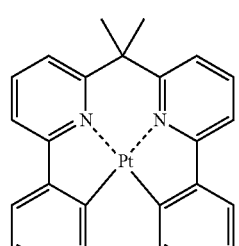

Light-emitting material B

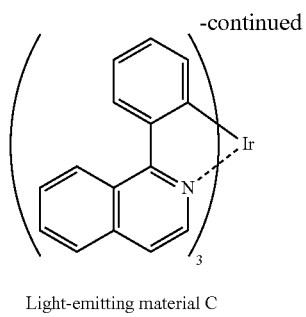

Light-emitting material C

Next, aluminum(III) bis(2-methyl-8-quinolinato)-4-phenyl phenolate (BAlq) was laminated on the light-emitting layer to form a 40 nm-thick electron transport layer.

Furthermore, LiF was deposited on the electron transport layer so as to have a thickness of 0.5 nm, and aluminum (Al) was deposited thereon so as to have a thickness of 1.5 nm, whereby an electron injection layer was formed.

<Semi-Transmissive Reflective Electrode>

A metal electrode of the light-emitting layer (Ag, thickness: 20 nm) was formed through vacuum film formation.

Without being exposed to air, the obtained laminate was placed in a glove box which had been purged with nitrogen gas. Subsequently, the laminate was sealed by a glass sealing cover having concave portions in the inner wall thereof with a UV-ray curable adhesive (XNR5516HV, product of Nagase-Chiba Co.). Through the above procedure, EL element 3 was fabricated.

Furthermore, color filter 1 obtained in Example 1 and organic EL element 3 were joined together with a UV-ray curable adhesive (XNR5516HV, product of Nagase-Chiba Co.) so that the color filter was disposed at the side where light emitted from the organic EL element was emitted to the outside, to thereby fabricate a light-emitting display element of Example 3.

Comparative Example 4

The procedure of Example 3 was repeated, except that no polarizing plate was formed in color filter 1 of Example 1, to thereby fabricate a light-emitting display element of Comparative Example 4.

Comparative Example 5

The procedure of Example 3 was repeated, except that, in color filter 1 of Example 1, the polarizing plate was attached to the entirety of a patterned image instead of to the white pixels, to thereby fabricate a light-emitting display element of Comparative Example 5.

Comparative Example 6

The procedure of Example 3 was repeated, except that no color filter was provided, to thereby fabricate a light-emitting display element of Comparative Example 6.

Example 4

First, a selective reflection layer was formed in color filter 1 fabricated in Example 1, to thereby produce color filter 3.

<Formation of Selective Reflection Layer>

The surface of a polymer base (UPILEX AD, product of UBE INDUSTRIES. LTD.) was rubbed for orientation.

The following compounds were mixed together to prepare a cholesteric liquid crystal layer coating liquid 1 (solid content concentration: 40% by mass). Here, in the following formulation, the amount X of compound B (chiral agent) was adjusted to 6.4 parts by mass. Similarly, cholesteric liquid crystal layer coating liquid 2 (solid content concentration: 40% by mass) was prepared. Here, the amount X of compound B (chiral agent) was adjusted to 5.4 parts by mass. Similarly, cholesteric liquid crystal layer coating liquid 3 (solid content concentration: 40% by mass) was prepared. Here, the amount X of compound B (chiral agent) was adjusted to 4.4 parts by mass.

Formulation of Cholesteric Liquid Crystal Layer Coating Liquid

Compound A having the following structural formula: 100 parts by mass

Compound A

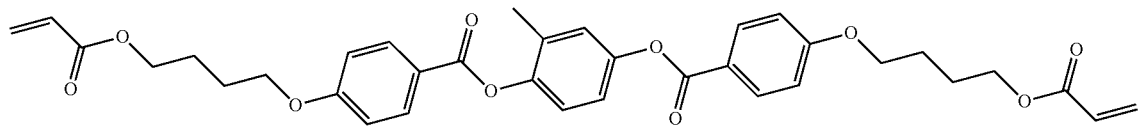

Compound B having the following structural formula: X parts by mass

Compound B

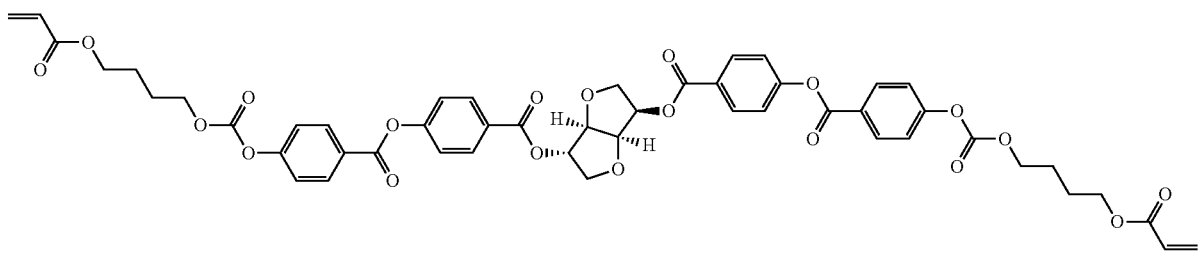

Compound C having the following structural formula: 0.03 parts by mass

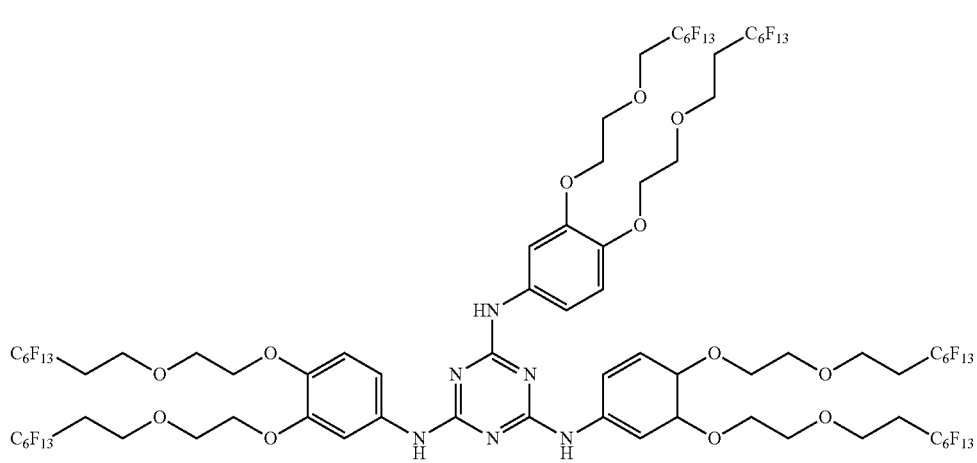

Compound C

Compound D having the following structural formula: 3 parts by mass

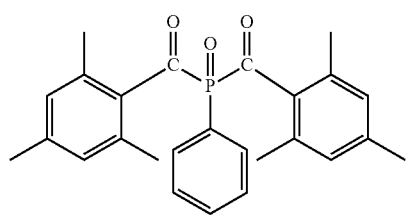

Compound D

Methyl ethyl ketone: appropriate amount

First, cholesteric liquid crystal layer coating liquid 1 was applied onto the polymer base with a bar coater, followed by drying at 90° C. for 2 min in an oven, to thereby form a cholesteric liquid crystal layer. Subsequently, in a nitrogen atmosphere, the cholesteric liquid crystal layer was entirely irradiated for 10 sec at 30° C. using an ultra-high-pressure mercury lamp, to thereby form cholesteric liquid crystal layer 1. The intensity of light irradiated was adjusted to 100 mW/cm$^2$. The thickness of the formed layer was measured under a confocal microscope and found to be 4.1 μm, which exhibited selective reflection with respect to blue light.

Next, cholesteric liquid crystal layer coating liquid 2 was similarly applied onto cholesteric liquid crystal layer 1, to thereby form cholesteric liquid crystal layer 2.

Next, cholesteric liquid crystal layer coating liquid 3 was similarly applied onto cholesteric liquid crystal layer 2, to thereby form cholesteric liquid crystal layer 3. Through the above procedure, a selective reflection layer was formed on the polymer base.

Next, an adhesive layer was formed through screen printing on the white display portion of the λ/4 phase difference film of color filter 1 obtained in Example 1.

The λ/4 phase difference film was laminated on the polymer base so that the adhesive layer faced the selective reflection layer. Then, the polymer base was peeled off and only the selective reflection layer was transferred. Thereafter, extra portions of the selective reflection layer were removed with an air brush, to thereby form a λ/4 phase difference film having a patterned selective reflection layer. Through the above procedure, color filter 3 was formed.

Next, the above-fabricated color filter 3 and the organic EL element 3 obtained in Example 3 were joined together with a UV-ray curable adhesive (XNR5516HV, product of Nagase-Chiba Co.) so that the color filter was disposed at the side where light emitted from the organic EL element was emitted to the outside, to thereby fabricate a light-emitting display element of Example 4.

Comparative Example 7

The procedure of Example 4 was repeated, except that no polarizing layer was formed in color filter 3 obtained in Example 4, to thereby fabricate a light-emitting display element of Comparative Example 7.

Comparative Example 8

The procedure of Example 4 was repeated, except that, in color filter 3 of Example 4, the polarizing plate was attached to the entirety of a patterned image instead of to the white pixels, to thereby fabricate a light-emitting display element of Comparative Example 8.

Comparative Example 9

The procedure of Example 4 was repeated, except that no selective reflection layer was formed in color filter 3 obtained in Example 4, to thereby fabricate a light-emitting display element of Comparative Example 9.

<Evaluation>

—Evaluation of White Luminance (Relative Value)—

Each of the above-obtained light-emitting display elements was measured with a luminance meter (SR-3, product of Top Cora. Co.) for white luminance and black luminance. The luminance meter was placed 1 m apart from the light-emitting display element and at the same height as the center of the light-emitting display element in the vertical direction. Also, the luminance meter was placed at an oblique angle of 5° in the horizontal direction with respect to the center of the light-emitting display element. At a position where the luminance meter was placed, the vertical luminance was adjusted to 1,000 lux with a fluorescent light.

In this state, a luminance measured without applying current to the light-emitting display element was used as the black luminance, and a luminance measured when the light-emitting display element was lit (operated) was used as the white luminance. The thus-obtained white luminance of each light-emitting display element was used to calculate a relative value to the white luminance in Comparative Example 3, 6 or 9 (regarded as 100). Also, the above-obtained black luminance and white luminance were used to calculate the ratio of white luminance to black luminance.

TABLE 1

|  | White luminance (relative value) | White luminance/ Black luminance |
|---|---|---|
| Ex. 1 | 45 | 35 |
| Ex. 2 | 45 | 40 |
| Comp. Ex. 1 | 50 | 15 |
| Comp. Ex. 2 | 25 | 80 |
| Comp. Ex. 3 | 100 | 10 |

TABLE 2

|  | White luminance (relative value) | White luminance/ Black luminance |
|---|---|---|
| Ex. 3 | 50 | 40 |
| Comp. Ex. 4 | 55 | 20 |
| Comp. Ex. 5 | 30 | 80 |
| Comp. Ex. 6 | 100 | 10 |

TABLE 3

|  | White luminance (relative value) | White luminance/ Black luminance |
|---|---|---|
| Ex. 4 | 52 | 42 |
| Comp. Ex. 7 | 52 | 20 |
| Comp. Ex. 8 | 28 | 75 |
| Comp. Ex. 9 | 50 | 40 |

As is clear from Tables 1 to 3, since the circularly polarizing layer or both the circularly polarizing layer and the selective reflection layer were provided in the optical light path of white light from the light-emitting layer, reflection of external light was reduced while the white luminance (i.e., light emission of the light-emitting display element) was being maintained. As a result, a decrease in contrast (white luminance/black luminance) was prevented, and thus, a clear display image could be observed even in the presence of external light.

INDUSTRIAL APPLICABILITY

The color filter of the present invention can be suitably used in a light-emitting display element which emits white light. The light-emitting display element containing the color filter realizes high-definition, full-color display, and thus, can be suitably used in a variety of applications such as cell phone displays, personal digital assistants (PDAs), computer displays, vehicle's information displays, TV monitors and common lights.

REFERENCE SIGNS LIST

1: Color filter
11: Selective reflection layer
12: Polarizing layer
14: ¼ wavelength layer
16: Circularly polarizing layer
18: Filter layer
18w: White filter portion
18r: Red filter portion
18g: Green filter portion
18b: Blue filter portion
22: Support
100: Light-emitting display element
102: Cathode
104: Anode
106: Light-emitting layer
108: Optical path length adjusting layer
110: Insulative layer
112: Reflective layer
114: Substrate
116: Flattening layer
118: TFT

The invention claimed is:

1. A color filter for use in a light-emitting display element which emits at least white light, the color filter comprising:
a filter layer comprising a plurality of filter portion including a white filter portion,
a circularly polarizing layer which comprises a polarizing layer, the polarizing layer having an orientation layer and a liquid crystal compound layer,
wherein the circularly polarizing layer is formed only in an optical path of the white light transmitted by the white filter portion.

2. The color filter according to claim 1, wherein the circularly polarizing layer comprises the polarizing layer and a ¼ wavelength layer.

3. A color filter for use in a light-emitting display element which emits at least white light, the color filter comprising:
a selective reflection layer,
a filter layer comprising a plurality of filter portion including a white filter portion, and
a circularly polarizing layer which comprises a polarizing layer,
the polarizing layer having an orientation layer and a liquid crystal compound layer,
wherein the circularly polarizing layer and the selective reflection layer are formed only in an optical path of the white light transmitted by the white filter portion.

4. The color filter according to claim 3, wherein the selective reflection layer comprises a cholesteric liquid crystal compound.

5. The color filter according to claim 1, wherein the color filter comprises a support, and the support is a transparent support.

6. The color filter according to claim 5, wherein the support is the ¼ wavelength layer.

7. A light-emitting display element comprising:
a color filter, and a light-emitting layer which emits at least white light,
wherein the color filter is a color filter for use in the light-emitting display element which emits the at least white light, the color filter comprising a circularly polarizing layer which comprises a polarizing layer, and a filter layer comprising a plurality of filter portion including a white filter portion,
the polarizing layer having an orientation layer and a liquid crystal compound layer, and
wherein the circularly polarizing layer is formed only in an optical path of the white light transmitted by the white filter portion.

8. The light-emitting display element according to claim 7, wherein the light-emitting display element has an optical resonator structure.

9. The light-emitting display element according to claim 7, wherein the light-emitting layer comprises at least one phosphorescent light-emitting material.

* * * * *